(12) United States Patent
Godo et al.

(10) Patent No.: US 12,205,625 B2
(45) Date of Patent: Jan. 21, 2025

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Hiromichi Godo, Kanagawa (JP); Yoshiyuki Kurokawa, Kanagawa (JP); Kazuki Tsuda, Kanagawa (JP); Satoru Ohshita, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 119 days.

(21) Appl. No.: 18/245,098

(22) PCT Filed: Sep. 7, 2021

(86) PCT No.: PCT/IB2021/058112
§ 371 (c)(1),
(2) Date: Mar. 13, 2023

(87) PCT Pub. No.: WO2022/058838
PCT Pub. Date: Mar. 24, 2022

(65) Prior Publication Data
US 2023/0386544 A1    Nov. 30, 2023

(30) Foreign Application Priority Data

Sep. 18, 2020 (JP) .................. 2020-157570
Sep. 18, 2020 (JP) .................. 2020-157607
Sep. 18, 2020 (JP) .................. 2020-157610

(51) Int. Cl.
*G11C 11/22* (2006.01)
*H01L 21/28* (2006.01)
(Continued)

(52) U.S. Cl.
CPC .......... *G11C 11/223* (2013.01); *G11C 11/221* (2013.01); *G11C 11/2297* (2013.01);
(Continued)

(58) Field of Classification Search
CPC . G11C 11/223; G11C 11/221; G11C 11/2297; H01L 29/78391; H01L 29/40111; H10B 53/30; H10B 51/30
(Continued)

(56) References Cited

U.S. PATENT DOCUMENTS 6,101,117 A     8/2000   Tiwari
9,851,942 B2   12/2017   Kurokawa
(Continued)

FOREIGN PATENT DOCUMENTS

CN   117999863 A  *  5/2024  .......... G11C 11/223
JP   2000-323670 A   11/2000
(Continued)

OTHER PUBLICATIONS

International Search Report (Application No. PCT/IB2021/058112) Dated Dec. 14, 2021.
(Continued)

*Primary Examiner* — Viet G Nguyen
(74) *Attorney, Agent, or Firm* — Fish & Richardson P.C.

(57) ABSTRACT

A semiconductor device with low power consumption is provided. The semiconductor device includes a first transistor, a second transistor, and a capacitor. The first transistor includes a first gate and a first back gate, and the second transistor includes a second gate and a second back gate. A gate insulating layer for the first back gate has ferroelectricity. The first transistor has a function of, when being in an off state, retaining a first potential corresponding to first data.
(Continued)

The second transistor has a function of making an output current flow between a source and a drain of the second transistor.

22 Claims, 31 Drawing Sheets

(51) Int. Cl.
*H01L 29/78* (2006.01)
*H10B 51/30* (2023.01)
*H10B 53/30* (2023.01)

(52) U.S. Cl.
CPC .. *H01L 29/40111* (2019.08); *H01L 29/78391* (2014.09); *H10B 51/30* (2023.02); *H10B 53/30* (2023.02)

(58) Field of Classification Search
USPC .......................................................... 365/145
See application file for complete search history.

(56) References Cited

U.S. PATENT DOCUMENTS

| | | | | |
|---|---|---|---|---|
| 10,090,022 | B2* | 10/2018 | Shionoiri | G11C 5/025 |
| 10,114,611 | B2 | 10/2018 | Kurokawa | |
| 10,236,875 | B2* | 3/2019 | Kato | H01L 29/78648 |
| 10,559,612 | B2* | 2/2020 | Ishizu | G11C 11/405 |
| 10,875,837 | B2* | 12/2020 | Bifulco, Jr. | A61P 35/00 |
| 11,024,346 | B2 | 6/2021 | Kanda | |
| 11,362,647 | B2* | 6/2022 | Okamoto | H03K 19/20 |
| 11,705,184 | B2* | 7/2023 | Yamazaki | H01L 29/78648 365/149 |
| 11,714,138 | B2* | 8/2023 | Takahashi | H01M 10/44 320/137 |
| 12,033,694 | B2* | 7/2024 | Yamazaki | H10B 12/30 |
| 2020/0098401 | A1 | 3/2020 | Kanda | |
| 2023/0018223 | A1* | 1/2023 | Miyata | H03M 1/002 |
| 2023/0049977 | A1* | 2/2023 | Kurokawa | G06F 7/5443 |
| 2023/0283276 | A1* | 9/2023 | Ikeda | H01L 29/7869 327/427 |
| 2023/0352477 | A1* | 11/2023 | Matsuzaki | H01L 29/7869 |
| 2023/0353163 | A1* | 11/2023 | Kanemura | G06N 3/063 |

FOREIGN PATENT DOCUMENTS

| | | | | |
|---|---|---|---|---|
| JP | 2008153479 | A * | 7/2008 | G11C 11/22 |
| JP | 2011-142136 | A | 7/2011 | |
| JP | 2017-168099 | A | 9/2017 | |
| JP | 2018-195366 | A | 12/2018 | |
| KR | 2000-0076919 | A | 12/2000 | |
| WO | WO-2018/212056 | | 11/2018 | |

OTHER PUBLICATIONS

Written Opinion (Application No. PCT/IB2021/058112) Dated Dec. 14, 2021.
Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

* cited by examiner

10A3

10B3

10D1

FIG. 26A
Intermediate state
New crystalline phase
| Amorphous | Crystalline | Crystal |
|---|---|---|
| •completely amorphous | •CAAC<br>•nc<br>•CAC<br>excluding single crystal and poly crystal | •single crystal<br>•poly crystal |
FIG. 26B
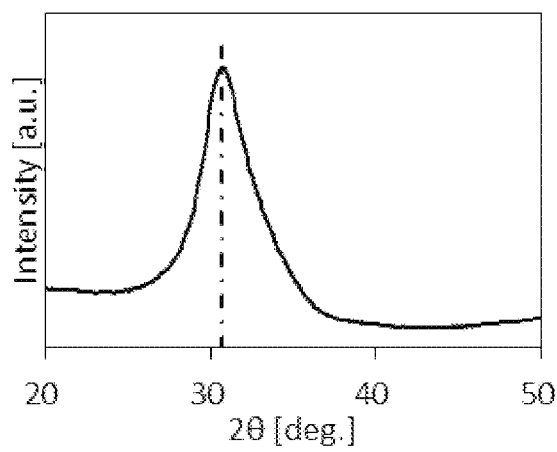
FIG. 26C
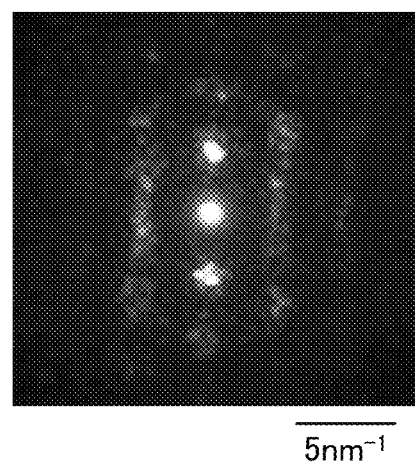

FIG. 28A
FIG. 28B
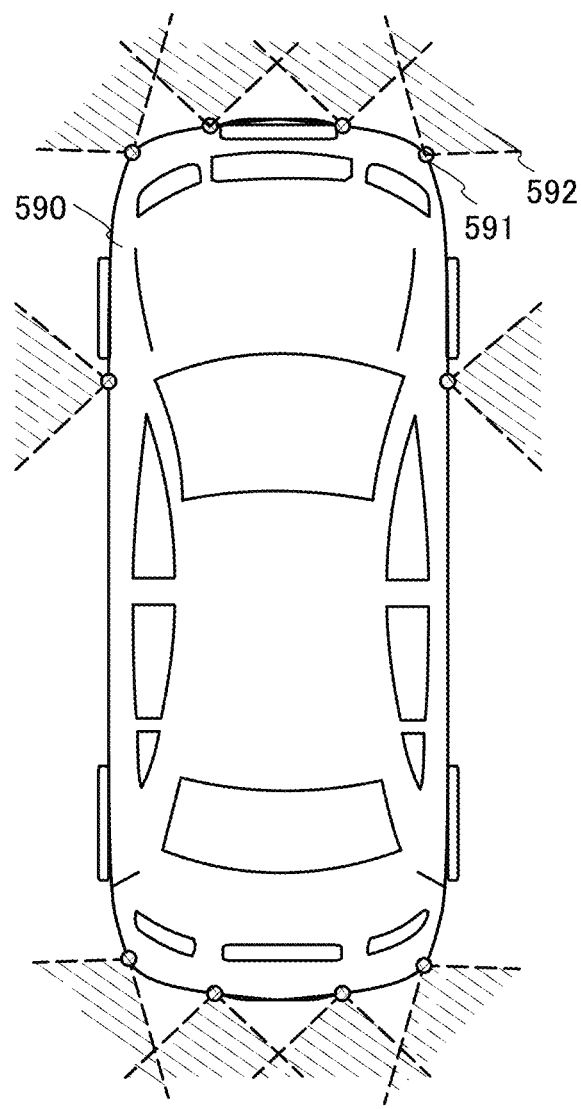
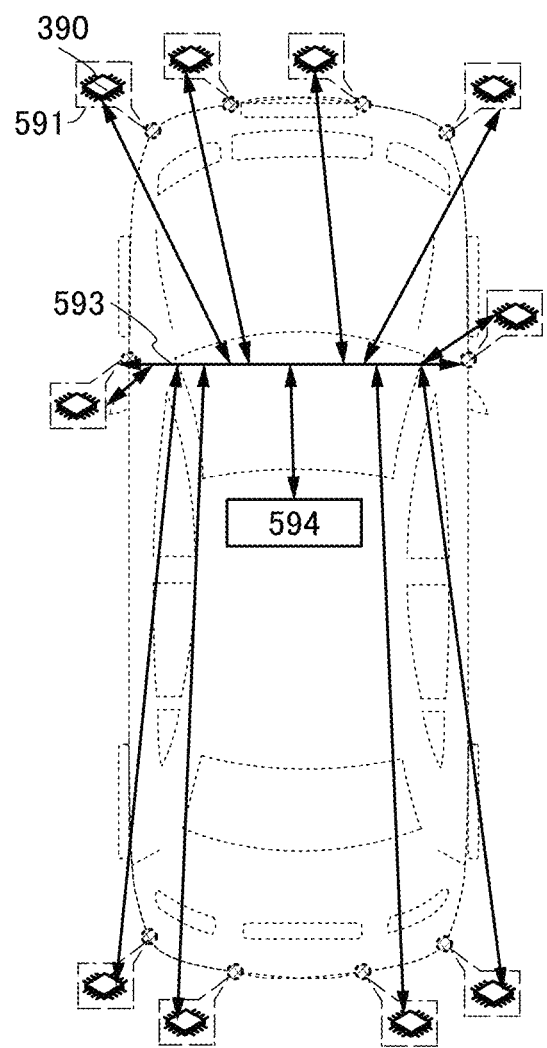

SEMICONDUCTOR DEVICE AND ELECTRONIC DEVICE

CROSS REFERENCE TO RELATED APPLICATIONS

This application is a U.S. National Phase Application under 35 U.S.C. § 371 of International Application PCT/IB2021/058112, filed on Sep. 7, 2021, which is incorporated by reference and claims the benefit of foreign priority applications filed in Japan on Sep. 18, 2020, as Application No. 2020-157570, Application No. 2020-157607, and 2020-157610.

TECHNICAL FIELD

In this specification, a semiconductor device and the like will be described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). By using an artificial neural network, inference with an accuracy as high as or higher than that of a human can be carried out. In an artificial neural network, the main arithmetic operation is the weighted sum operation of outputs from neurons, i.e., the product-sum operation.

Non-Patent Document 1 proposes a product-sum operation circuit including a nonvolatile memory cell. Each memory cell of the product-sum operation circuit outputs a current corresponding to a product of data corresponding to a multiplier stored in each memory cell and input data corresponding to a multiplicand by using operation in a subthreshold region of a transistor containing silicon in its channel formation region. With the sum of currents output from the memory cells in each column, data corresponding to product-sum operation is obtained. The product-sum operation circuit includes memory cells therein, and thus does not need to read and write data from and to an external memory when carrying out multiplication and addition. This can decrease the number of times of data transfer for reading, writing, and the like; thus, the power consumption should be reduced.

REFERENCE

Non-Patent Document

[Non-Patent Document 1] X. Guo et al., "Fast, Energy-Efficient, Robust, and Reproducible Mixed-Signal Neuromorphic Classifier Based on Embedded NOR Flash Memory Technology" IEDM2017, pp. 151-154.

SUMMARY OF THE INVENTION

Problems to be Solved by the Invention

An object of one embodiment of the present invention is to provide a semiconductor device with low power consumption. Another object of one embodiment of the present invention is to provide a semiconductor device capable of retaining data for along time. Another object of one embodiment of the present invention is to provide a highly reliable semiconductor device. Another object of one embodiment of the present invention is to provide a novel semiconductor device and the like.

One embodiment of the present invention does not necessarily achieve all the above objects and only needs to achieve at least one of the objects. The descriptions of the above objects do not preclude the existence of other objects. Objects other than these objects will be apparent from the descriptions of the specification, the claims, the drawings, and the like, and objects other than these objects can be derived from the descriptions of the specification, the claims, the drawings, and the like.

Means for Solving the Problems

One embodiment of the present invention is a semiconductor device including a first transistor, a second transistor, and a capacitor. The first transistor includes a first gate and a first back gate. The second transistor includes a second gate and a second back gate. A gate insulating layer for the first back gate has ferroelectricity. The first transistor has a function of, when being in an off state, retaining a first potential corresponding to first data supplied to the second back gate through the first transistor. The capacitor has a function of changing the first potential retained in the second back gate to a second potential in accordance with a potential change caused by supply of second data to one electrode of the capacitor. The second transistor has a function of making an output current corresponding to a potential of the second back gate flow between a source and a drain of the second transistor. The output current is a current flowing when the second transistor operates in a subthreshold region. A constant potential is supplied to the second gate.

Another embodiment of the present invention is a semiconductor device including a first transistor, a second transistor, and a capacitor. The first transistor includes a first gate and a first back gate. The second transistor includes a second gate and a second back gate. A gate insulating layer for the first back gate has ferroelectricity. One electrode of the capacitor is electrically connected to the second gate. A constant potential is supplied to the other electrode of the capacitor. The first transistor has a function of, when being in an off state, retaining a first potential corresponding to first data supplied to the second gate through the first transistor. The second transistor has a function of making an output current corresponding to a potential of the second gate flow between a source and a drain of the second transistor. The output current is a current flowing when the second transistor operates in a subthreshold region.

Another embodiment of the present invention is a semiconductor device including a first transistor, a second transistor, and a capacitor. The first transistor includes a first gate and a first back gate. The second transistor includes a second gate and a second back gate. A gate insulating layer for the first back gate has ferroelectricity. One electrode of the capacitor is electrically connected to the second back gate. A constant potential is supplied to the other electrode of the capacitor. The first transistor has a function of, when being in an off state, retaining a first potential corresponding to first data supplied to the second back gate through the first transistor. The second transistor has a function of making an output current corresponding to a potential of the second back gate flow between a source and a drain of the second transistor. The output current is a current flowing when the second transistor operates in a subthreshold region.

In the above embodiment, the semiconductor device may include a circuit, the circuit may be electrically connected to the first gate, and the circuit may have a function of generating a signal controlling on and off of the first transistor.

In the above embodiment, the gate insulating layer for the first back gate may include an oxide containing one or both of hafnium and zirconium.

Another embodiment of the present invention is a semiconductor device including a first transistor, a second transistor, a third transistor, a fourth transistor, a first capacitor, a second capacitor, and a ferroelectric capacitor. The first to third transistors each include a gate and a back gate. One of a source and a drain of the first transistor is electrically connected to one of a source and a drain of the second transistor and one electrode of the first capacitor. The other of the source and the drain of the first transistor is electrically connected to the back gate of the second transistor and the other electrode of the first capacitor. The back gate of the first transistor is electrically connected to one of a source and a drain of the third transistor, the back gate of the third transistor, and one of a source and a drain of the fourth transistor. The gate of the third transistor is electrically connected to one electrode of the ferroelectric capacitor. The other of the source and the drain of the fourth transistor is electrically connected to the other electrode of the ferroelectric capacitor and one electrode of the second capacitor.

In the above embodiment, a constant potential may be supplied to the gate of the second transistor.

Another embodiment of the present invention is a semiconductor device including a first transistor, a second transistor, a third transistor, a fourth transistor, a first capacitor, a second capacitor, and a ferroelectric capacitor. The first to third transistors each include a gate and a back gate. One of a source and a drain of the first transistor is electrically connected to one of a source and a drain of the second transistor. The other of the source and the drain of the first transistor is electrically connected to the gate of the second transistor and one electrode of the first capacitor. The back gate of the first transistor is electrically connected to one of a source and a drain of the third transistor, the back gate of the third transistor, and one of a source and a drain of the fourth transistor. The gate of the third transistor is electrically connected to one electrode of the ferroelectric capacitor. The other of the source and the drain of the fourth transistor is electrically connected to the other electrode of the ferroelectric capacitor and one electrode of the second capacitor.

Another embodiment of the present invention is a semiconductor device including a first transistor, a second transistor, a third transistor, a fourth transistor, a first capacitor, a second capacitor, and a ferroelectric capacitor. The first to third transistors each include a gate and a back gate. One of a source and a drain of the first transistor is electrically connected to one of a source and a drain of the second transistor. The other of the source and the drain of the first transistor is electrically connected to the back gate of the second transistor and one electrode of the first capacitor. The back gate of the first transistor is electrically connected to one of a source and a drain of the third transistor, the back gate of the third transistor, and one of a source and a drain of the fourth transistor. The gate of the third transistor is electrically connected to one electrode of the ferroelectric capacitor. The other of the source and the drain of the fourth transistor is electrically connected to the other electrode of the ferroelectric capacitor and one electrode of the second capacitor.

In the above embodiment, a constant potential may be supplied to the other electrode of the first capacitor.

In the above embodiment, the semiconductor device may include a circuit, the circuit may be electrically connected to the gate of the first transistor, and the circuit may have a function of generating a signal controlling on and off of the first transistor.

In the above embodiment, the ferroelectric capacitor may include a dielectric layer, and the dielectric layer may include an oxide containing one or both of hafnium and zirconium.

In the above embodiment, the first transistor may include a semiconductor layer including a metal oxide in a channel formation region.

In the above embodiment, the metal oxide may contain In, Ga, and Zn.

In the above embodiment, the second transistor may include a semiconductor layer containing silicon in a channel formation region.

An electronic device including the semiconductor device of one embodiment of the present invention and a housing, in which arithmetic operation of a neural network is performed by the semiconductor device, is also one embodiment of the present invention.

Note that other embodiments of the present invention will be shown in the description of the following embodiments and the drawings.

Effect of the Invention

According to one embodiment of the present invention, a semiconductor device with low power consumption can be provided. According to another embodiment of the present invention, a semiconductor device capable of retaining data for a long time can be provided. According to another embodiment of the present invention, a highly reliable semiconductor device can be provided. According to one embodiment of the present invention, a novel semiconductor device and the like can be provided.

The description of a plurality of effects does not preclude the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 26A is a diagram showing a classification of crystal structures of IGZO. FIG. 26B is a diagram showing an XRD spectrum of crystalline IGZO. FIG. 26C is a diagram showing a nanobeam electron diffraction pattern of crystalline IGZO.

FIG. 28A and FIG. 28B are diagrams illustrating an application example of an integrated circuit.

MODE FOR CARRYING OUT THE INVENTION

Figure 1A:
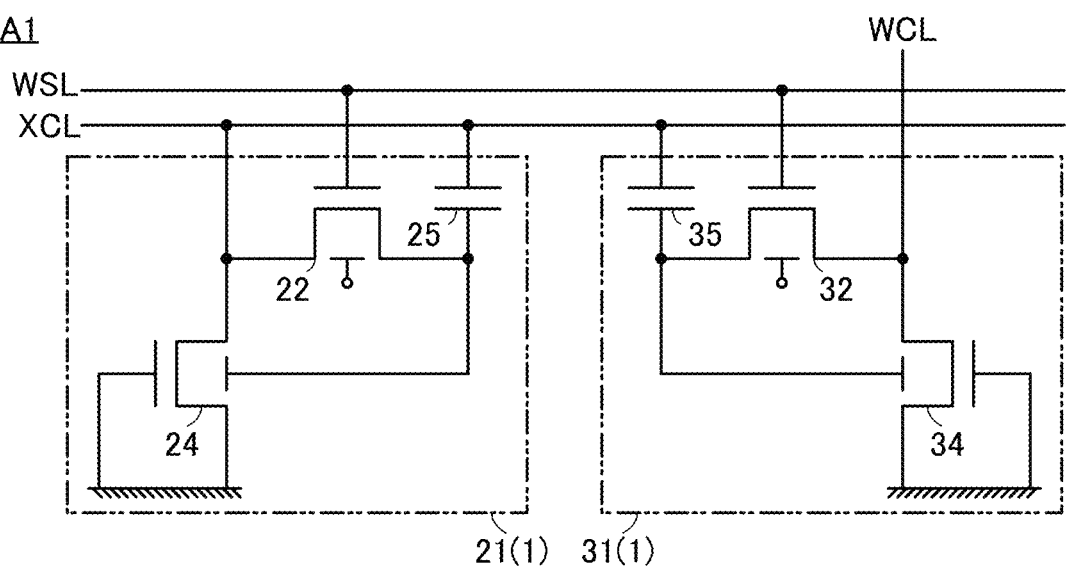
FIG. 1A and FIG. 1B are diagrams illustrating structure examples of semiconductor devices.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. Furthermore, the terms do not limit the order of components. In this specification and the like, for example, a "first" component in one embodiment can be referred to as a "second" component in other embodiments or claims. For another example, a "first" component in one embodiment in this specification and the like can be omitted in other embodiments or claims.

The same components, components having similar functions, components made of the same material, components formed at the same time, and the like in the drawings are denoted by the same reference numerals, and repeated description thereof is omitted in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "_n", or "_m,n" is sometimes added to the reference numerals.

Embodiment 1

The structure, operation, and the like of a semiconductor device of one embodiment of the present invention will be described.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

FIG. 1A is a diagram illustrating a semiconductor device 10A1 of one embodiment of the present invention.

The semiconductor device 10A1 includes a reference cell 21(1) and an arithmetic cell 31(1). The reference cell 21(1) includes a transistor 22, a transistor 24, and a capacitor 25. The arithmetic cell 31(1) includes a transistor 32, a transistor 34, and a capacitor 35. The transistor 22, the transistor 24, the transistor 32, and the transistor 34 each include a gate and a back gate.

In this specification and the like, in the case where a transistor having a function of a switch includes a gate and a back gate, on/off of the transistor can be controlled by controlling a potential of the gate. In addition, the threshold voltage of the transistor can be controlled by controlling a potential of the back gate.

The transistors and the capacitors included in the reference cell 21(1) and the arithmetic cell 31(1) are connected to at least one of a wiring WSL, a wiring XCL, a wiring WCL, and a wiring supplying a ground potential, as illustrated in FIG. 1.

The reference cell 21(1) has a function of making a set current flow therein at the time of data writing and the time of data reading to make the arithmetic cell 31(1) execute arithmetic operation. Specifically, the reference cell 21(1) has a function of making a reference current flow therein at the time of data writing to retain a reference potential, and making a current corresponding to input data (X) to be supplied to the arithmetic cell 31(1) flow to the reference cell 21(1) at the time of data reading to control a current flowing in the arithmetic cell 31(1). Note that the reference cell 21(1) is simply referred to as a cell in some cases.

Next, connection relations in the reference cell 21(1) will be described.

A gate of the transistor 22 is electrically connected to the wiring WSL. One of a source and a drain of the transistor 22 is electrically connected to one of a source and a drain of the transistor 24, and is electrically connected to one electrode of the capacitor 25 through the wiring XCL. The other of the source and the drain of the transistor 22 is electrically connected to the back gate of the transistor 24 and the other electrode of the capacitor 25. The transistor 22 is brought into an on state at the time of data writing so that a reference potential can be written to a retention node (the back gate of the transistor 24) in the reference cell 21(1), and is brought into an off state so that the reference potential can be retained in the reference cell 21(1). Note that a node to which the back gate of the transistor 24, the other of the source and the drain of the transistor 22, and the other electrode of the capacitor 25 are connected is also referred to as a retention node. The retention node can be set at a potential corresponding to a current flowing in the transistor 24.

Here, the threshold voltage of the transistor 22 can be controlled by controlling the back gate potential of the transistor 22. Specifically, when the back gate potential of the transistor 22 is increased, the threshold voltage of the transistor 22 can be decreased. Meanwhile, when the back gate potential of the transistor 22 is decreased, the threshold voltage of the transistor 22 can be increased. Thus, the on-state current of the transistor 22 can be increased when the back gate potential of the transistor 22 is increased while the transistor 22 is in an on state, and the off-state current of the transistor 22 can be decreased when the back gate potential of the transistor 22 is decreased while the transistor 22 is in an off state.

A gate of the transistor 24 and the other of the source and the drain of the transistor 24 are connected to a wiring supplying a constant current such as a low power supply potential (e.g., a ground potential). The wiring supplying a ground potential functions as a wiring for supplying a current between the source and the drain of the transistor 24.

The capacitor 25 changes the potential of the other electrode in accordance with a change in potential supplied to the one electrode when the other electrode is in an electrically floating state.

The arithmetic cell 31(1) has a function of making a current corresponding to weight data (W) to be retained in the arithmetic cell 31(1) flow therein at the time of data writing to retain a voltage corresponding to the current inside. The arithmetic cell 31(1) also has a function of supplying a current corresponding to arithmetic operation of the weight data and the input data at the time of data reading as a result of boosting of the voltage retained at the time of data writing in accordance with a current flowing in the reference cell 21(1). The weight data is referred to as first data, and the input data is referred to as second data, in some cases. Note that the arithmetic cell 31(1) is simply referred to as a cell in some cases. Note that the weight data is data (weight data) corresponding to a weight parameter used for product-sum operation of an artificial neural network, for example.

Next, connection relations in the arithmetic cell 31(1) will be described.

A gate of the transistor 32 is electrically connected to the wiring WSL. One of a source and a drain of the transistor 32 is electrically connected to one of a source and a drain of the transistor 34 and the wiring WCL. One electrode of the capacitor 35 is electrically connected to the wiring XCL. The other of the source and the drain of the transistor 32 is electrically connected to the back gate of the transistor 34 and the other electrode of the capacitor 35. The transistor 32 is brought into an on state at the time of data writing so that a voltage corresponding to the weight data can be written to the arithmetic cell 31(1), and is brought into an off state so that the voltage corresponding to the weight data can be retained in the arithmetic cell 31(1). Note that a node to which the back gate of the transistor 34, the other of the source and the drain of the transistor 32, and the other electrode of the capacitor 35 are connected is also referred to as a retention node.

Here, the threshold voltage of the transistor 32 can be controlled by controlling the back gate potential of the transistor 32. Specifically, when the back gate potential of the transistor 32 is increased, the threshold voltage of the transistor 32 can be decreased. Meanwhile, when the back gate potential of the transistor 32 is decreased, the threshold voltage of the transistor 32 can be increased. Thus, the on-state current of the transistor 32 can be increased when the back gate potential of the transistor 32 is increased while the transistor 32 is in an on state, and the off-state current of the transistor 32 can be decreased when the back gate potential of the transistor 32 is decreased while the transistor 32 is in an off state.

A gate of the transistor 34 and the other of the source and the drain of the transistor 34 are connected to a wiring supplying a constant potential such as a low power supply potential (e.g., aground potential). The wiring supplying a ground potential functions as a wiring for supplying a current between the source and the drain of the transistor 34.

The capacitor 35 changes the potential of the other electrode in accordance with a change in potential supplied to the one electrode when the other electrode is in an electrically floating state.

Next, the transistors included in the reference cell 21(1) and the arithmetic cell 31(1) will be described.

The transistor 24 and the transistor 34 operate in a subthreshold region, unless otherwise specified. A drain current Id of a transistor that operates in a subthreshold region can be represented by Equation (1).

[Formula 1]

$$I_d = I_0 \exp\left(\frac{q(V_g - V_{th})}{\eta k_B T}\right) \quad (1)$$

In Equation (1), $I_0$ represents a drain current when $V_g = V_{th}$, q represents elementary charge, $V_g$ represents a gate voltage, $V_{th}$ represents a threshold voltage, η represents a coefficient determined by a device structure or the like, $k_B$ represents the Boltzmann constant, and T represents temperature. As shown in Equation (1), the drain current Id of the transistor that operates in a subthreshold region does not depend on the drain voltage. Currents flowing in the transistor 24 and the transistor 34 are the amounts of currents flowing when the transistors operate in a subthreshold region. The currents in the transistor 24 and the transistor 34 in a subthreshold region can reduce the influence of variation in drain voltage. Accordingly, the accuracy of data obtained by arithmetic operation can be increased.

Note that in this specification and the like, a subthreshold region refers to a region where a gate voltage is lower than threshold voltage in a graph showing gate voltage (Vg)-drain current (Id) characteristics of a transistor. Alternatively, the subthreshold region refers to a region where a current flows due to carrier diffusion, which is out of gradual channel approximation (a model in which only a drift current is considered). Alternatively, the subthreshold region refers to a region where a drain current is increased exponentially with respect to an increase in gate voltage. Alternatively, the subthreshold region includes a region that can be regarded as any region of the above description.

A drain current when the transistor operates in the subthreshold region is referred to as a subthreshold current. The subthreshold current is increased exponentially with respect to the gate voltage, without depending on the drain voltage. The circuit operation using the subthreshold current can reduce the influence of variation in drain voltage.

The transistor 22 and the transistor 32 have functions of retaining the potentials of the back gate of the transistor 24 and the back gate of the transistor 34 by being brought into an off state. Specifically, with the function, a reference potential supplied to the back gate of the transistor 24 through the transistor 22 is retained. In addition, with the function, a potential corresponding to data supplied to the back gate of the transistor 34 through the transistor 32 is retained. The transistor 22 and the transistor 32 are each preferably a transistor including a metal oxide in a channel formation region (also referred to as OS transistor), for example. It is further preferable that the channel formation regions of the transistor 22 and the transistor 32 be each an oxide containing at least one of indium, gallium, and zinc, for example. Instead of the oxide, an oxide containing at least one of indium, an element M (as the element M, for example, one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc may be used.

A current flowing between a source and a drain in an off state, that is, a leakage current, is extremely low in an OS transistor. Thus, with the use of an OS transistor as the transistor 22 and/or the transistor 32, the leakage current of the transistor 22 and/or the transistor 32 can be suppressed, so that the power consumption of the semiconductor device 10A1 can be reduced. Specifically, a change in the potential retained in each of the back gate of the transistor 24 and the back gate of the transistor 34 can be extremely small, so that the frequency of refresh operations for the potential can be reduced. The reduction in the frequency of refresh operations can reduce the power consumption of the semiconductor device 10A1. An extremely low leakage current from the retention node to the wiring WCL or the wiring XCL allows the cell to retain the potential of the retention node for a long time.

Furthermore, an extremely low current, such as a current lower than $1\times10^{-20}$ A, lower than $1\times10^{-22}$ A, or lower than $1\times10^{-24}$ A, can flow in an OS transistor as a drain current per micrometer of channel width when the gate voltage is lower than the threshold voltage of the transistor. In addition, a drain current per micrometer of channel width of lower than or equal to $1.0\times10^{-8}$ A, lower than or equal to $1.0\times10^{-12}$ A, or lower than or equal to $1.0\times10^{-15}$ A can flow in an OS transistor when the gate voltage is equal to the threshold voltage of the transistor. Thus, subthreshold currents with different magnitudes can flow in an OS transistor in a range of the gate voltage in which the transistor operates in a subthreshold region. That is, an OS transistor can have a wide range of the gate voltage where the transistor operates in a subthreshold region. Specifically, when the threshold voltage of an OS transistor is $V_{th}$, a circuit operation using the gate voltage in the voltage range of $(V_{th}-1.0\text{ V})$ to $V_{th}$ inclusive, or $(V_{th}-0.5\text{ V})$ to $V_{th}$ inclusive is possible in the subthreshold region.

A metal oxide functioning as an oxide semiconductor has a band gap of 2.5 eV or wider; thus, an OS transistor has an extremely low off-state current. For example, the off-state current per micrometer in channel width at a source-drain voltage of 3.5 V and room temperature (25° C.) can be lower than $1\times10^{-20}$ A, lower than $1\times10^{-22}$ A, or lower than $1\times10^{-24}$ A. Therefore, in an OS memory, the amount of electric charge that leaks from a retention node through the OS transistor is extremely small.

A metal oxide used for an OS transistor is a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer is a metal oxide having a crystal portion, such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

An OS transistor is an accumulation transistor in which electrons are majority carriers. Therefore, drain-induced barrier lowering (DIBL), which is one of short-channel effects, affects an OS transistor less than an inversion transistor having a pn junction. In other words, an OS transistor has higher resistance against short channel effects than a Si transistor.

The use of OS transistors also as the transistor 24 and the transistor 34 enables an operation with a range of current in the subthreshold regions, leading to a reduction in the current consumption. With the use of OS transistors also as the transistor 24 and the transistor 34, the transistors can be manufactured concurrently with the transistor 22 and the transistor 32; thus, the manufacturing process of the arithmetic circuit can sometimes be shortened.

Note that the transistor 22, the transistor 24, the transistor 32, and the transistor 34 are not necessarily OS transistors. For example, the transistor 22, the transistor 24, the transistor 32, and the transistor 34 can be Si transistors. As the silicon, amorphous silicon (sometimes referred to as hydrogenated amorphous silicon), microcrystalline silicon, polycrystalline silicon, single crystal silicon, or the like can be used, for example.

The transistor 22, the transistor 24, the transistor 32, and the transistor 34 illustrated in FIG. 1 are n-channel transistors; however, the semiconductor device of one embodiment of the present invention is not limited thereto. For example, some or all of the transistor 22, the transistor 24, the transistor 32, and the transistor 34 may be replaced with p-channel transistors. In the case where some or all of the transistor 22, the transistor 24, the transistor 32, and the transistor 34 are replaced with p-channel transistors, a voltage supplied by wirings, for example, may be changed as necessary such that the transistor 22, the transistor 24, the transistor 32, and the transistor 34 each perform a desired operation.

Note that the above variation examples of the structure, polarity, or the like of a transistor are applied to not only the transistor 22, the transistor 24, the transistor 32, and the transistor 34. For example, the structure, the polarity, or the like of a transistor described in other parts of the specification or a transistor illustrated in other drawings may also be changed.

Next, the wiring WSL, the wiring XCL, and the wiring WCL connected to the reference cell 21(1) and the arithmetic cell 31(1) will be described.

A signal for controlling on/off of the transistor 22 and the transistor 32 functioning as switches is supplied to the wiring WSL. The wiring WSL functions as a write word line for writing data to the reference cell 21(1) and the arithmetic cell 31(1). Here, when a current corresponding to desired data is supplied to the wiring XCL or the wiring WCL, data is written to the reference cell 21(1) or the arithmetic cell 31(1). When a potential corresponding to desired data is supplied to the wiring XCL or the wiring WCL, data is written to the reference cell 21(1) or the arithmetic cell 31(1). Data is written to the reference cell 21(1) when the transistor 22 is turned on, and written to the arithmetic cell 31(1) when the transistor 32 is turned on. The transistor 22 and the transistor 32 can be turned on by setting the wiring WSL at an H level (a high-level potential). Data is retained in the reference cell 21(1) when the transistor 22 is turned off, and data is retained in the arithmetic cell 31(1) when the transistor 32 is turned off. The transistor 22 and the transistor 32 can be turned off by setting the wiring WSL at an L level (a low-level potential).

The wiring WCL has a function of supplying a current (a weight current or a current $I_{W_{ut}}$) in an amount corresponding to the weight data (also referred to as first data or first input data) to the arithmetic cell 31(1), or a function of supplying a constant potential for supplying a current in accordance with the potential retained in the arithmetic cell 31(1).

The wiring XCL has a function of supplying a current (a reference current or a current $I_{X_{ut}}$) in an amount corresponding to reference data or a current (an input current or a current $I_X$) in an amount corresponding to the input data (also referred to as second data or second input data) to the reference cell 21(1) and the arithmetic cell 31(1).

Figure 1B:
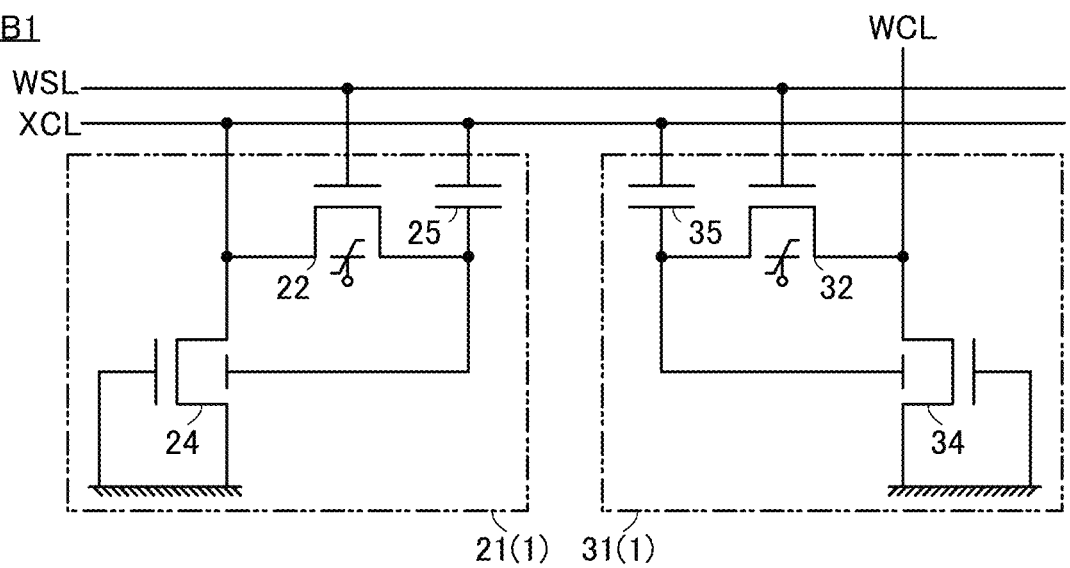

FIG. 1B is a diagram illustrating a semiconductor device 10B1 of one embodiment of the present invention. In the semiconductor device 10B1, a gate insulating layer for the back gate of the transistor 22 and a gate insulating layer for the back gate of the transistor 32 included in the semiconductor device 10A1 each contain a material that can have ferroelectricity.

In circuit diagrams in this specification and the like, a back gate to which a diagonal line is added indicates that a gate insulating layer for the back gate of the transistor contain a material that can have ferroelectricity.

In this specification and the like, ferroelectricity means a property that a polarization state is maintained even when voltage application is stopped after polarization is caused by the voltage application. Paraelectricity means a property that a polarization state is not maintained and disappears when voltage application is stopped after polarization is caused by the voltage application.

Examples of the material that can have ferroelectricity include hafnium oxide, zirconium oxide, $HfZrO_X$ (X is a real number greater than 0), a material obtained by adding an element J1 (the element J1 here is zirconium (Zr), silicon (Si), aluminum (Al), gadolinium (Gd), yttrium (Y), lanthanum (La), strontium (Sr), or the like) to hafnium oxide, and a material obtained by adding an element J2 (the element J2 here is hafnium (Hf), silicon (Si), aluminum (Al), gadolinium (Gd), yttrium (Y), lanthanum (La), strontium (Sr), or the like) to zirconium oxide. As the material that can have ferroelectricity, piezoelectric ceramic having a perovskite structure, such as $PbTiO_X$, barium strontium titanate (BST), strontium titanate, lead zirconate titanate (PZT), strontium bismuth tantalate (SBT), bismuth ferrite (BFO), or barium titanate may be used. The material that can have ferroelectricity can be, for example, a plurality of materials selected from the above-listed materials or a stacked-layer structure of a plurality of materials selected from the above-listed materials. Note that each of hafnium oxide, zirconium oxide, $HfZrO_X$, the material obtained by adding the element J1 to hafnium oxide, and the like possibly changes its crystal structure (characteristics) depending not only on the deposition condition but also on a variety of processes or the like, and thus is referred to as a material that can have ferroelectricity in this specification and the like.

As the material that can have ferroelectricity, hafnium oxide or a material containing hafnium oxide and zirconium oxide is particularly preferable because it can have ferroelectricity even when being processed into a thin film of several nanometers.

The thickness of the material that can have ferroelectricity can be less than or equal to 100 nm, preferably less than or equal to 50 nm, further preferably less than or equal to 20 nm, still further preferably less than or equal to 10 nm (typically, greater than or equal to 2 nm and less than or equal to 9 nm). In the case where $HfZrO_X$ is used as the material that can have ferroelectricity, deposition is preferably performed by an atomic layer deposition (ALD) method, particularly a thermal ALD method.

In the case where the material that can have ferroelectricity is deposited by a thermal ALD method, a material not containing hydrocarbon (also referred to as Hydro Carbon or HC) is suitably used as a precursor. In the case where the material that can have ferroelectricity contains one or both of hydrogen and carbon, crystallization of the material that can have ferroelectricity is hindered in some cases. Thus, the concentration of one or both of hydrogen and carbon in the material that can have ferroelectricity is preferably reduced by using a precursor not containing hydrocarbon, as described above. Examples of the precursor not containing hydrocarbon include chlorine-based materials. In the case where a material containing hafnium oxide and zirconium oxide (HfZrOx) is used as the material that can have ferroelectricity, $HfCl_4$ and/or $ZrCl_4$ can be used as a precursor.

In the case where the material that can have ferroelectricity is deposited by a thermal ALD method, $H_2O$ or $O_3$ can be used as an oxidizer. Note that an oxidizer for a thermal ALD method is not limited to this. For example, an oxidizer for a thermal ALD method may contain one or more selected from $O_2$, $O_3$, $N_2O$, $NO_2$, $H_2O$, and $H_2O_2$.

In addition, there is no particular limitation on the crystal structure of the material that can have ferroelectricity. For example, the material that can have ferroelectricity has one or more crystal structures selected from cubic, tetragonal, orthorhombic, and monoclinic crystal structures. It is particularly preferable that the material that can have ferroelectricity have an orthorhombic crystal structure, in which case ferroelectricity appears. Alternatively, the material that can have ferroelectricity may have a composite structure including an amorphous structure and a crystal structure.

As the material that can have ferroelectricity, it is possible to use silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable.

In the semiconductor device 10B1, the polarization state of a gate insulating layer for the back gate can be controlled by controlling the back gate potential of the transistor 22. Thus, the threshold voltage of the transistor 22 can be controlled. Similarly, the polarization state of a gate insulating layer for the back gate can be controlled by controlling the back gate potential of the transistor 32, and thus the threshold voltage of the transistor 32 can be controlled.

In the semiconductor device 10B1, even when polarization is caused in the gate insulating layer for the back gate of the transistor 22 or the transistor 32 and then potential supply to the back gate is stopped, the gate insulating layer can maintain the polarization state. Thus, it does not need to continue supplying a potential to the back gates of the transistor 22 and the transistor 32. Therefore, the semiconductor device 10B1 can be a semiconductor device with low power consumption.

Figure 2A:
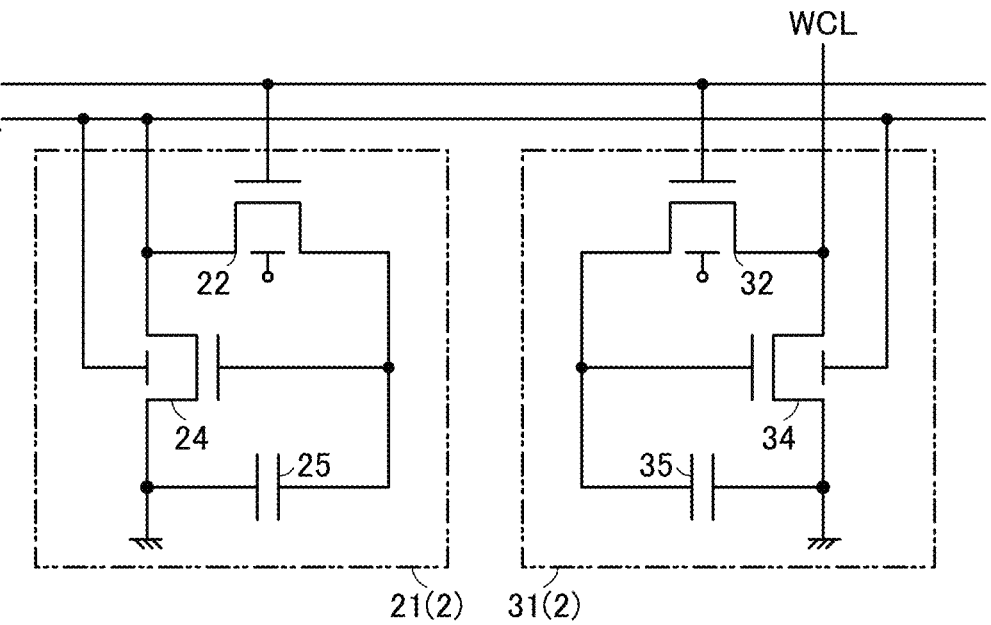
FIG. 2A and FIG. 2B are diagrams illustrating structure examples of semiconductor devices.

FIG. 2A is a diagram illustrating a semiconductor device 10A2 of one embodiment of the present invention. Note that in the following description of the semiconductor device 10A2, components and the like similar to those of the semiconductor device 10A1 are not described in some cases.

The semiconductor device 10A2 includes a reference cell 21(2) and an arithmetic cell 31(2). The reference cell 21(2) includes the transistor 22, the transistor 24, and the capacitor 25, like the reference cell 21(1). The arithmetic cell 31(2) includes the transistor 32, the transistor 34, and the capacitor 35, like the arithmetic cell 31(1).

The gate of the transistor 22 is electrically connected to the wiring WSL. One of the source and the drain of the transistor 22 is electrically connected to one of the source and the drain of the transistor 24 and the wiring XCL. The other of the source and the drain of the transistor 22 is electrically connected to the gate of the transistor 24 and one electrode of the capacitor 25. The transistor 22 is brought into an on state at the time of data writing so that a reference voltage can be written to a retention node (the gate of the transistor 24) in the reference cell 21(2), and is brought into an off state so that the reference voltage can be retained in the reference cell 21(2). Note that a node to which the gate of the transistor 24, the other of the source and the drain of the transistor 22, and the one electrode of the capacitor 25 are connected is also referred to as a retention node. The retention node can be set at a potential corresponding to a current flowing in the transistor 24.

The other of the source and the drain of the transistor 24 and the other electrode of the capacitor 25 are connected to a wiring supplying a constant potential such as a low power supply potential (e.g., aground potential). The wiring supplying aground potential functions as a wiring for supplying a current between the source and the drain of the transistor 24. In addition, the back gate of the transistor 24 is electrically connected to the wiring XCL.

Next, connection relations in the arithmetic cell 31(2) will be described.

The gate of the transistor 32 is electrically connected to the wiring WSL. One of the source and the drain of the transistor 32 is electrically connected to one of the source and the drain of the transistor 34 and the wiring WCL. The other of the source and the drain of the transistor 32 is electrically connected to the gate of the transistor 34 and one electrode of the capacitor 35. The transistor 32 is brought into an on state at the time of data writing so that a voltage corresponding to the weight data can be written to the arithmetic cell 31(2), and is brought into an off state so that the voltage corresponding to the weight data can be retained in the arithmetic cell 31(2). Note that a node to which the gate of the transistor 34, the other of the source and the drain of the transistor 32, and the one electrode of the capacitor 35 are connected is also referred to as a retention node.

The other of the source and the drain of the transistor 34 is connected to a wiring supplying a constant potential such as a low power supply potential (e.g., a ground potential). The wiring supplying a ground potential functions as a wiring for supplying a current between the source and the drain of the transistor 34. In addition, the back gate of the transistor 34 is electrically connected to the wiring XCL.

Next, the transistors included in the reference cell 21(2) and the arithmetic cell 31(2) will be described.

The transistor 22 and the transistor 32 have functions of retaining the potentials of the gate of the transistor 24 and the gate of the transistor 34 by being brought into an off state. Specifically, with the function, a reference potential supplied to the gate of the transistor 24 through the transistor 22 can be retained. In addition, with the function, a potential corresponding to data supplied to the gate of the transistor 34 through the transistor 32 can be retained.

A current flowing between a source and a drain in an off state, that is, a leakage current, is extremely low in an OS transistor. Thus, with the use of an OS transistor as the transistor 22 and/or the transistor 32, the leakage current of the transistor 22 and/or the transistor 32 can be suppressed, so that the power consumption of the semiconductor device 10A2 can be reduced. Specifically, a change in the potential retained in each of the gate of the transistor 24 and the gate of the transistor 34 can be extremely small, so that the frequency of refresh operations for the potential can be reduced. The reduction in the frequency of refresh operations can reduce the power consumption of the semiconductor device 10A2. An extremely low leakage current from the retention node to the wiring WCL or the wiring XCL allows the cell to retain the potential of the retention node for a long time.

Figure 2B:
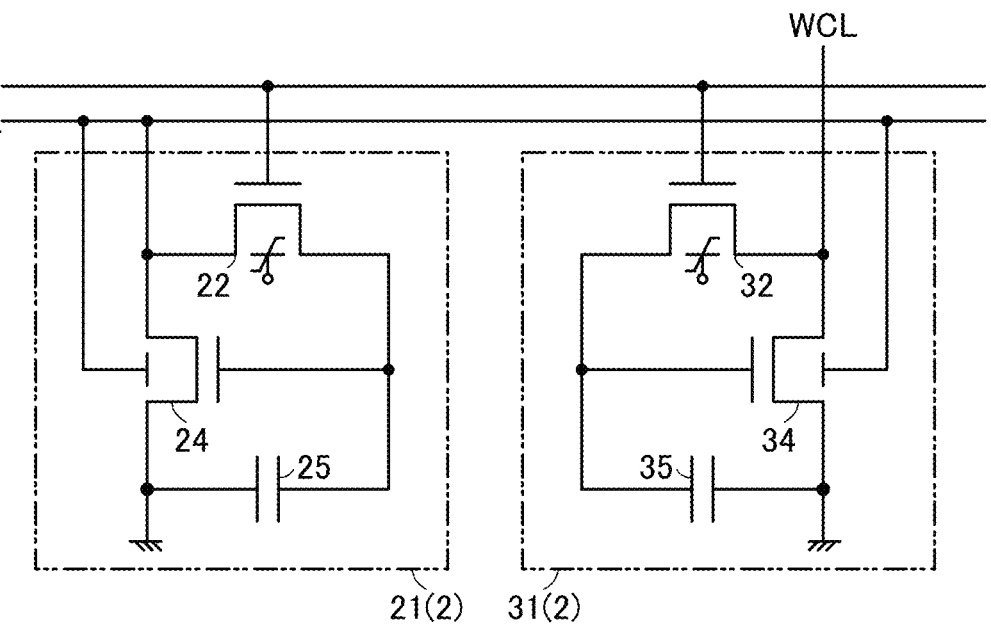

FIG. 2B is a diagram illustrating a semiconductor device 10B2 of one embodiment of the present invention. In the semiconductor device 10B2, agate insulating layer for the back gate of the transistor 22 and a gate insulating layer for the back gate of the transistor 32 included in the semiconductor device 10A2 each contain a material that can have ferroelectricity.

Figure 3A:
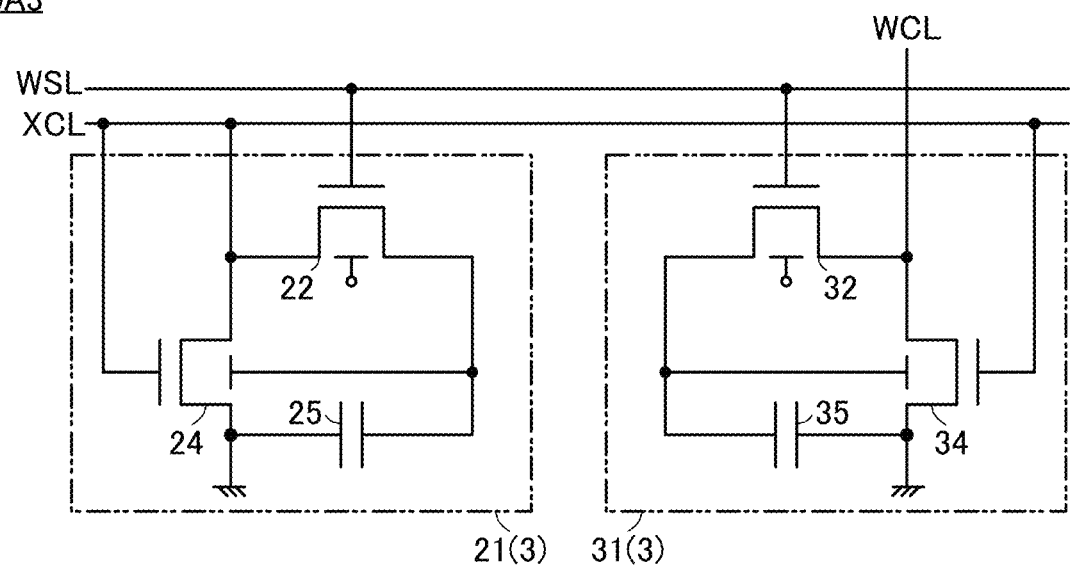
FIG. 3A and FIG. 3B are diagrams illustrating structure examples of semiconductor devices.

FIG. 3A is a diagram illustrating a semiconductor device 10A3 of one embodiment of the present invention. Note that in the following description of the semiconductor device 10A3, components and the like similar to those of the semiconductor device 10A1 are not described in some cases.

The semiconductor device 10A3 includes a reference cell 21(3) and an arithmetic cell 31(3). The reference cell 21(3) includes the transistor 22, the transistor 24, and the capacitor 25, like the reference cell 21(1). The arithmetic cell 31(3) includes the transistor 32, the transistor 34, and the capacitor 35, like the arithmetic cell 31(1). The transistor 22, the transistor 24, the transistor 32, and the transistor 34 each include a gate and a back gate.

The gate of the transistor 22 is electrically connected to the wiring WSL. One of the source and the drain of the transistor 22 is electrically connected to one of the source and the drain of the transistor 24 and the wiring XCL. The other of the source and the drain of the transistor 22 is electrically connected to the gate of the transistor 24 and one electrode of the capacitor 25. The transistor 22 is brought into an on state at the time of data writing so that a reference potential can be written to a retention node (the back gate of the transistor 24) in the reference cell 21(3), and is brought into an off state so that the reference potential can be retained in the reference cell 21(3). Note that a node to which the back gate of the transistor 24, the other of the source and the drain of the transistor 22, and the one electrode of the capacitor 25 are connected is also referred to as a retention node. The retention node can be set at a potential corresponding to a current flowing in the transistor 24.

The other of the source and the drain of the transistor 24 and the other electrode of the capacitor 25 are connected to a wiring supplying a constant potential such as a low power supply potential (e.g., aground potential). The wiring supplying aground potential functions as a wiring for supplying a current between the source and the drain of the transistor 24. The gate of the transistor 24 is electrically connected to the wiring XCL.

Next, connection relations in the arithmetic cell 31(3) will be described.

The gate of the transistor 32 is electrically connected to the wiring WSL. One of the source and the drain of the transistor 32 is electrically connected to one of the source and the drain of the transistor 34 and the wiring WCL. The other of the source and the drain of the transistor 32 is electrically connected to the back gate of the transistor 34 and one electrode of the capacitor 35. The transistor 32 is brought into an on state at the time of data writing so that a voltage corresponding to the weight data can be written to the arithmetic cell 31(3), and is brought into an off state so that the voltage corresponding to the weight data can be retained in the arithmetic cell 31(3). Note that a node to which the back gate of the transistor 34, the other of the source and the drain of the transistor 32, and the one electrode of the capacitor 35 are connected is also referred to as a retention node.

The other of the source and the drain of the transistor 34 is connected to a wiring supplying a constant potential such as a low power supply potential (e.g., a ground potential). The wiring supplying a ground potential functions as a wiring for supplying a current between the source and the drain of the transistor 34. The gate of the transistor 34 is electrically connected to the wiring XCL.

Next, the transistors included in the reference cell 21(3) and the arithmetic cell 31(3) will be described.

The transistor 22 and the transistor 32 have functions of retaining the potentials of the back gate of the transistor 24 and the back gate of the transistor 34 by being brought into an off state. Specifically, with the function, a reference potential supplied to the back gate of the transistor 24 through the transistor 22 can be retained. In addition, with the function, a potential corresponding to data supplied to the back gate of the transistor 34 through the transistor 32 can be retained.

As described above, a current flowing between a source and a drain in an off state, that is, a leakage current, is extremely low in an OS transistor. Thus, with the use of an OS transistor as the transistor 22 and/or the transistor 32, the leakage current of the transistor 22 and/or the transistor 32 can be suppressed, so that the power consumption of the semiconductor device 10A3 can be reduced. Specifically, a change in the potential retained in each of the back gate of the transistor 24 and the back gate of the transistor 34 can be extremely small, so that the frequency of refresh operations for the potential can be reduced. The reduction in the frequency of refresh operations can reduce the power consumption of the semiconductor device 10A3. An extremely low leakage current from the retention node to the wiring WCL or the wiring XCL allows the cell to retain the potential of the retention node for a long time.

Figure 3B:
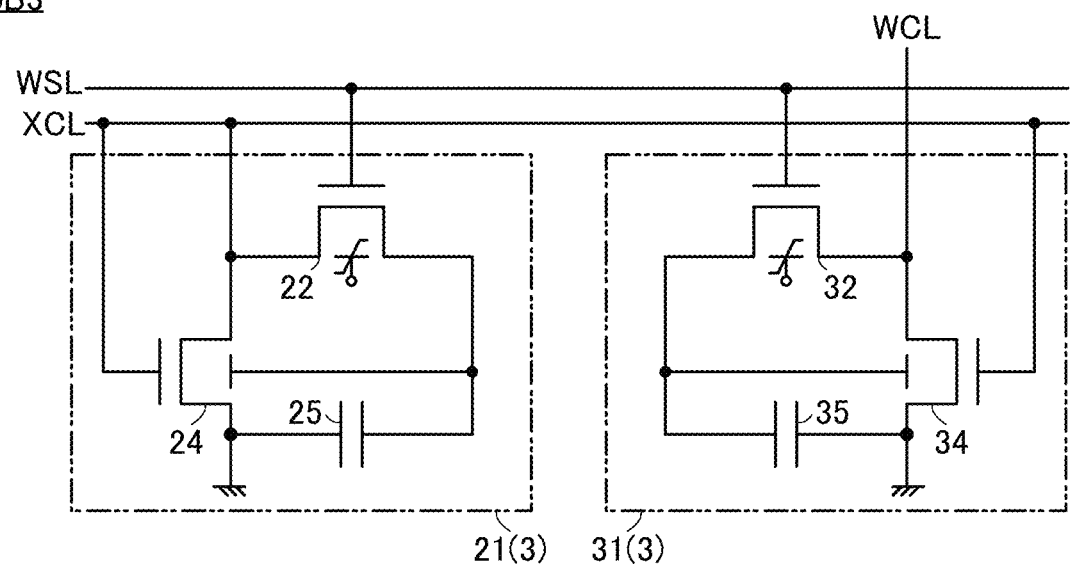

FIG. 3B is a diagram illustrating a semiconductor device 10B3 of one embodiment of the present invention. In the semiconductor device 10B3, agate insulating layer for the back gate of the transistor 22 and a gate insulating layer for the back gate of the transistor 32 included in the semiconductor device 10A3 each contain a material that can have ferroelectricity.

Figure 4A:
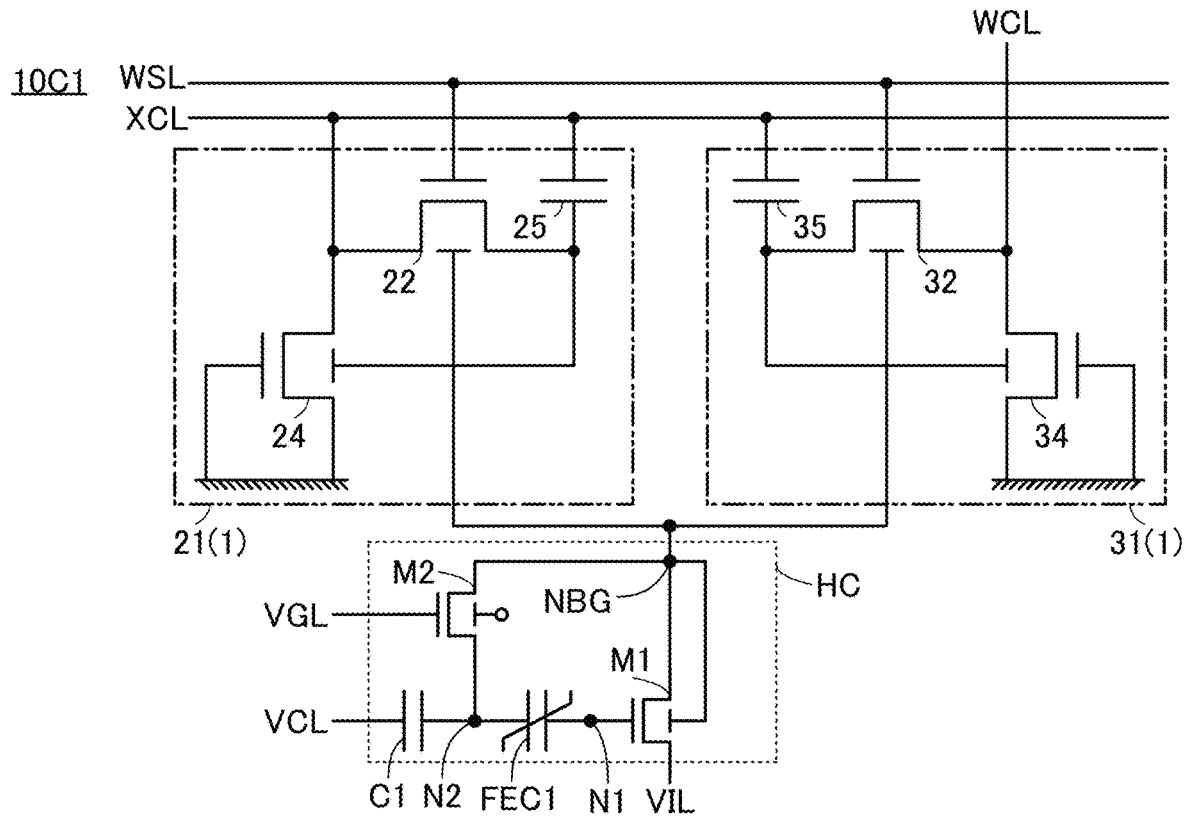
FIG. 4A and FIG. 4B are diagrams illustrating structure examples of a semiconductor device.
Figure 5A:
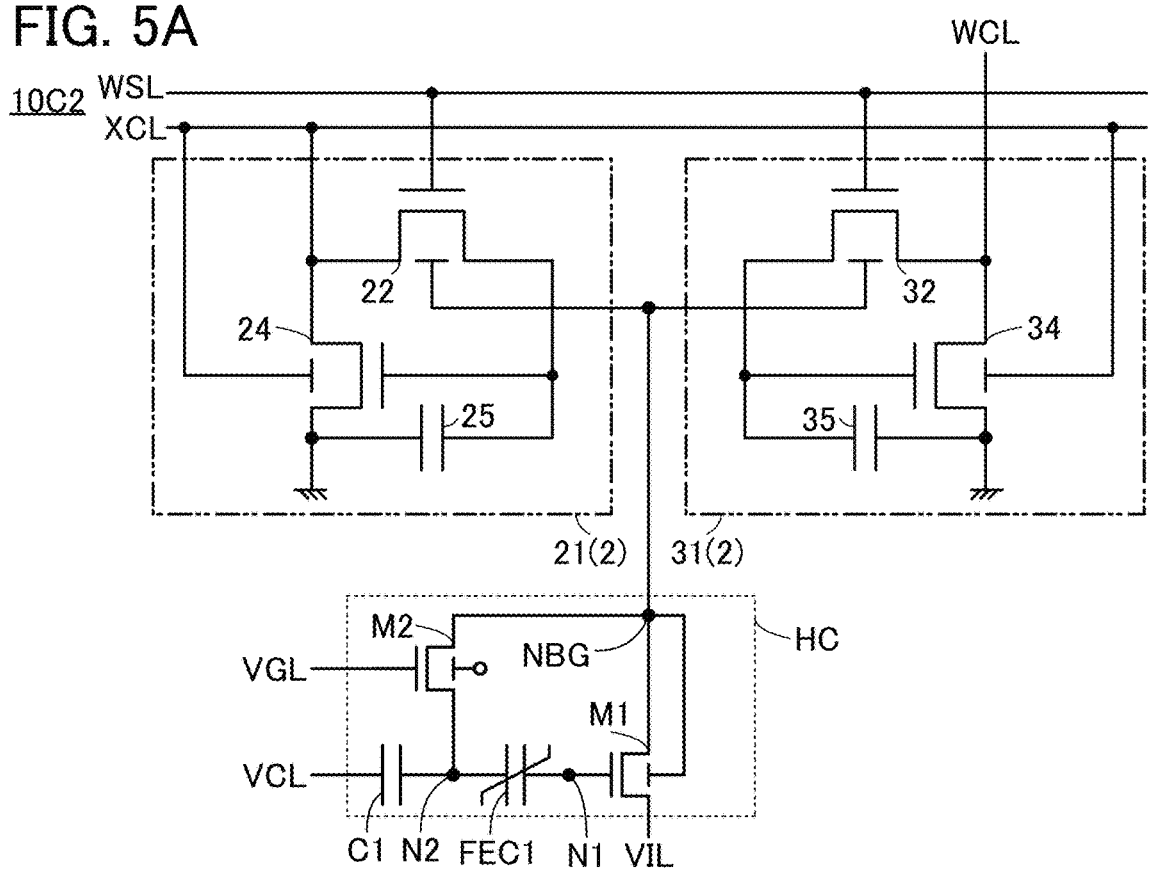
FIG. 5A and FIG. 5B are diagrams illustrating structure examples of a semiconductor device.
Figure 6A:
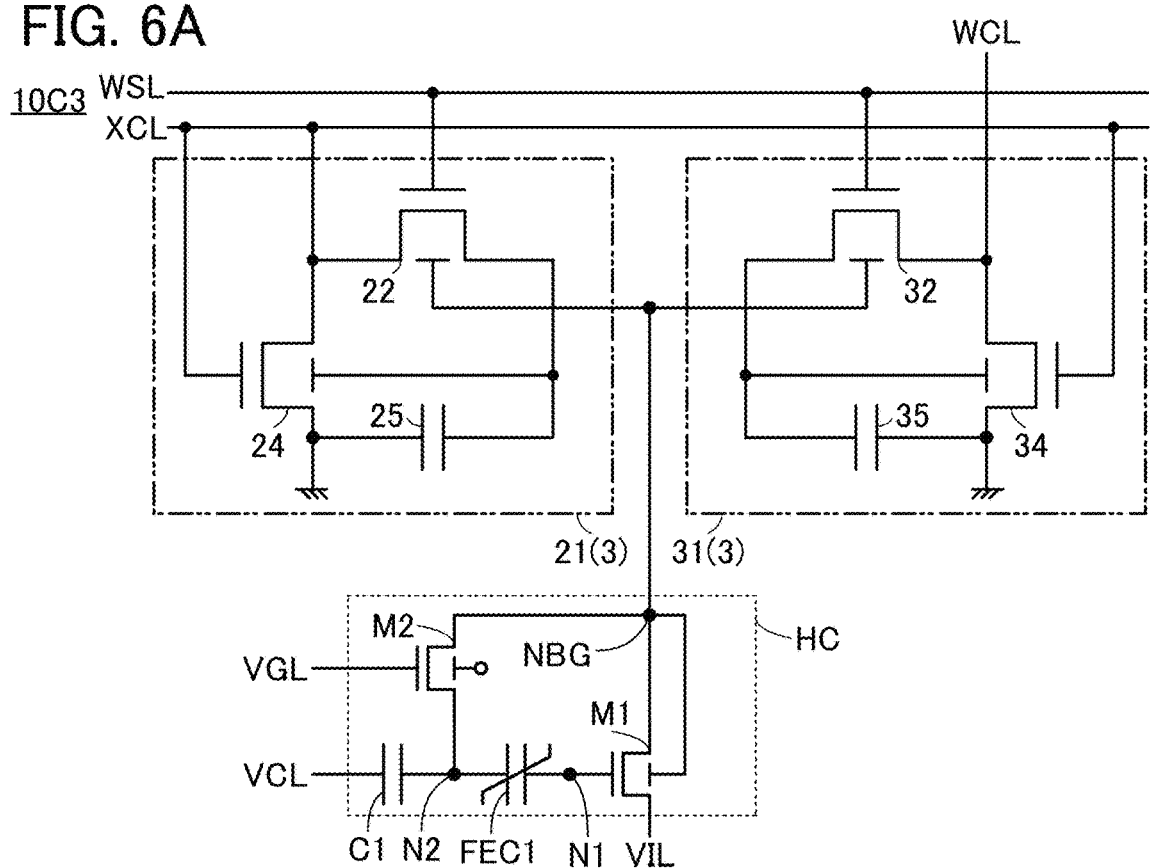
FIG. 6A and FIG. 6B are diagrams illustrating structure examples of a semiconductor device.

FIG. 4A is a diagram illustrating a semiconductor device 10C1 of one embodiment of the present invention, FIG. 5A is a diagram illustrating a semiconductor device 10C2 of one embodiment of the present invention, and FIG. 6A is a diagram illustrating a semiconductor device 10C3 of one embodiment of the present invention. In the semiconductor device 10C1, the back gate of the transistor 22 and the back gate of the transistor 32 included in the semiconductor device 10A1 are electrically connected to a circuit HC. In the semiconductor device 10C2, the back gate of the transistor 22 and the back gate of the transistor 32 included in the semiconductor device 10A2 are electrically connected to the circuit HC. In the semiconductor device 10C3, the back gate of the transistor 22 and the back gate of the transistor 32 included in the semiconductor device 10A3 are electrically connected to the circuit HC.

The circuit HC has a function of a retention circuit for retaining the back gate potential of the transistor 22 and the back gate potential of the transistor 32. The circuit HC includes a transistor M1, a transistor M2, a capacitor C1, and a capacitor FEC1. The transistor M1 and the transistor M2 each include a gate and a back gate.

The transistor M1 and the transistor M2 are each preferably an OS transistor. As described above, an OS transistor has an extremely low off-state current. Thus, with the use of an OS transistor as the transistor M1 and the transistor M2, the back gate potential of the transistor 22 and the back gate potential of the transistor 32 can be retained for a long time.

The capacitor FEC1 is a capacitor containing a material that can have ferroelectricity as a dielectric. In this specification and the like, a capacitor containing a material that can have ferroelectricity as a dielectric is referred to as a ferroelectric capacitor.

Figure 4B:
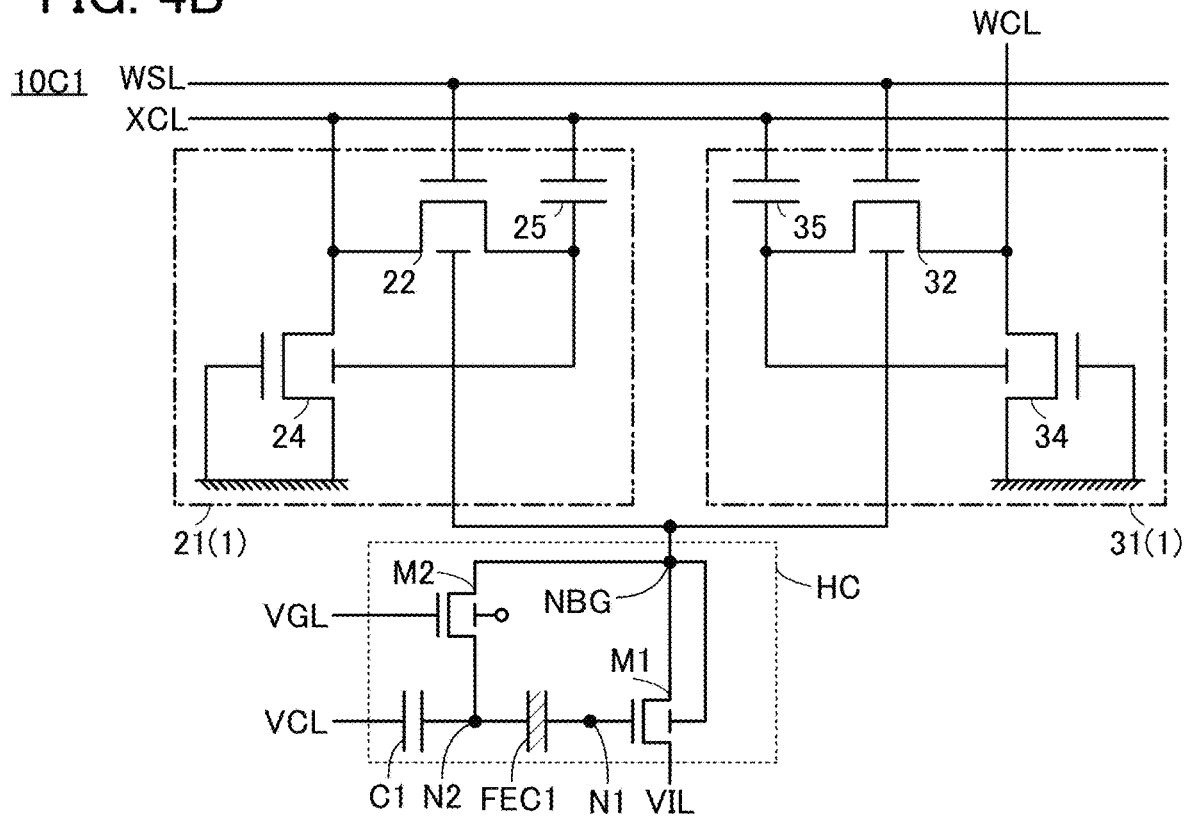
Figure 5B:
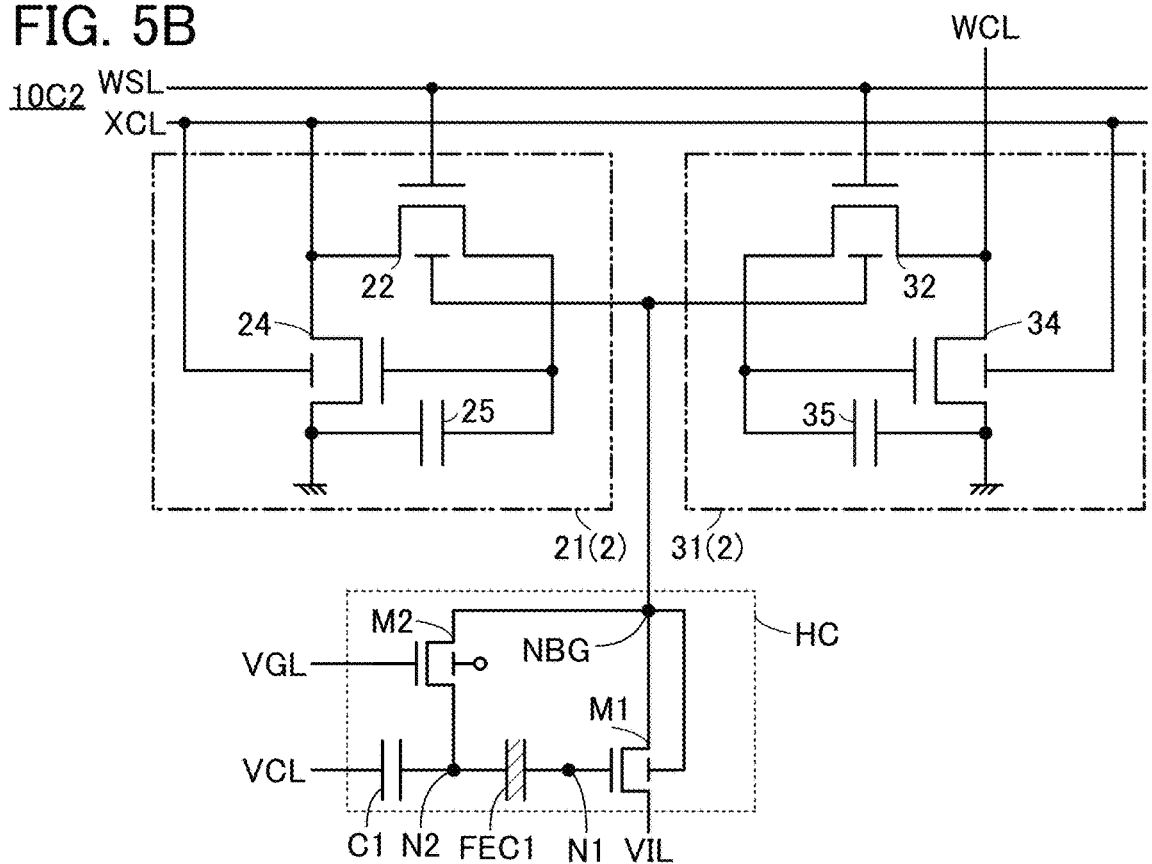
Figure 6B:
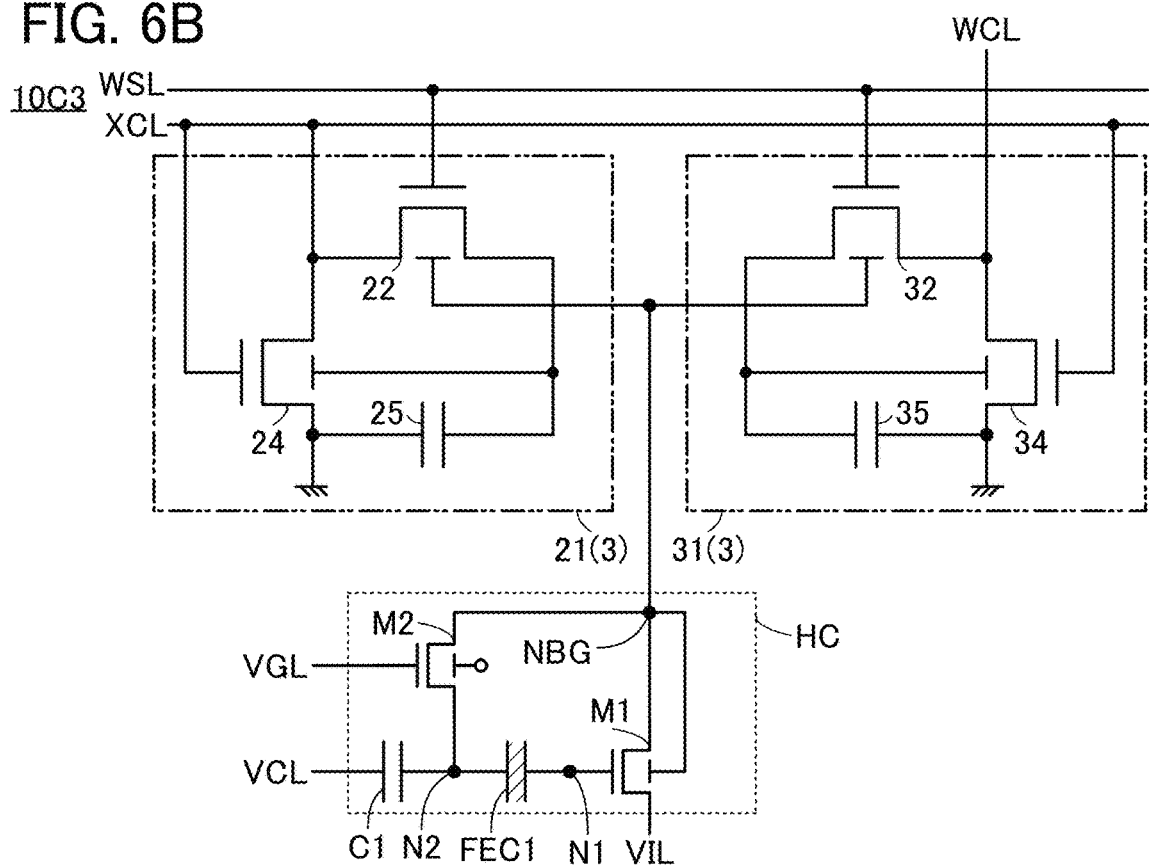

Note that in this specification and the like, a circuit symbol of a ferroelectric capacitor (e.g., the capacitor FEC1) is a circuit symbol of a capacitor to which a diagonal line is added, as illustrated in FIG. 4A, FIG. 5A, and FIG. 6A. As another circuit symbol, a circuit symbol of a capacitor including a plurality of diagonal lines between two parallel lines as illustrated in FIG. 4B, FIG. 5B, and FIG. 6B may be used.

The circuit HC is electrically connected to the reference cell 21 and the arithmetic cell 31. Specifically, the back gate of the transistor 22 and the back gate of the transistor 32 are electrically connected to one of a source and a drain of the transistor M1, the back gate of the transistor M1, and one of a source and a drain of the transistor M2. The other of the source and the drain of the transistor M1 is electrically connected to a wiring VIL. The gate of the transistor M1 is electrically connected to one electrode of the capacitor FEC1. The other of the source and the drain of the transistor M2 is electrically connected to the other electrode of the capacitor FEC1 and one electrode of the capacitor C1. The gate of the transistor M2 is electrically connected to a wiring VGL. The other electrode of the capacitor C1 is electrically connected to a wiring VCL.

In this specification and the like, a point to which the gate of the transistor M1 and the other electrode of the capacitor FEC1 are electrically connected is referred to as a node N1. In addition, a point to which the other electrode of the capacitor FEC1, the one electrode of the capacitor C1, and the other of the source and drain of the transistor M2 are electrically connected is referred to as a node N2. Furthermore, a point to which the one of the source and the drain of the transistor M1, the back gate of the transistor M1, and the one of the source and the drain of the transistor M2 are electrically connected is referred to as a node NBG. That is, a potential of the node NBG can be a potential to be supplied to the back gate of the transistor 22 and the back gate of the transistor 32.

Since the node N1 is not electrically connected to a circuit element, a terminal, a wiring, or the like other than the gate of the transistor M1 and the one electrode of the capacitor FEC1, no voltage is directly input from a voltage source or the like to the node N1. Thus, the node N1 is in a floating state. An initial potential of the node N1 can be determined at the time of manufacturing a semiconductor device (specifically, at the time of forming the circuit HC, for example).

The wiring VIL functions as a wiring supplying a constant potential. In the case where the threshold voltages of the transistor 22 and the transistor 32 are shifted to the positive direction, for example, the constant potential can be a low-level potential, a ground potential, a negative potential, or the like. In the case where the threshold voltages of the transistor 22 and the transistor 32 are shifted to the negative direction, for example, the constant potential can be a high-level potential, a positive potential, or the like.

The wiring VCL functions as a wiring for supplying a potential for causing polarization in the material that can have ferroelectricity and is contained in the capacitor FEC1. For example, in the case where the direction of an electric field generated in the material by the polarization of the material is from the one electrode toward the other electrode of the capacitor FEC1, the potential can be a positive potential or the like. As another example, in the case where the direction of an electric field generated in the material by the polarization of the material is from the other electrode toward the one electrode of the capacitor FEC1, the potential can be a negative potential or the like. In addition, a potential not causing polarization in the material that can have ferroelectricity and is contained in the capacitor FEC1 may be supplied to the wiring VCL.

The wiring VGL functions as a wiring supplying a signal potential for controlling switching between an on state and an off state of the transistor M2. For example, the transistor M2 can be brought into an on state when the potential of the wiring VGL is set to a high-level potential, and the transistor M2 can be brought into an off state when the potential of the wiring VGL is set to a low-level potential.

Figure 7A:
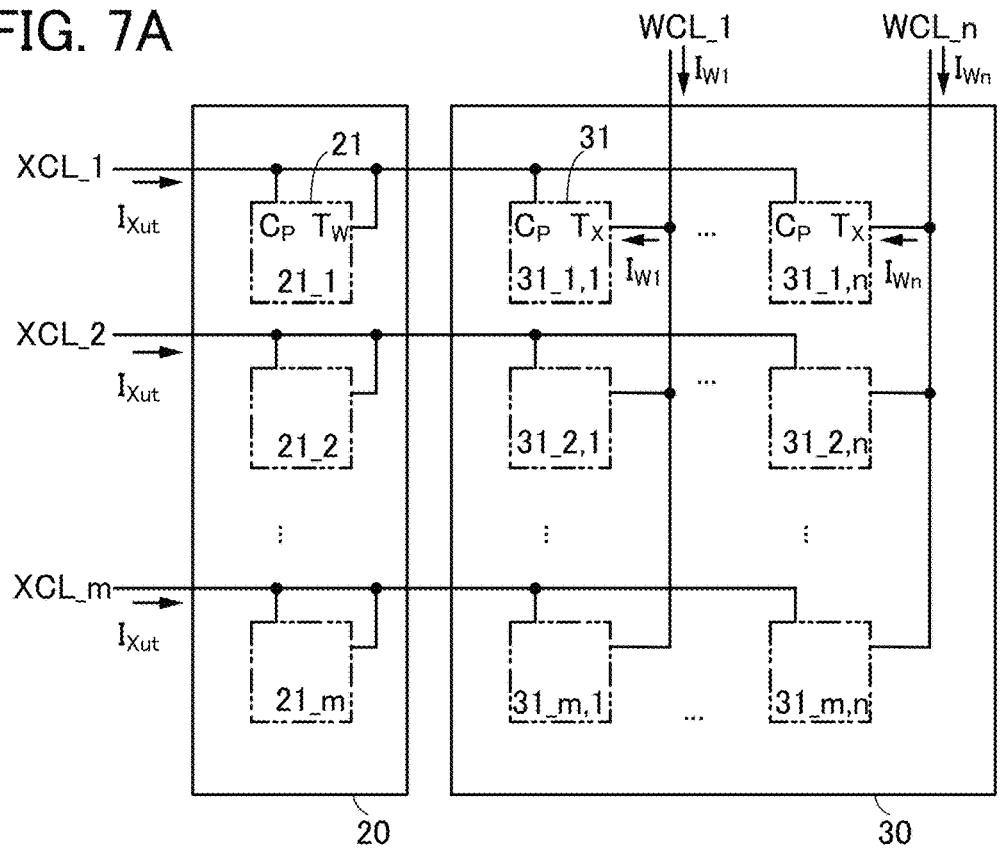
FIG. 7A and FIG. 7B are diagrams illustrating structure examples of a semiconductor device.

Next, a structure including a plurality of the reference cells 21 and the arithmetic cells 31 will be described with reference to FIG. 7A and FIG. 7B. FIG. 7A illustrates a schematic operation at the time of data writing and FIG. 7B illustrates a schematic operation at the time of data reading.

Figure 7B:
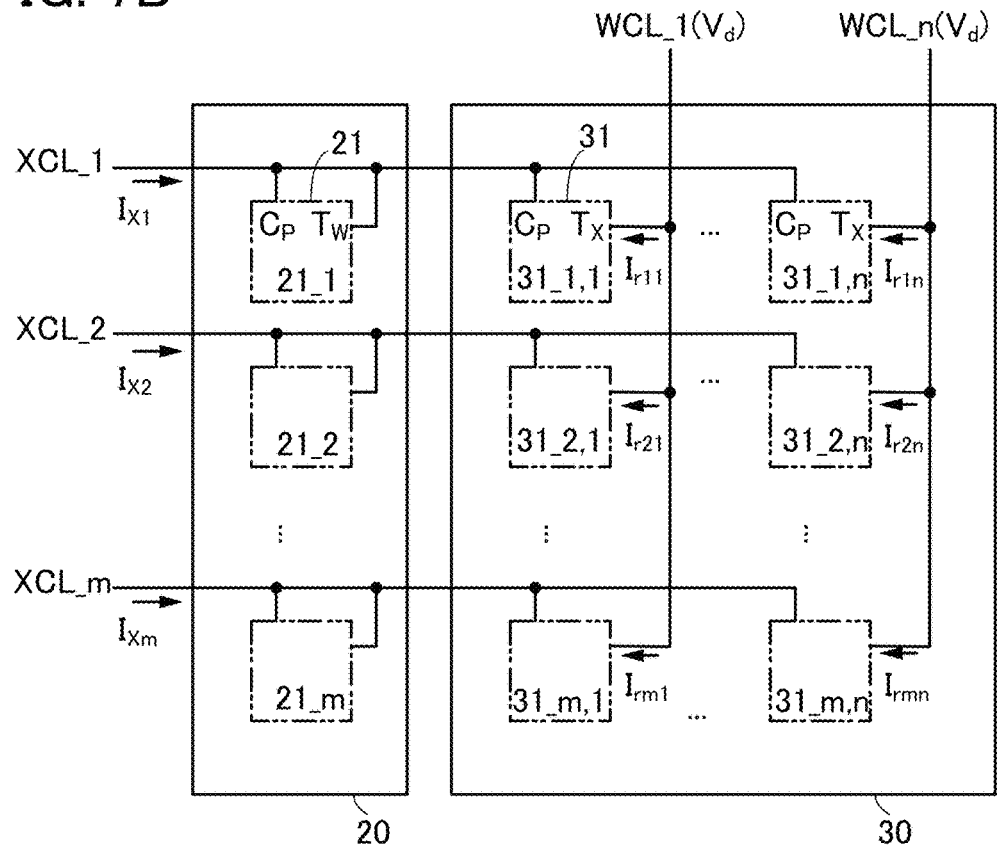

In FIG. 7A and FIG. 7B, a reference cell portion 20 provided with a plurality of reference cells 21_1 to 21_m (each of which corresponds to the reference cell 21 in FIG. TA and the like), and an arithmetic cell portion 30 provided with a plurality of arithmetic cells 31_1,1 to 31_m,n (each of which corresponds to the arithmetic cell 31 in FIG. TA and the like) are provided. FIG. 7A and FIG. 7B illustrate a plurality of wirings XCL as wirings XCL_1 to XCL_m. Furthermore, FIG. 7A and FIG. 7B illustrate a plurality of wirings WCL as wirings WCL_1 to WCL_n. Note that m and n are each an integer of 1 or more.

In FIG. 7A and FIG. 7B, the cells included in the reference cell portion 20 and the arithmetic cell portion 30 are arranged in a matrix including n+1 cells in the row direction and m cells in the column direction. Any structure is acceptable as long as the cells included in the reference cell portion 20 and the arithmetic cell portion 30 are arranged in a matrix including two or more cells in the row direction and one or more cells in the column direction.

FIG. 7A and FIG. 7B illustrate the reference cell 21 and the arithmetic cell 31 in a simplified manner for the description. A terminal $C_P$ of the reference cell 21 in the reference cell portion 20 corresponds to the one electrode of the capacitor 25 in FIG. TA and the like, the back gate of the transistor 24 in FIG. 2A and the like, or the gate of the transistor 24 in FIG. 3A and the like. A terminal $T_W$ of the reference cell 21 in the reference cell portion 20 corresponds to a terminal to which the one of the source and the drain of the transistor 22 and the one of the source and the drain of the transistor 24 are connected in FIG. TA, FIG. 2A, FIG. 3A, and the like. The terminal $C_P$ of the arithmetic cell 31 in the arithmetic cell portion 30 corresponds to the one electrode of the capacitor 35 in FIG. TA and the like, the back gate of the transistor 34 in FIG. 2A and the like, or the gate of the transistor 34 in FIG. 3A and the like. A terminal Tx of the arithmetic cell 31 in the arithmetic cell portion 30 corresponds to a terminal to which the one of the source and the drain of the transistor 32 and the one of the source and the drain of the transistor 34 are connected in FIG. TA, FIG. 2A, FIG. 3A, and the like.

In a data writing operation illustrated in FIG. 7A, the current $I_{X_{ut}}$ is supplied to the reference cell 21 in each row.

The current supplied to each row is the current $I_{X_{ut}}$ which is normalized, and is equivalent for each row. The amount of the current $I_{X_{ut}}$ corresponds to that of a current corresponding to reference data (reference current). The current does not flow in the arithmetic cells 31 in each row because the arithmetic cells 31 are connected through the capacitors. The reference cell 21 operates such that a voltage corresponding to the current flowing therein is retained.

Furthermore, in the data writing operation illustrated in FIG. 7A, currents $I_{W1}$ to $I_{Wn}$ ($I_W$) are supplied to arithmetic cells in the respective columns. Each of the currents supplied to the respective columns corresponds to the amount of current obtained by multiplying the normalized current $I_{W_{ut}}$ by weight data w ($I_W = w I_{W_{ut}}$). The currents $I_{W1}$ to $I_{Wn}$ may be different for each column.

In a data reading operation illustrated in FIG. 7B, currents $I_{X1}$ to $I_{Xm}$ ($I_X$) are supplied to the reference cells 21 in the respective rows. Each of the currents $I_{X1}$ to $I_{Xm}$ supplied to the respective rows corresponds to the amount of current obtained by multiplying the normalized current $I_{X_{ut}}$ by input data x ($I_X = x I_{X_{ut}}$). The currents $I_{X1}$ to $I_{Xm}$ may be different for each row. Note that the current $I_{X_{ut}}$ is preferably equivalent to the current $I_{W_{ut}}$.

In the data reading operation illustrated in FIG. 7B, the voltages retained in the reference cells 21 are boosted by the currents $I_{X1}$ to $I_{Xm}$. In accordance with the boosting, the voltages of the wirings XCL_1 to XCL_m are also boosted; thus, voltages retained in the arithmetic cells 31 are boosted by capacitive coupling of the capacitors 35. Then, the potentials of the wirings WCL_1 to WCL_n are set to a voltage Vd. At this time, a current $I_r$ flowing in the transistor 34 corresponds to the product of the current value ($I_w$) retained in the arithmetic cell 31 at the time of data writing and the current value ($I_x$) supplied to the reference cell 21 at the time of data reading (currents $I_{r11}$ to $I_{rmn}$). Estimation of the sum of the currents $I_{r11}$ to $I_{rm}$ flowing in each column can result in output of data corresponding to the result of the product-sum operation of the input data and the weight data.

Note that the transistor 22 and the transistor 24 included in each of the cells in the reference cell portion 20 preferably have the same size (e.g., channel length, channel width, and transistor structure). Furthermore, the transistor 32 and the transistor 34 included in each of the cells in the arithmetic cell portion 30 preferably have the same size. Furthermore, the transistor 22 and the transistor 32 preferably have the same size. Furthermore, the transistor 24 and the transistor 34 preferably have the same size.

By making the transistors have the same size, the transistors can have substantially the same electrical characteristics. Thus, by making the transistors 22 included in the reference cell 21_1,1 to the reference cell 21_m,n have the same size and the transistors 24 included in the reference cell 21_1,1 to the reference cell 21_m,n have the same size, the reference cell 21_1,1 to the reference cell 21_m,n can perform almost the same operation under the same conditions. The same conditions here mean, for example, that the input potential to the source, drain, gate, or the like of the transistor 22, the input potential to the source, drain, gate, or the like of the transistor 24, and voltages retained in the reference cell 21_1,1 to the reference cell 21_m,n are the same. By making the transistors 32 included in the arithmetic cell 31_1 to the arithmetic cell 31_m have the same size and making the transistors 34 included in the arithmetic cell 31_1 to the arithmetic cell 31_m have the same size, the arithmetic cell 31_1 to the arithmetic cell 31_m can perform substantially the same operation and can have substantially the same operation results. The arithmetic cell 31_1 to the arithmetic cell 31_m can perform substantially the same operation under the same conditions. The same conditions here mean, for example, that the input potential to the source, drain, gate, or the like of the transistor 32, the input potential to the source, drain, gate, or the like of the transistor 34, and voltages retained in the arithmetic cell 31_1 to the arithmetic cell 31_m are the same.

Figure 8A:
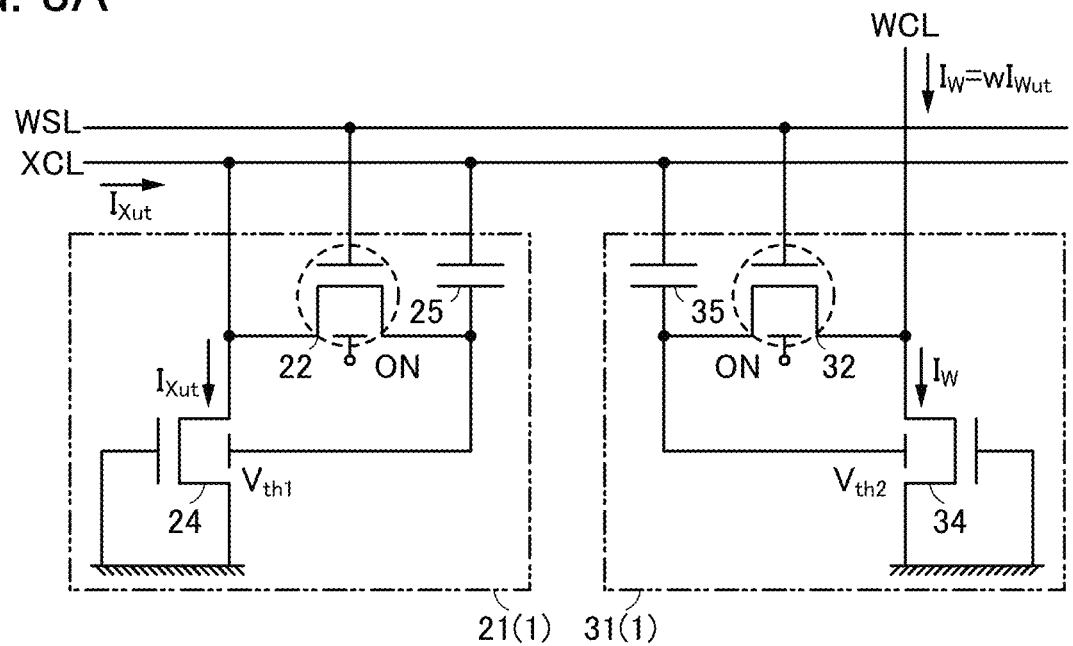
FIG. 8A and FIG. 8B are diagrams illustrating examples of a method for operating a semiconductor device.

The operation of the reference cell 21(1) and the arithmetic cell 31(1) at the time of data writing will be described with reference to FIG. 8A.

The wiring WSL is set to an H level so that the transistor 22 and the transistor 32 are brought into an on state (ON). The current $I_{X_{ut}}$ corresponding to the reference current is supplied to the wiring XCL. Furthermore, the current $I_W$ is supplied to the wiring WCL. The current $I_W$ corresponds to a current obtained by multiplying the weight data w by the normalized current $I_{W_{ut}}$ ($I_W = w I_{W_{ut}}$ in the drawing).

In the reference cell 21(1), the transistor 22 is brought into an on state. A potential of the retention node to which the back gate of the transistor 24 is electrically connected becomes a potential that makes the threshold voltage of the transistor 24 be $V_{th1}$. Accordingly, the transistor 24 allows the current of the current $I_{X_{ut}}$ to flow between the source and the drain of the transistor 24. Specifically, the threshold voltage of the transistor 24 can be set such that a current flowing between the source and the drain of the transistor 24 becomes $I_{X_{ut}}$. In this specification and the like, such an operation is expressed as, for example, "setting (programming) the current flowing between the source and the drain of the transistor 24 in the reference cell 21(1) to $I_{X_{ut}}$" in some cases.

In the arithmetic cell 31(1), the transistor 32 is brought into an on state. The potential of the retention node to which the back gate of the transistor 34 is electrically connected becomes a potential that makes the threshold voltage of the transistor 34 be $V_{th2}$. Accordingly, a current flowing between the source and the drain of the transistor 34 in the arithmetic cell 31(1) is set to $I_W$. Specifically, the threshold voltage of the transistor 34 is set such that a current flowing between the source and the drain of the transistor 34 becomes $I_W$.

The current $I_{X_{ut}}$ supplied to the reference cell 21(1) through the wiring XCL at the time of data writing can be represented by Equation (2). Here, a ground potential is supplied to the gate of the transistor 24 and the other of the source and the drain of the transistor 24.

[Formula 2]

$$I_{X_{ut}} = I_0 \exp\left(\frac{-V_{th1}}{\eta k_B T/q}\right) \quad (2)$$

The current $I_W$ supplied to the arithmetic cell 31(1) through the wiring WCL at the time of data writing can be represented by Equation (3). Here, a ground potential is supplied to the gate of the transistor 34 and the other of the source and the drain of the transistor 34.

[Formula 3]

$$I_W = I_0 \exp\left(\frac{-V_{th2}}{\eta k_B T/q}\right) = w I_{W_{ut}} \quad (3)$$

As shown in Equation (3), the current $I_W$ can be expressed as the product of the weight data w and the normalized current $I_{W_{ut}}$.

Figure 8B:
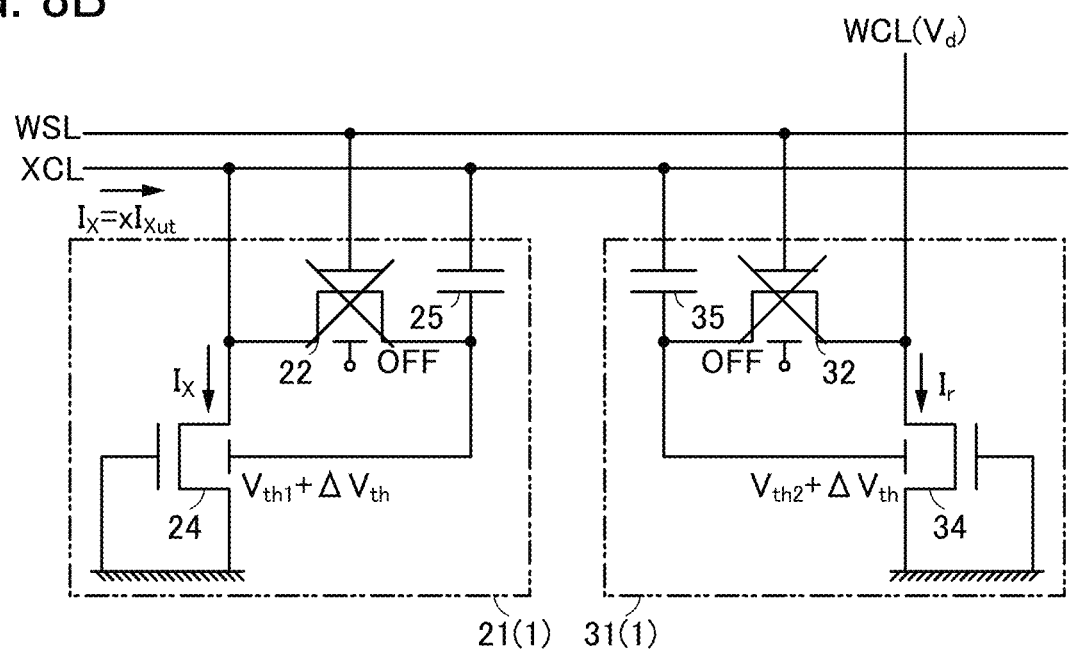

The operation of the reference cell 21(1) and the arithmetic cell 31(1) at the time of data reading is described with reference to FIG. 8B. Note that a period in which the set current is retained can be provided in a period between data writing and data reading. In the period in which the set current is retained, the transistor 22 and the transistor 32 are brought into an off state (OFF). When OS transistors are used as the transistor 22 and the transistor 32, each of them can keep retaining the potential of the retention node corresponding to the set current.

In the reference cell 21(1), the wiring WSL is set to an L level so that the transistor 22 is brought into an off state (OFF). The current $I_X$ corresponding to the input current is supplied to the wiring XCL. The current $I_X$ corresponds to a current obtained by multiplying the input data x by the normalized current $I_{Xut}$ ($I_X = xI_{ut}$ in the drawing). When the current $I_x$ flows in the transistor 24, the potential of the retention node to which the back gate of the transistor 24 is electrically connected changes due to capacitive coupling through the capacitor 25, and thus the threshold voltage of the transistor 24 changes to $V_{th1}+\Delta V_{th}$. Accordingly, the potential of the wiring XCL also changes.

In the arithmetic cell 31(1), the wiring WSL is set to an L level so that the transistor 32 is brought into an off state (OFF). Accordingly, the retention node in the arithmetic cell 31(1) is in an electrically floating state (floating). Due to the capacitive coupling of the capacitor 35 in accordance with change in the potential of the wiring XCL caused by the operation of the reference cell 21(1), the potential of the retention node of the arithmetic cell 31(1) changes, and thus the threshold voltage of the transistor 34 changes to $V_{th2}+\Delta V_{th}$. Accordingly, the current $I_r$ flows between the source and the drain of the transistor 34.

The current $I_X$ supplied to the reference cell 21(1) through the wiring XCL at the time of data reading can be represented by Equation (4). Here, a ground potential is supplied to the gate of the transistor 24 and the other of the source and the drain of the transistor 24.

[Formula 4]

$$I_X = I_0 \exp\left(\frac{-V_{th1}+\Delta V_{th}}{\eta k_B T/q}\right) = xI_{Xut} \tag{4}$$

The input data x in Equation (4) can be represented by Equation (5).

[Formula 5]

$$x = \exp\left(\frac{\Delta V_{th}}{\eta k_B T/q}\right) \tag{5}$$

From Equation (4) and Equation (5), the current $I_X$ can be expressed as the product of the input data x and the normalized current $I_{Xut}$.

The wiring WCL is set to the voltage $V_d$ at the time of data reading so that currents flow in the arithmetic cells 31(1) in each row. Then, the threshold voltage of the transistor 34 in the arithmetic cell 31(1) changes to $V_{th2}+\Delta V_{th}$, so that the current $I_r$ flowing in the transistor 34 can be represented by Equation (6). Here, a ground potential is supplied to the gate of the transistor 34 and the other of the source and the drain of the transistor 34.

[Formula 6]

$$I_r = I_0 \exp\left(\frac{-V_{th2}+\Delta V_{th}}{\eta k_B T/q}\right) = wxI_{Wut} \tag{6}$$

From Equation (3) and Equation (5), $I_r$ in Equation (6) can be estimated as a current corresponding to the product of the weight data w and the input data x. Since currents flowing in the arithmetic cells 31(1) in each row can be added, a signal corresponding to the arithmetic result obtained by product-sum operation processing of the weight data w and the input data x can be output when a current flowing through the wiring WCL is output to the outside.

Figure 9A:
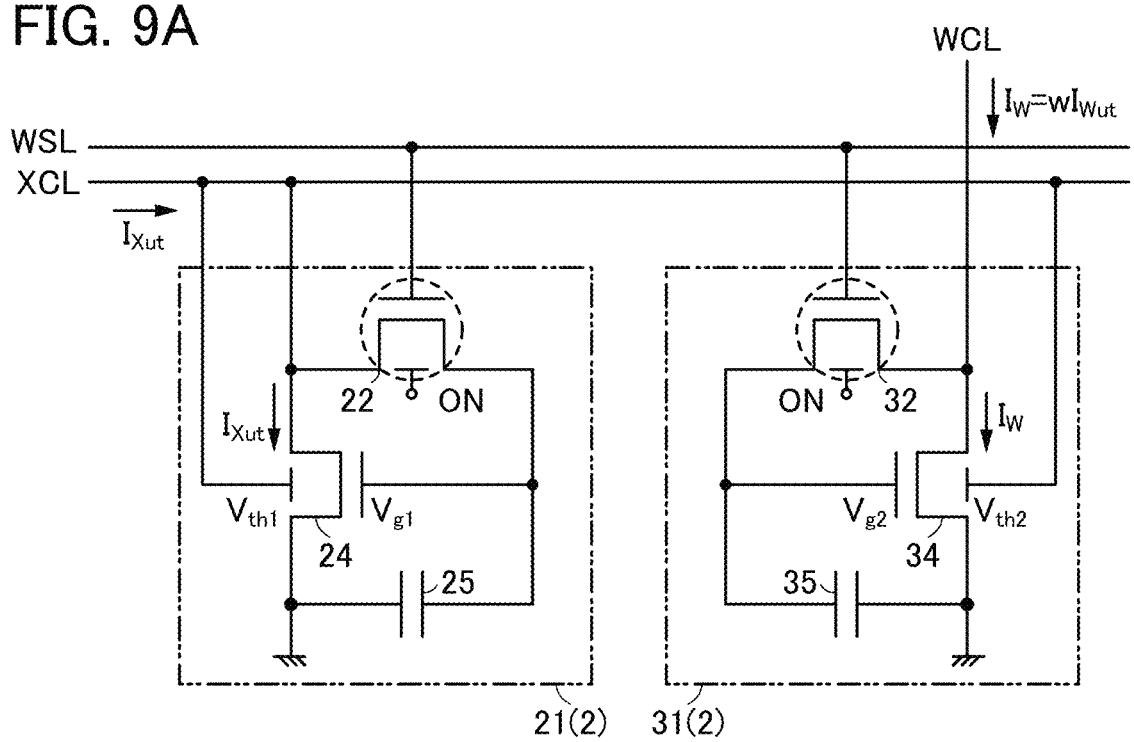
FIG. 9A and FIG. 9B are diagrams illustrating examples of a method for operating a semiconductor device.

The operation of the reference cell 21(2) and the arithmetic cell 31(2) at the time of data writing will be described with reference to FIG. 9A. Note that in the following description of the operation, in the case where a potential supplied to the back gate of the transistor 24 and a potential supplied to the back gate of the transistor 34 are equal to each other, the threshold voltage of the transistor 24 and the threshold voltage of the transistor 34 are equal to each other.

The wiring WSL is set to an H level so that the transistor 22 and the transistor 32 are brought into an on state (ON). The current $I_{Xut}$ corresponding to the reference current is supplied to the wiring XCL. Furthermore, the current $I_W$ is supplied to the wiring WCL. As described above, the current $I_W$ corresponds to a current obtained by multiplying the weight data w by the normalized current $I_{Wut}$ ($I_w=wI_{Wut}$ in the drawing).

In the reference cell 21(2), the transistor 22 is brought into an on state. A potential of the retention node to which the gate of the transistor 24 is electrically connected becomes $V_{g1}$. The back gate potential of the transistor 24 becomes a potential that makes the threshold voltage of the transistor 24 be $V_{th1}$. In this manner, the transistor 24 allows the current of the current $I_{Xut}$ to flow between the source and the drain of the transistor 24.

In the arithmetic cell 31(2), the transistor 32 is brought into an on state. A potential of the retention node to which the gate of the transistor 34 is electrically connected becomes $V_{g2}$. The back gate potential of the transistor 34 becomes a potential that makes the threshold voltage of the transistor 34 be $V_{th2}$. In this manner, a current flowing between the source and the drain of the transistor 34 in the arithmetic cell 31(2) is set to $I_w$.

The current $I_{Xut}$ supplied to the reference cell 21(2) through the wiring XCL at the time of data writing can be represented by Equation (7). Here, a ground potential is supplied to the other of the source and the drain of the transistor 24.

[Formula 7]

$$I_{Xut} = I_0 \exp\left(\frac{V_{g1}-V_{th1}}{\eta k_B T/q}\right) \tag{7}$$

The current $I_W$ supplied to the arithmetic cell 31(2) through the wiring WCL at the time of data writing can be represented by Equation (8). Here, a ground potential is supplied to the other of the source and the drain of the transistor 34.

[Formula 8]

$$I_W = I_0 \exp\left(\frac{V_{g2} - V_{th2}}{\eta k_B T/q}\right) = w I_{Wut} \quad (8)$$

As shown in Equation (8), the current $I_w$ can be expressed as the product of the weight data w and the normalized current $I_{Wut}$.

Figure 9B:
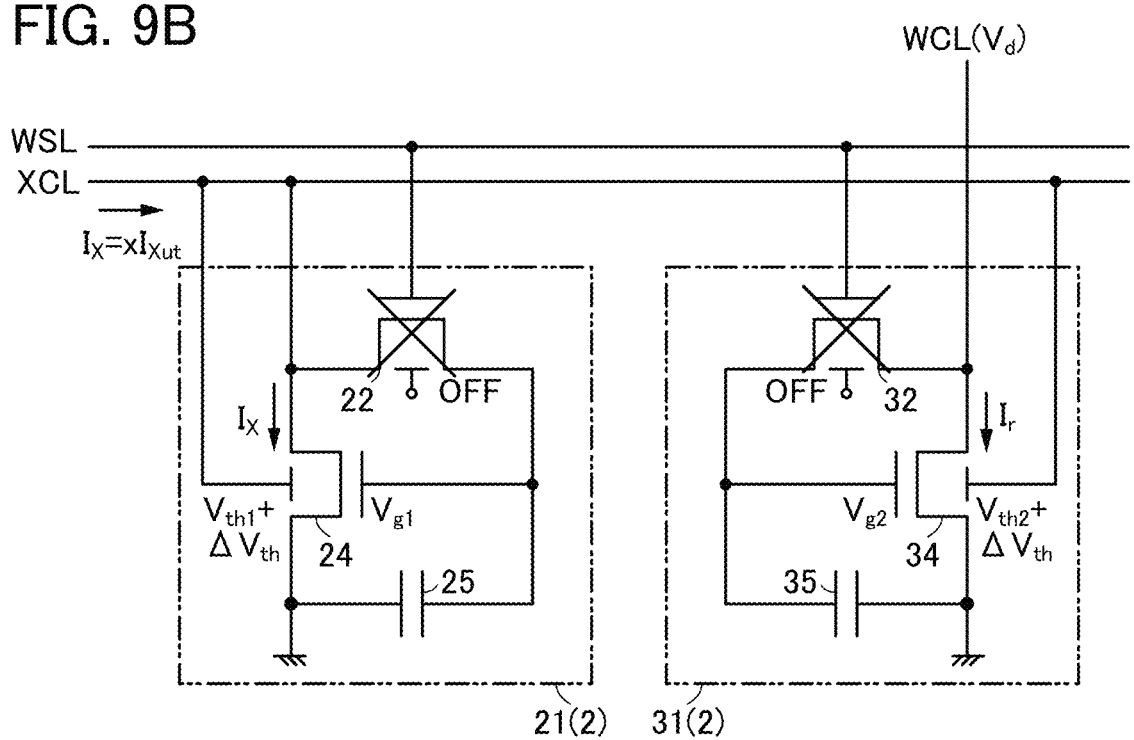

The operation of the reference cell 21(2) and the arithmetic cell 31(2) at the time of data reading will be described with reference to FIG. 9B.

In the reference cell 21(2), the wiring WSL is set to an L level so that the transistor 22 is brought into an off state (OFF). The current $I_x$ corresponding to the input current is supplied to the wiring XCL. As described above, the current $I_X$ corresponds to a current obtained by multiplying the input data x by the normalized current $I_{xut}$ ($I_X = x I_{xut}$ in the drawing). When the current $I_X$ flows in the transistor 24, the back gate potential of the transistor 24 becomes a potential that makes the threshold voltage of the transistor 24 be $V_{th1} + \Delta V_{th}$. In accordance with this, the potential of the wiring XCL also changes.

In the arithmetic cell 31(2), the wiring WSL is set to an L level so that the transistor 32 is brought into an off state (OFF). In accordance with change in the potential of the wiring XCL caused by the operation of the reference cell 21(2), the back gate potential of the transistor 34 changes, and thus the threshold voltage of the transistor 34 changes to $V_{th2} + \Delta V_{th}$. Accordingly, the current $I_r$ flows between the source and the drain of the transistor 34.

The current $I_X$ supplied to the reference cell 21(2) through the wiring XCL at the time of data reading can be represented by Equation (9). Here, aground potential is supplied to the other of the source and the drain of the transistor 24.

[Formula 9]

$$I_X = I_0 \exp\left(\frac{V_{g1} - V_{th1} - \Delta V_{th}}{\eta k_B T/q}\right) = x I_{Xut} \quad (9)$$

The input data x in Equation (9) can be represented by Equation (10).

[Formula 10]

$$x = \exp\left(\frac{-\Delta V_{th}}{\eta k_B T/q}\right) \quad (10)$$

From Equation (9) and Equation (10), the current $I_X$ can be expressed as the product of the input data x and the normalized current $I_{Xut}$.

The wiring WCL is set to the voltage $V_d$ at the time of data reading so that currents flow in the arithmetic cells 31(2) in each row. Then, the threshold voltage of the transistor 34 in the arithmetic cell 31(2) changes to $V_{th2} + \Delta V_{th}$, so that the current $I_r$ flowing in the transistor 34 in the arithmetic cell 31(2) can be represented by Equation (11). Here, a ground potential is supplied to the other of the source and the drain of the transistor 34.

[Formula 11]

$$I_r = I_0 \exp\left(\frac{V_{g2} - V_{th2} - \Delta V_{th}}{\eta k_B T/q}\right) = wx I_{Wut} \quad (11)$$

From Equation (8) and Equation (10), $I_r$ in Equation (11) can be estimated as a current corresponding to the product of the weight data w and the input data x. Since currents flowing in the arithmetic cells 31(2) in each row can be added, a signal corresponding to the arithmetic result obtained by product-sum operation processing of the weight data w and the input data x can be output when a current flowing through the wiring WCL is output to the outside.

Figure 10A:
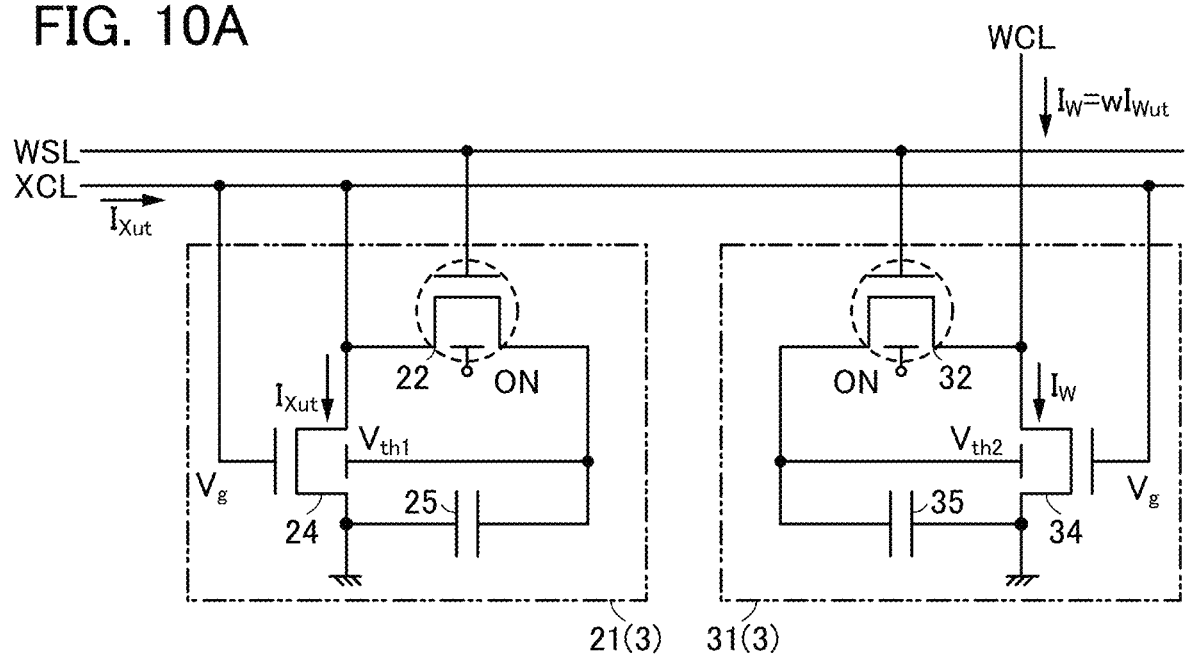
FIG. 10A and FIG. 10B are diagrams illustrating examples of a method for operating a semiconductor device.

The operation of the reference cell 21(3) and the arithmetic cell 31(3) at the time of data writing will be described with reference to FIG. 10A.

The wiring WSL is set to an H level so that the transistor 22 and the transistor 32 are brought into an on state (ON). The current $I_{Xut}$ corresponding to the reference current is supplied to the wiring XCL. Furthermore, the current $I_W$ is supplied to the wiring WCL. As described above, the current $I_W$ corresponds to a current obtained by multiplying the weight data w by the normalized current $I_{Wut}$ ($I_w = w I_{Wut}$ in the drawing).

In the reference cell 21(3), the transistor 22 is brought into an on state. A potential of the retention node to which the back gate of the transistor 24 is electrically connected becomes a potential that makes the threshold voltage of the transistor 24 be $V_{th1}$. The gate potential of the transistor 24 becomes $V_g$. In this manner, the transistor 24 enables the current of the current $I_{Xut}$ to flow between the source and the drain of the transistor 24. Specifically, the threshold voltage of the transistor 24 can be set such that a current flowing between the source and the drain of the transistor 24 becomes $I_{Xut}$ when the gate potential of the transistor 24 is $V_g$.

In the arithmetic cell 31(3), the transistor 32 is brought into an on state. A potential of the retention node to which the back gate of the transistor 34 is electrically connected becomes a potential that makes the threshold voltage of the transistor 24 be $V_{th2}$. The gate potential of the transistor 34 becomes $V_g$. In this manner, a current flowing between the source and the drain of the transistor 34 in the arithmetic cell 31(3) is set to $I_w$. Specifically, the threshold voltage of the transistor 34 is set such that a current flowing between the source and the drain of the transistor 34 becomes $I_w$ when the gate potential of the transistor 34 is $V_g$.

The current $I_{Xut}$ supplied to the reference cell 21(3) through the wiring XCL at the time of data writing can be represented by Equation (12). Here, a ground potential is supplied to the other of the source and the drain of the transistor 24.

[Formula 12]

$$I_{Xut} = I_0 \exp\left(\frac{V_g - V_{th1}}{\eta k_B T/q}\right) \quad (12)$$

The current $I_W$ supplied to the arithmetic cell 31(3) through the wiring WCL at the time of data writing can be represented by Equation (13). Here, a ground potential is supplied to the other of the source and the drain of the transistor 34.

[Formula 13]

$$I_W = I_0 \exp\left(\frac{V_g - V_{th2}}{\eta k_B T/q}\right) = w I_{Wut} \quad (13)$$

As shown in Equation (13), the current $I_w$ can be expressed as the product of the weight data w and the normalized current $I_{Wut}$.

Figure 10B:
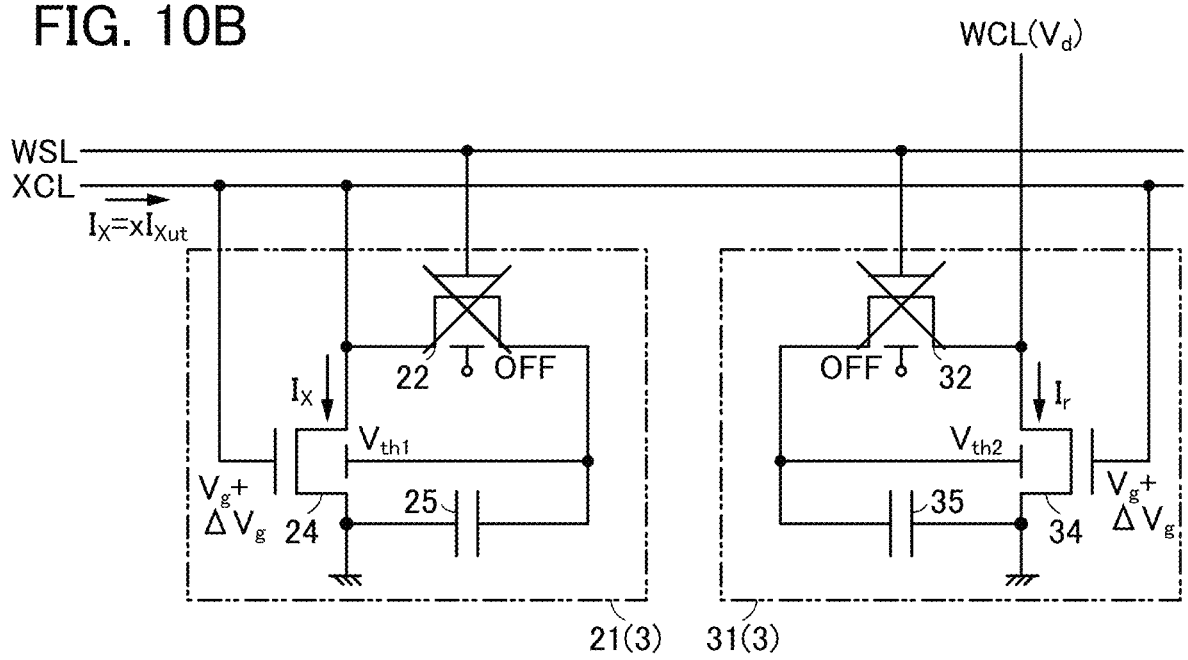

The operation of the reference cell 21(3) and the arithmetic cell 31(3) at the time of data reading will be described with reference to FIG. 10B.

In the reference cell 21(3), the wiring WSL is set to an L level so that the transistor 22 is brought into an off state (OFF). The current $I_x$ corresponding to the input current is supplied to the wiring XCL. As described above, the current $I_W$ corresponds to a current obtained by multiplying the input data x by the normalized current $I_{Xut}$ ($I_x = x I_{xut}$ in the drawing). When the current $I_x$ flows in the transistor 24, the gate potential of the transistor 24 changes to $V_g + \Delta V_g$, and accordingly the potential of the wiring XCL also changes.

In the arithmetic cell 31(3), the wiring WSL is set to an L level so that the transistor 32 is brought into an off state (OFF). In accordance with change in the potential of the wiring XCL caused by the operation of the reference cell 21(3), the gate potential of the transistor 34 also changes to $V_g + \Delta V_g$. When the gate potential of the transistor 34 changes to $V_g + \Delta V_g$, the current $I_r$ flows between the source and the drain of the transistor 34 in the arithmetic cell 31(3).

The current $I_X$ supplied to the reference cell 21(3) through the wiring XCL at the time of data reading can be represented by Equation (14). Here, a ground potential is supplied to the other of the source and the drain of the transistor 24.

[Formula 14]

$$I_X = I_0 \exp\left(\frac{V_g + \Delta V_g - V_{th1}}{\eta k_B T/q}\right) = x I_{Xut} \quad (14)$$

The input data x in Equation (14) can be represented by Equation (15).

[Formula 15]

$$x = \exp\left(\frac{\Delta V_g}{\eta k_B T/q}\right) \quad (15)$$

From Equation (14) and Equation (15), the current $I_X$ can be expressed as the product of the input data x and the normalized current $I_{Xut}$.

The wiring WCL is set to the voltage $V_d$ at the time of data reading so that currents flow in the arithmetic cells 31(3) in each row. Then, the gate potential of the transistor 34 included in each of the arithmetic cells 31(3) changes to $V_g + \Delta V_g$, whereby the current $I_r$ flowing in the transistor 34 in each of the arithmetic cells 31(3) can be represented by Equation (16). Here, a ground potential is supplied to the other of the source and the drain of the transistor 34.

[Formula 16]

$$I_r = I_0 \exp\left(\frac{V_g + \Delta V_g - V_{th2}}{\eta k_B T/q}\right) = wx I_{Wut} \quad (16)$$

From Equation (13) and Equation (15), $I_r$ in Equation (16) can be estimated as a current corresponding to the product of the weight data w and the input data x. Since currents flowing in the arithmetic cells 31(3) in each row can be added, a signal corresponding to the arithmetic result obtained by product-sum operation processing of the weight data w and the input data x can be output when a current flowing through the wiring WCL is output to the outside.

Figure 11A:
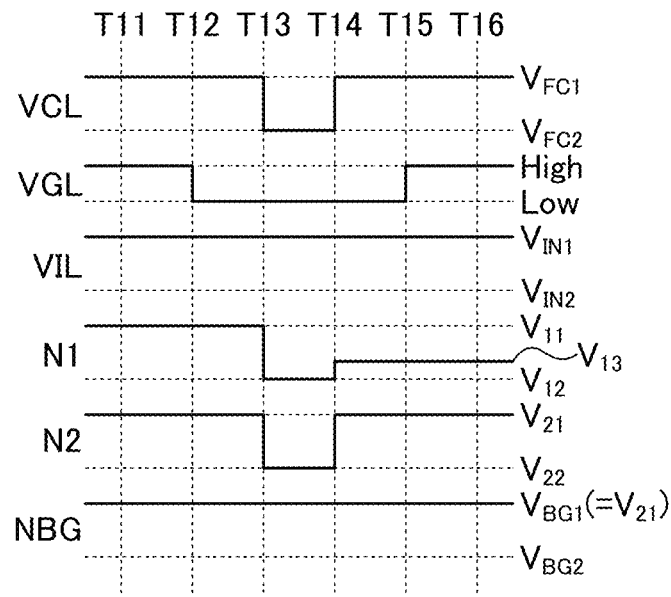
FIG. 11A and FIG. 11B are diagrams showing examples of a method for operating a semiconductor device.

Operation examples of the circuits HC included in the semiconductor device 10C1, the semiconductor device 10C2, and the semiconductor device 10C3 are described below. FIG. 11A is a timing chart showing an operation example of the circuit HC, and shows changes in the potentials of the wiring VCL, the wiring VGL, the wiring VIL, the node N1, the node N2, and the node NBG from Time T11 to Time T16 and around the period. In particular, FIG. 11A shows an operation example of potential writing to the capacitor FEC1. In FIG. 11A, a high-level potential is denoted by "High" and a low-level potential is denoted by "Low".

From Time T11 to Time T12, a potential of an initial state is supplied to each of the wiring VCL, the wiring VGL, and the wiring VIL that are electrically connected to the circuit HC. Specifically, for example, a potential $V_{FC1}$ is supplied to the wiring VCL, a high-level potential is supplied to the wiring VGL, and a potential $V_{IN1}$ is supplied to the wiring VIL. Note that $V_{FC1}$ can be a positive potential, a high-level potential, or a ground potential, for example, and $V_{IN1}$ can be a positive potential, a high-level potential, or a ground potential, for example.

In addition, a potential $V_{11}$ of the node N1 is a potential lower than a potential $V_{21}$ of the node N2. Note that a voltage between the first terminal and the second terminal of the capacitor FEC1 is $V_{11} - V_{12}$; the voltage does not cause polarization in a dielectric that can have ferroelectricity and is contained in the capacitor FEC1. From Time T11 to Time T12, the potential $V_{11}$ of the node N1 may be not a potential lower than the potential $V_{21}$ of the node N2 but a potential equal to or higher than the potential $V_{21}$, as long as polarization is not caused in a dielectric that can have ferroelectricity and is contained in the capacitor FEC1.

Since a high-level potential from the wiring VGL is supplied to the gate of the transistor M2, the transistor M2 is in an on state. Thus, electrical continuity is established between the node N2 and the node NBG, and accordingly a potential $V_{BG1}$ of the node NBG becomes substantially equal to the potential $V_{21}$ of the node N2.

From Time T12 to Time T13, a low-level potential is supplied to the wiring VGL. Thus, the low-level potential from the wiring VGL is supplied to the gate of the transistor M2, so that the transistor M2 is brought into an off state.

Since the transistor M2 is brought into an off state, the node N2 is brought into a floating state.

From Time T13 to Time T14, the potential $V_{FC1}$ supplied by the wiring VCL changes to a potential $V_{FC2}$. The potential $V_{FC2}$ is a potential lower than $V_{FC1}$, and is a potential with which polarization can be caused in a dielectric that can have ferroelectricity and is contained in the capacitor FEC1.

Since the node N2 is in a floating state, when the potential supplied by the wiring VCL changes from $V_{FC1}$ to $V_{FC2}$, the potential of the node N2 also changes in accordance with the voltage change due to capacitive coupling of the capacitor C1. In this operation example, from Time T13 to Time T14, the potential of the node N2 changes from $V_{21}$ to $V_{22}$. Since the potential $V_{FC2}$ is a potential lower than $V_FC1$, the potential $V_{22}$ is a potential lower than $V_{21}$.

Since the node N1 is also in a floating state, when the potential of the node N2 changes from $V_{21}$ to $V_{22}$, the potential of the node N1 also changes in accordance with the voltage change due to capacitive coupling of the capacitor FEC1. Note that a gate capacitance between the gate and the first terminal of the transistor M1 exists between the node N1 and the wiring VIL, and a gate capacitance between the gate and the second terminal of the transistor M1 exists between the node N1 and the node NBG; thus, the voltage change in the node N1 is sometimes smaller than the voltage change $V_{21}$-$V_{22}$ in the node N2. In this case, the potential of the node N1 changes from $V_{11}$ to $V_{12}$.

At this time, a voltage between the first terminal and the second terminal of the capacitor FEC1 becomes $V_{12}$-$V_{22}$, and in the capacitor FEC1, polarization is caused in a dielectric that can have ferroelectricity and is contained in the capacitor FEC1. That is, the operation of writing to the capacitor FEC1 is performed at this timing.

When the potential $V_{IN1}$ supplied by the wiring VIL is a positive potential, a high-level potential, or the like and the potential $V_{IN1}$ is supplied from the wiring VIL to the transistor M1, the potential of the node N1 can be boosted through the gate and the first terminal of the transistor M1 in some cases. This can increase the voltage $V_{12}$-$V_{22}$ between the first terminal and the second terminal of the capacitor FEC1 and sometimes can easily cause polarization in the dielectric that can have ferroelectricity and is contained in the capacitor FEC1.

From Time T14 to Time T15, the potential $V_{FC2}$ supplied by the wiring VCL changes to $V_{FC1}$. That is, the potential supplied by the wiring VCL from Time T14 to Time T15 is equal to the potential supplied by the wiring VCL before Time T13.

Since the node N2 is in a floating state after Time T12, the potential of the node N2 returns from $V_{22}$ to $V_{21}$ when the potential $V_{FC2}$ supplied by the wiring VCL changes to $V_{FC1}$.

When the potential of the node N2 changes from $V_{22}$ to $V_{21}$, the potential $V_{12}$ of the node N1 also changes due to capacitive coupling of the capacitor FEC1. Note that the operation from Time T13 to Time T14 causes polarization in the dielectric that can have ferroelectricity and is contained in the capacitor FEC1; thus, the potential of the node N1 does not return to the original potential $V_{11}$ and becomes a potential higher than the potential $V_{12}$ and lower than the potential $V_{11}$. In this operation example, from Time T14 to Time T15, the potential of the node N1 changes from the potential $V_{12}$ to a potential $V_{13}$.

Note that the potential $V_{13}$ is a potential lower than the potential $V_{21}$ and the potential $V_{IN1}$. Here, a gate-source voltage $V_{13}$-$V_{IN1}$ of the transistor M1 is lower than the threshold voltage of the transistor M1, and the transistor M1 is in an off state.

From Time T15 to Time T16, a high-level potential is supplied to the wiring VGL. Accordingly, the high-level potential from the wiring VGL is supplied to the gate of the transistor M2, so that the transistor M2 is brought into an off state.

By the above operation, potential writing to the capacitor FEC1 can be performed.

Figure 11B:
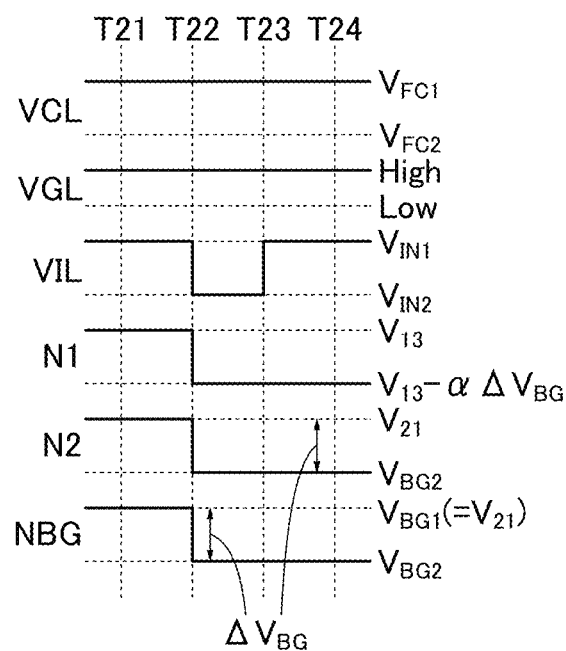

FIG. 11B is a timing chart showing an operation example of the circuit HC, and shows changes in the potentials of the wiring VCL, the wiring VGL, the wiring VIL, the node N1, the node N2, and the node NBG from Time T21 to Time T24 and around the period. In particular, FIG. 11B shows an operation example of potential writing to the back gates of the transistor 22 and the transistor 32. In FIG. 11B, a high-level potential is denoted by "High" and a low-level potential is denoted by "Low".

Time T21 is after Time T16 in the timing chart of FIG. 11A. Thus, from Time T21 to Time T22, the potential $V_{FC1}$ is supplied to the wiring VCL, a high-level potential is supplied to the wiring VGL, and the potential $V_{IN1}$ is supplied to the wiring VIL. In addition, the potential of the node N1 is $V_{13}$, the potential of the node N2 is $V_{21}$, and that of the node NBG is $V_{BG1}$ (=$V_{21}$).

From Time T22 to Time T23, the potential $V_{IN1}$ supplied by the wiring VIL changes to a potential $V_{IN2}$. Note that the potential $V_{IN2}$ is a potential lower than $V_{IN1}$. The potential $V_{IN2}$ can be a negative potential or a low-level potential, for example.

Since the potential $Vmj_2$ is supplied from the wiring VIL to the first terminal of the transistor M1, the gate-source voltage of the transistor M1 is $V_{13}$-$V_{IN2}$. Here, $V_{13}$-$V_{IN2}$ is a voltage higher than the threshold voltage of the transistor M1.

When $V_{13}$-$V_{IN2}$ is set to a voltage higher than the threshold voltage of the transistor M1, the transistor M1 is brought into an on state. In addition, a high-level potential is supplied to the wiring VGL and the transistor M2 is in also an on state, so that the potential from the wiring VIL is supplied to the node N2 through the transistor M1, the node NBG, and the transistor M2.

Specifically, the potentials of the node N2 and the node NBG each decrease from $V_{21}$. In this operation example, from Time T22 to Time T23, the potentials of the node N2 and the node NBG each decrease from $V_{21}$ by a voltage $\Delta V_{BG}$. In addition, the potentials of the node N2 and the node NBG each decease by $\Delta V_{BG}$ to be $V_{BG2}$.

When the potential of the node N2 decreases from $V_{21}$ to $V_{BG2}$, the potential $V_{13}$ of the node N1 also decreases due to capacitive coupling of the capacitor FEC1. Note that in this operation example, from Time T22 to Time T23, the potential of the node N1 is $V_{13}$-$\alpha\Delta V_{BG}$. Note that $\alpha$ is a capacitive coupling coefficient of the capacitor FEC1.

From Time T23 to Time T24, the potential $V_{IN2}$ supplied by the wiring VIL changes to $V_{IN1}$. That is, the potential supplied by the wiring VIL from Time T23 to Time T24 is equal to the potential supplied by the wiring VIL before Time T22.

Since the potential $V_{IN1}$ from the wiring VIL is supplied to the first terminal of the transistor M1, the gate-source voltage of the transistor M1 is $V_{13}$-$\alpha\Delta V_{BG}$-$V_{IN1}$. Note that $V_{13}$-$\alpha\Delta V_{BG}$ is a potential lower than $V_{13}$, and $V_{13}$ is a potential lower than $V_{IN1}$. Since $V_{13}$-$V_{IN1}$ is lower than the threshold voltage of the transistor M1, $V_{13}$-$\alpha\Delta V_{BG}$-$V_{IN1}$ is also lower than the threshold voltage of the transistor M1. Thus, the transistor M1 is in an off state from Time T23 to Time T24.

By the above operation, the voltage $V_{BG2}$ can be written to the node NBG of the circuit HC. In particular, when $V_{IN2}$ is a negative potential, $V_{BG2}$ can be a negative potential, so that VBG2 can be written to the node NBG of the circuit HC as a negative potential. In addition, the transistor M1 can be brought into an off state by setting the gate-source voltage of the transistor M1 to be lower than the threshold voltage thereof, so that the negative potential $V_{BG2}$ of the node NBG can be retained for a long time. Accordingly, the negative potential $V_{BG2}$ can be supplied to the back gates of the transistor 22 and the transistor 32 for along time. Furthermore, according to circumstances, the negative potential retained in the node NBG may be refreshed by a similar operation.

Next, an operation example of the case where the potential of the node NBG is rewritten after Time T24 in the operation example of FIG. 11B will be described.

[Case of Decreasing Potential of Node NBG]

Figure 12A:
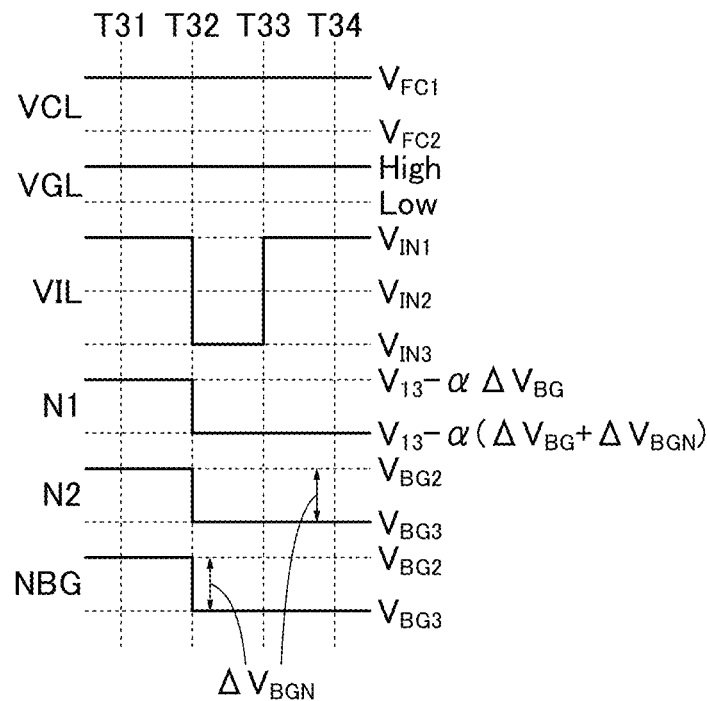
FIG. 12A and FIG. 12B are diagrams showing examples of a method for operating a semiconductor device.

In the case where the potential of the node NBG is decreased, the circuit HC can be operated as in a timing chart shown in FIG. 12A, for example. The timing chart in FIG. 12A shows changes in the potentials of the wiring VCL, the wiring VGL, the wiring VIL, the node N1, the node N2, and the node NBG from Time T31 to Time T34 and around the period. In FIG. 12A, a high-level potential is denoted by "High" and a low-level potential is denoted by "Low".

Time T31 is after Time T24 in the timing chart of FIG. 11B. Thus, from Time T31 to Time T32, the potential $V_{FC1}$ is supplied to the wiring VCL, a high-level potential is supplied to the wiring VGL, and the potential $V_{IN1}$ is supplied to the wiring VIL. In addition, the potential of the node N1 is $V_{13}-\alpha\Delta V_{BG}$, the potential of the node N2 is $V_{BG2}$, and that of the node NBG is $V_{BG2}$.

From Time T32 to Time T33, the potential $V_{IN1}$ supplied by the wiring VIL changes to a potential $V_{IN3}$. Note that the potential $V_{IN3}$ is a potential lower than $V_{IN2}$. The potential $V_{IN3}$ can be a negative potential lower than $V_{IN2}$, or a low-level potential, for example.

Since the potential $V_{IN3}$ is supplied from the wiring VIL to the first terminal of the transistor M1, the gate-source voltage of the transistor M1 is $V_{13}-V_{IN3}$. Since $V_{13}-V_{IN2}$ is a voltage higher than the threshold voltage of the transistor M1 and $V_{IN3}$ is a potential lower than $V_{IN2}$, $V_{13}-V_{IN3}$ is also a voltage higher than the threshold voltage of the transistor M1.

Since $V_{13}-V_{IN3}$ is a voltage higher than the threshold voltage of the transistor M1, the transistor M1 is brought into an on state. In addition, a high-level potential is supplied to the wiring VGL and the transistor M2 is also in an on state, so that the potential from the wiring VIL is supplied to the node N2 through the transistor M1, the node NBG, and the transistor M2.

Specifically, the potentials of the node N2 and the node NBG each decrease from $V_{BG2}$. In this operation example, from Time T32 to Time T33, the potentials of the node N2 and the node NBG each decrease from $V_{BG2}$ by a voltage $\Delta V_{BGN}$. In addition, the potentials of the node N2 and the node NBG each decrease by $\Delta V_{BGN}$ to be a potential $V_{BG3}$.

When the potential of the node N2 decreases from $V_{BG2}$ to $V_{BG3}$, the potential $V_{13}-\alpha\Delta V_{BG}$ of the node N1 also decreases due to capacitive coupling of the capacitor FEC1. Note that in this operation example, from Time T32 to Time T33, the potential of the node N1 is $V_{13}-\alpha(\Delta V_{BG}+\Delta V_{BGN})$.

From Time T33 to Time T34, the potential $V_{IN3}$ supplied by the wiring VIL changes to $V_{IN1}$. That is, the potential supplied by the wiring VCL from Time T33 to Time T34 is equal to the potential supplied by the wiring VIL before Time T32.

Since the potential $V_{IN1}$ from the wiring VIL is supplied to the first terminal of the transistor M1 at this time, the gate-source voltage of the transistor M1 is $V_{13}-\alpha(\Delta V_{BG}+\Delta V_{BGN})-V_{IN1}$. Note that $V_{13}-\alpha(\Delta V_{BG}+\Delta V_{BGN})-V_{IN1}$ is a potential lower than $V_{13}$, and $V_{13}$ is a potential lower than VmNi. Since $V_{13}-V_{IN1}$ is lower than the threshold voltage of the transistor M1, $V_{13}-\alpha(\Delta V_{BG}+\Delta V_{BGN})-V_{IN1}$ is also lower than the threshold voltage of the transistor M1. Thus, the transistor M1 is in an off state from Time T33 to Time T34.

Figure 12B:
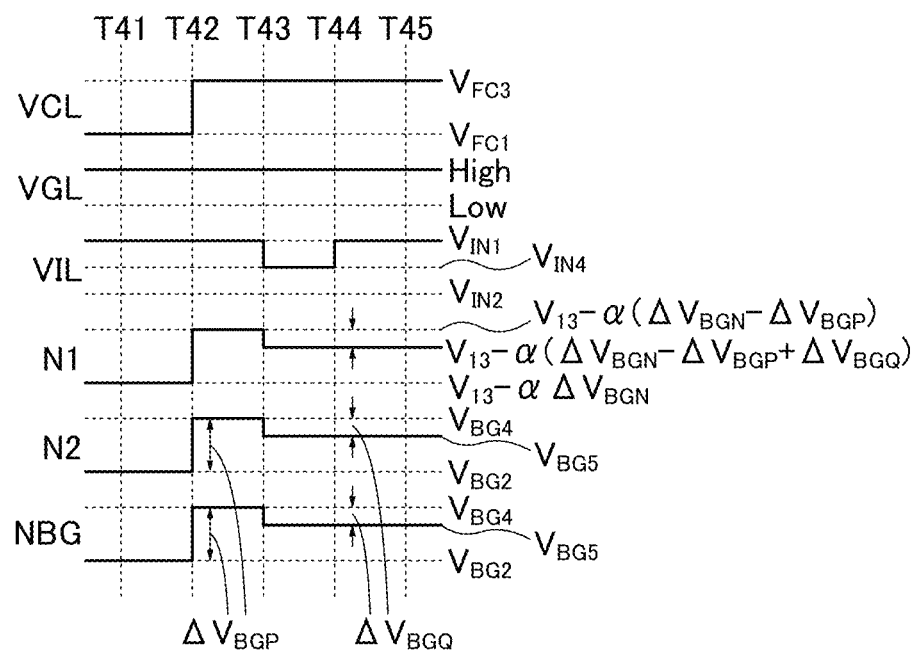

By making the circuit HC perform the operation example of FIG. 12B, a voltage written to the node NBG in the operation example of FIG. 11B can be rewritten to a smaller voltage.

[Case of Increasing Potential of Node NBG]

In the case where the potential of the node NBG is increased, the circuit HC can be operated as in a timing chart shown in FIG. 12B, for example. The timing chart in FIG. 12B shows changes in the potentials of the wiring VCL, the wiring VGL, the wiring VIL, the node N1, the node N2, and the node NBG from Time T41 to Time T45 and around the period. In FIG. 12B, a high-level potential is denoted by "High" and a low-level potential is denoted by "Low".

Time T41 is after Time T24 in the timing chart of FIG. 11B. Thus, from Time T41 to Time T42, the potential $V_{FC1}$ is supplied to the wiring VCL, a high-level potential is supplied to the wiring VGL, and the potential $V_{IN1}$ is supplied to the wiring VIL. In addition, the potential of the node N1 is $V_{13}-\alpha\Delta V_{BG}$, the potential of the node N2 is $V_{BG2}$, and that of the node NBG is $V_{BG2}$.

From Time T42 to Time T43, the potential $V_{FC1}$ supplied by the wiring VCL changes to a potential $V_{FC3}$. Note that the potential $V_{FC3}$ is a potential higher than $V_{FC1}$.

In the case where the node N2 and the node NBG are in a floating state, when the potential supplied by the wiring VCL changes from $V_{FC1}$ to $V_{FC3}$, the potentials of the node N2 and the node NBG also change in accordance with the voltage change due to capacitive coupling of the capacitor C1. In this operation example, from Time T42 to Time T43, the potentials of the node N2 and the node NBG each increase from $V_{BG2}$ by $\Delta V_{BGP}$. In addition, the potentials of the node N2 and the node NBG each decrease by $\Delta V_{BGP}$ to be a potential $V_{BG4}$.

Since the node N1 is also in a floating state, when the potential of the node N2 changes from $V_{BG2}$ to $V_{BG4}$, the potential of the node N1 also changes in accordance with the voltage change due to capacitive coupling of the capacitor FEC1. In this operation example, the potential of the node N1 changes from $V_{13}-\alpha\Delta V_{BG}$ to $V_{13}-\alpha(\Delta V_{BG}-\Delta V_{BGP})$.

Note that a voltage between the node N1 and the node N2 from Time T42 to Time T43 does not cause inversion of polarization in the dielectric that can have ferroelectricity and is contained in the capacitor FEC1. In other words, a voltage supplied by the wiring VCL which changes from the potential $V_{FC1}$ to the potential $V_{FC3}$ is a voltage that does not cause inversion of polarization in the dielectric.

Since the potential $V_{IN1}$ from the wiring VIL is supplied to the first terminal of the transistor M1, the gate-source voltage of the transistor M1 is $V_{13}-(\Delta V_{BG}-\Delta V_{BGP})-V_{IN1}$. Since the gate-source voltage of the transistor M1 from Time T41 to Time T42 is $V_{13}-\alpha\Delta V_{BG}-V_{IN1}$, the gate-source voltage of the transistor M1 increases by $\Delta V_{BGP}$ because of the operation from Time T42 to Time T43 (the change in the potential supplied by the wiring VCL from $V_{FC1}$ to $V_{FC3}$).

Here, $V_{13}-\alpha(\Delta V_{BG}-\Delta V_{BGP})-V_{IN1}$ is lower than the threshold voltage of the transistor M1, and the transistor M1 in an off state.

From Time T43 to Time T44, the potential $V_{IN1}$ supplied by the wiring VIL changes to a potential $V_{IN4}$. Note that the potential $V_{IN4}$ is a potential lower than $V_{IN1}$ and higher than the potential $V_{IN2}$. The potential $V_{IN4}$ can be a negative potential lower than Vi and higher than $V_{IN2}$, or a low-level potential, for example.

Since the potential $V_{IN4}$ from the wiring VIL is supplied to the first terminal of the transistor M1, the gate-source voltage of the transistor M1 is $V_{13}-\alpha(\Delta V_{BG}-\Delta V_{BGP})-V_{IN4}$.

Here, $V_{13}-\alpha(\Delta V_{BG}-\Delta V_{BGP})-V_{IN4}$ is a voltage higher than the threshold voltage of the transistor M1.

When $V_{13}-\alpha(\Delta V_{BG}-\Delta V_{BGP})-V_{IN4}$ is set to a voltage higher than the threshold voltage of the transistor M1, the transistor M1 is brought into an on state. Since a high-level potential is supplied to the wiring VGL and the transistor M2 is also in an on state, the potential from the wiring VIL is supplied to the node N2 through the transistor M1, the node NBG, and the transistor M2.

Specifically, the potentials of the node N2 and the node NBG each decrease from $V_{BG4}$. In this operation example, from Time T43 to Time T44, the potentials of the node N2 and the node NBG each decrease from $V_{BG4}$ by a voltage $\Delta V_{BGQ}$. In addition, the potentials of the node N2 and the node NBG each decrease by $\Delta V_{BGQ}$ to be a potential $V_{BG5}$.

When the potential of the node N2 decreases from $V_{BG4}$ to $V_{BG5}$, the potential $V_{13}-\alpha(\Delta V_{BGN}-\Delta V_{BGP})$ of the node N1 also decreases due to capacitive coupling of the capacitor FEC1. Note that in this operation example, from Time T43 to Time T44, the potential of the node N1 is $V_{13}-\alpha(\Delta V_{BGN}-\Delta V_{BGP}+\Delta V_{BGQ})$.

From Time T44 to Time T45, the potential $V_{IN4}$ supplied by the wiring VIL changes to $V_{IN1}$. That is, the potential supplied by the wiring VIL from Time T44 to Time T45 is equal to the potential supplied by the wiring VIL before Time T43.

Since the potential $V_{IN1}$ from the wiring VIL is supplied to the first terminal of the transistor M1 at this time, the gate-source voltage of the transistor M1 is $V_{13}-\alpha(\Delta V_{BGN}-\Delta V_{BGP}+\Delta V_{BGQ})-V_{IN1}$. Note that $V_{13}-\alpha(\Delta V_{BGN}-\Delta V_{BGP}+\Delta V_{BGQ})-V_{IN1}$ is a potential lower than $V_{13}$, and $V_{13}$ is a potential lower than Vi. Since $V_{13}-V_{IN1}$ is lower than the threshold voltage of the transistor M1, $V_{13}-\alpha(\Delta V_{BGN}-\Delta V_{BGP}+\Delta V_{BGQ})-V_{IN1}$ is also lower than the threshold voltage of the transistor M1. Thus, the transistor M1 is in an off state from Time T44 to Time T45.

By the above operation, the voltage $V_{BG5}$ higher than the voltage $V_{BG2}$ can be written to the node NBG of the circuit HC. Since the transistor M1 is in an off state, the negative potential $V_{BG5}$ of the node NBG can be retained for a long time, whereby the potential $V_{BG5}$ can be supplied to the back gates of the transistor 22 and the transistor 32 for a long time.

By the operation of the timing charts in FIG. 12A and FIG. 12B, the voltage $V_{BG2}$ written to the node NBG of the circuit HC can be rewritten to another potential.

Figure 13:
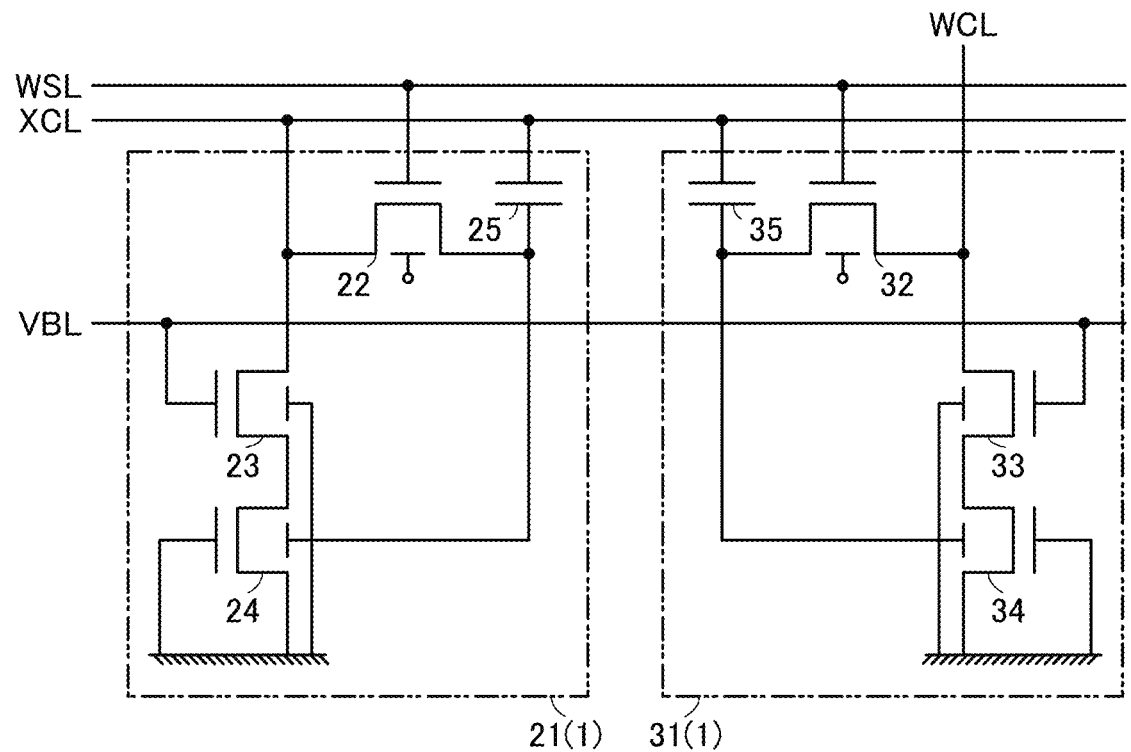
FIG. 13 is a diagram illustrating a structure example of a semiconductor device.
Figure 14:
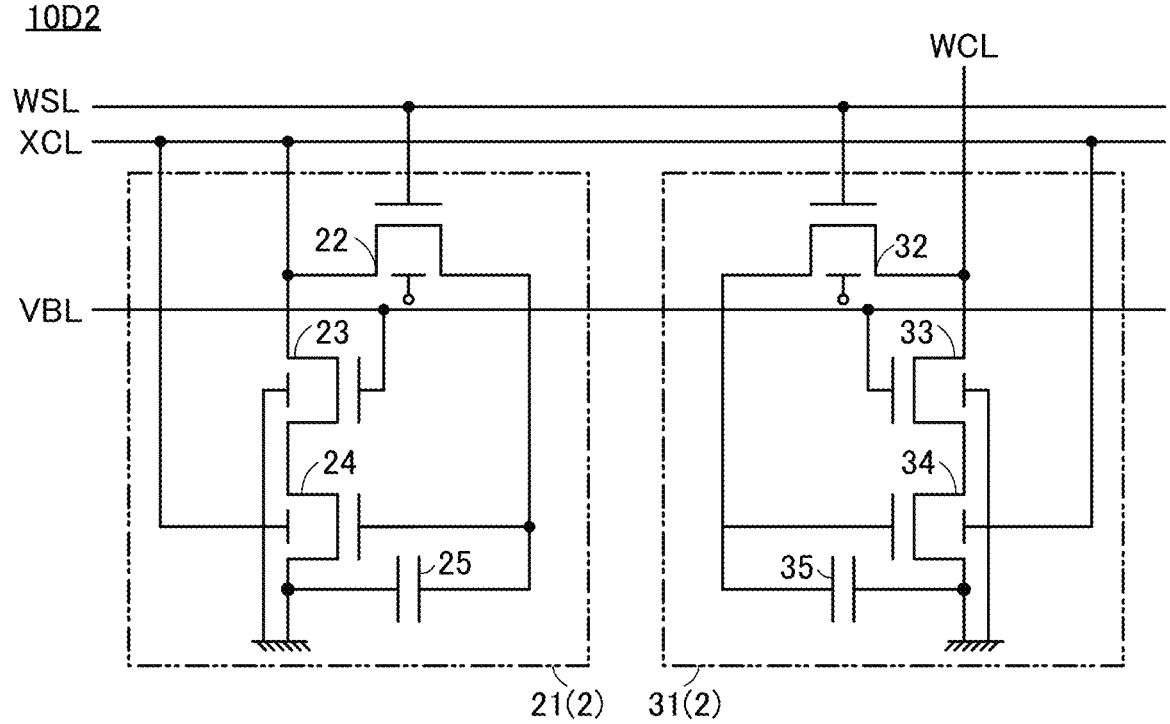
FIG. 14 is a diagram illustrating a structure example of a semiconductor device.
Figure 15:
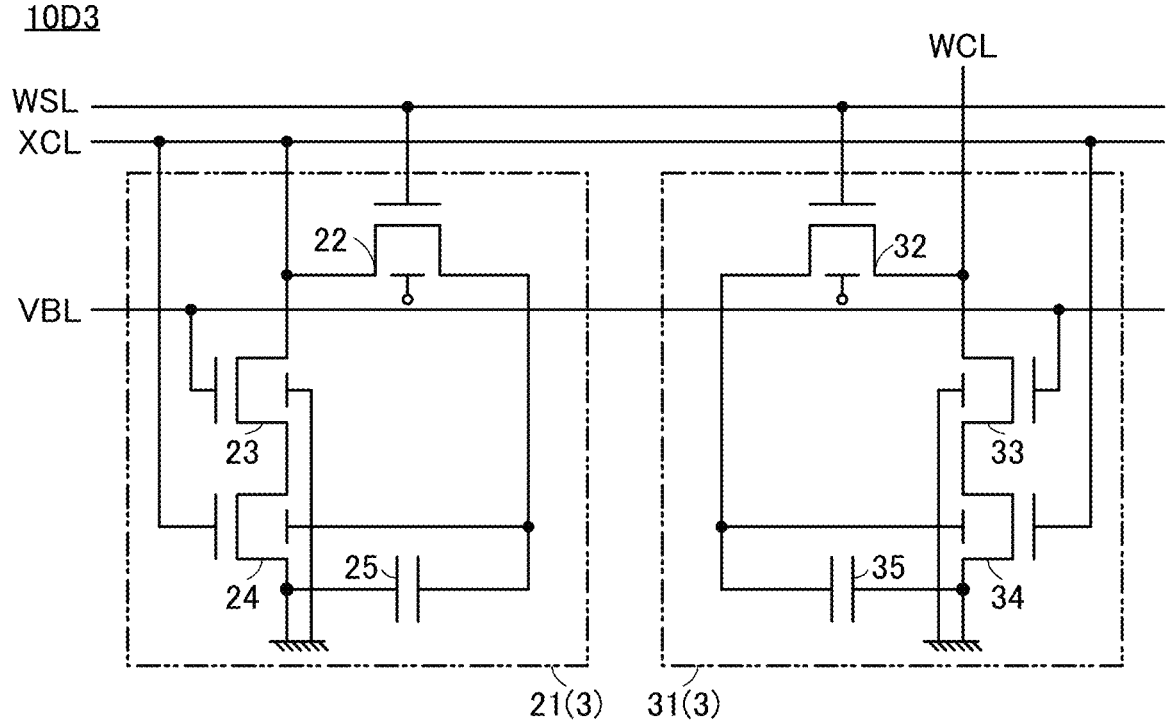
FIG. 15 is a diagram illustrating a structure example of a semiconductor device.

FIG. 13 is a diagram illustrating a semiconductor device 10D1 including the reference cell 21(1) and the arithmetic cell 31(1), FIG. 14 is a diagram illustrating a semiconductor device 10D2 including the reference cell 21(2) and the arithmetic cell 31(2), and FIG. 15 is a diagram illustrating a semiconductor device 10D3 including the reference cell 21(3) and the arithmetic cell 31(3). The reference cell 21(1) of the semiconductor device 10D1, the reference cell 21(2) of the semiconductor device 10D2, and the reference cell 21(3) of the semiconductor device 10D3 each include a transistor 23 in addition to the transistor 22, the transistor 24, and the capacitor 25. The arithmetic cell 31(1) of the semiconductor device 10D1, the arithmetic cell 31(2) of the semiconductor device 10D2, and the arithmetic cell 31(3) of the semiconductor device 10D3 each include a transistor 33 in addition to the transistor 32, the transistor 34, and the capacitor 35.

One of a source and a drain of the transistor 23 is electrically connected to one of the source and the drain of the transistor 22 and the wiring XCL. The other of the source and the drain of the transistor 23 is electrically connected to one of the source and the drain of the transistor 24. One of a source and a drain of the transistor 33 is electrically connected to one of the source and the drain of the transistor 32 and the wiring WCL. The other of the source and the drain of the transistor 33 is electrically connected to one of the source and the drain of the transistor 34. A gate of the transistor 23 and a gate of the transistor 33 are electrically connected to a wiring VBL. A constant potential such as a low power supply potential (e.g., a ground potential) can be supplied to a back gate of the transistor 23 and a back gate of the transistor 33. Note that a structure may be employed in which the back gate potential of the transistor 23 and the back gate potential of the transistor 33 can be changed.

A bias potential is supplied to the wiring VBL. Specifically, a potential for making the transistor 23 and the transistor 33 operate in a saturation region is supplied to the wiring VBL. This enables the transistor 23 and the transistor 33 to have a function of a constant current source and have a function of a bias transistor. Thus, application of a bias potential to the gates of the transistor 23 and the transistor 33 can reduce a change in the potentials of the one of the source and the drain of the transistor 24 and the one of the source and the drain of the transistor 34. This can inhibit the threshold voltage of the transistor 24 and the threshold voltage of the transistor 34 from being changed by DIBL. Thus, the accuracy of data obtained by arithmetic operation can be increased.

Note that this embodiment can be combined with any of the other embodiments in this specification as appropriate.

Embodiment 2

In this embodiment, an example of an arithmetic device, which is a device to which the semiconductor device of one embodiment of the present invention can be applied, will be described. The arithmetic device includes a circuit capable of performing product-sum operation. The arithmetic device is referred to as an arithmetic circuit in some cases.

<Structure Example of Arithmetic Device>

Figure 16:
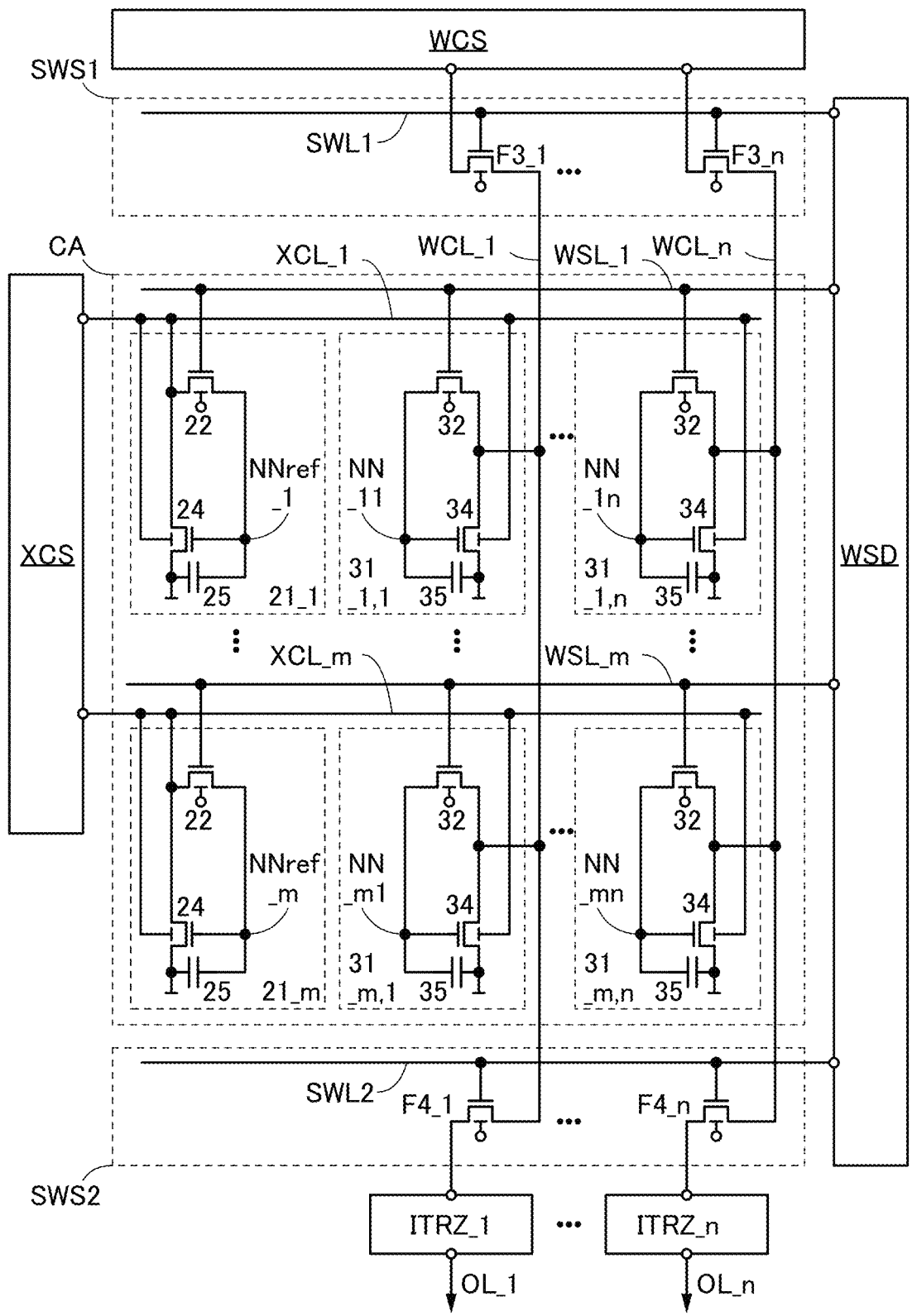
FIG. 16 is a diagram illustrating a structure example of an arithmetic circuit.

FIG. 16 illustrates a structure example of an arithmetic device that performs product-sum operation of first data and second data. An arithmetic device MAC1 illustrated in FIG. 16 is a circuit that performs product-sum operation of the first data (weight data) corresponding to a potential retained in each cell and the input second data (input data), and performs arithmetic operation of an activation function with the use of the product-sum operation result. Note that the first data and the second data can be analog data or multilevel data (discrete data), for example.

The arithmetic device MAC1 includes a circuit WCS, a circuit XCS, a circuit WSD, a circuit SWS1, a circuit SWS2, a cell array CA, and a converter circuit ITRZ_1 to a converter circuit ITRZ_n.

The cell array CA includes the arithmetic cell 31_1,1 to the arithmetic cell 31_m,n and the reference cell 21_1 to the reference cell 21_m. Each of the arithmetic cell 31_1,1 to the arithmetic cell 31_m,n includes, for example, the transistor 32, the transistor 34, and the capacitor like the arithmetic cell 31 described in the above embodiment. Each of the reference cell 21_1 to the reference cell 21_m includes, for example, the transistor 22, the transistor 24, and the capacitor 25 like the reference cell 21 described in the above embodiment. Note that in the following description, "one of a source and a drain" and "the other of the source and the drain" described in Embodiment 1 above are described as "first terminal" and "second terminal", respectively, in some cases. Furthermore, in the following description, "one electrode" and "the other electrode" of a capacitor are described as "first terminal" and "second terminal", respectively, in some cases.

In FIG. 16, a connection portion of a first terminal of the transistor 32, the gate of the transistor 34, and a first terminal of the capacitor 35 in the arithmetic cell 31_1,1 is anode NN_11. Similarly, similar connection portions in the arithmetic cell 31_1,n, the arithmetic cell 31_m,1, and the arithmetic cell 31_m,n in FIG. 16 are a node NN_1n, a node NN_m1, and a node NN_mn. Similarly, similar connection portions in the reference cell 21_1 and the reference cell 21_m in FIG. 16 are a node NN_ref1 and a node NNref_m. Note that the node NN_11 to the node NN_mn and a node NNref_1 to the node NNref_m function as retention nodes in their respective cells.

The circuit SWS1 includes a transistor F3_1 to a transistor F3_n, for example. A first terminal of the transistor F3_1 is electrically connected to a wiring WCL_1, a second terminal of the transistor F3_1 is electrically connected to the circuit WCS, and a gate of the transistor F3_1 is electrically connected to a wiring SWL1. A first terminal of the transistor F3_n is electrically connected to a wiring WCL_n, a second terminal of the transistor F3_n is electrically connected to the circuit WCS, and a gate of the transistor F3_n is electrically connected to the wiring SWL1.

A transistor that can be used as any of the transistors included in the cell array CA can be used as each of the transistor F3_1 to the transistor F3_n, for example. It is particularly preferable to use an OS transistor as each of the transistor F3_1 to the transistor F3_n.

The circuit SWS1 functions as a circuit that establishes or breaks electrical continuity between the circuit WCS and each of the wiring WCL_1 to the wiring WCL_n.

The circuit SWS2 includes a transistor F4_1 to a transistor F4_n, for example. A first terminal of the transistor F4_1 is electrically connected to the wiring WCL_1, a second terminal of the transistor F4_1 is electrically connected to an input terminal of the converter circuit ITRZ_1, and a gate of the transistor F4_1 is electrically connected to a wiring SWL2. A first terminal of the transistor F4_n is electrically connected to the wiring WCL_n, a second terminal of the transistor F4_n is electrically connected to an input terminal of the converter circuit ITRZ_n, and a gate of the transistor F4_n is electrically connected to the wiring SWL2.

A transistor that can be used as any of the transistors included in the cell array CA can be used as each of the transistor F4_1 to the transistor F4_n, for example. It is particularly preferable to use an OS transistor as each of the transistor F4_1 to the transistor F4_n.

The circuit SWS2 has a function of establishing or breaking electrical continuity between the wiring WCL_1 and the converter circuit ITRZ_1 and between the wiring WCL_n and the converter circuit ITRZ_n.

The circuit WCS has a function of supplying data that is to be stored in each cell of the cell array CA.

The circuit XCS is electrically connected to a wiring XCL_1 to a wiring XCL_m. The circuit XCS has a function of supplying a current with the amount corresponding to reference data described later or a current with the amount corresponding to the second data to each of the reference cell 21_1 and the reference cell 21_m included in the cell array CA.

The circuit WSD is electrically connected to a wiring WSL_1 to a wiring WSL_m. The circuit WSD has a function of selecting a row of the cell array CA to which the first data is written, by supplying a predetermined signal to the wiring WSL_1 to the wiring WSL_m at the time of writing the first data to the arithmetic cell 31_1,1 to the arithmetic cell 31_m,n. Specifically, the circuit WSD has a function of generating a signal controlling on and off of the transistor 22 and the transistor 32 and supplying the signal to the gate of the transistor 22 and the gate of the transistor 32. That is, the wiring WSL_1 to the wiring WSL_m function as write word lines.

The circuit WSD is electrically connected to the wiring SWL1 and the wiring SWL2, for example. The circuit WSD has a function of establishing or breaking electrical continuity between the circuit WCS and the cell array CA by supplying a predetermined signal to the wiring SWL1, and a function of establishing or breaking electrical continuity between the cell array CA and each of the converter circuit ITRZ_1 to the converter circuit ITRZ_n by supplying a predetermined signal to the wiring SWL2.

The converter circuit ITRZ_1 to the converter circuit ITRZ_n each include an input terminal and an output terminal, for example. An output terminal of the converter circuit ITRZ_1 is electrically connected to a wiring OL_1, and an output terminal of the converter circuit ITRZ_n is electrically connected to a wiring OL_n, for example.

The converter circuit ITRZ_1 to the converter circuit ITRZ_n each have a function of converting a current into a voltage corresponding to the amount of the current when the current is input to the input terminal and outputting the voltage from the output terminal. The voltage can be, for example, an analog voltage, a digital voltage, or the like. The converter circuit ITRZ_1 to the converter circuit ITRZ_n may each include an arithmetic circuit of a function system. In this case, for example, the arithmetic circuit may perform arithmetic operation of a function with the use of the converted voltage and may output the arithmetic results to the wiring OL_1 to the wiring OL_n.

In particular, in the case of performing arithmetic operation of a hierarchical neural network, a sigmoid function, a tanh function, a softmax function, a ReLU function, a threshold function, or the like can be used as the above-described function.

<<Circuit WCS and circuit XCS>>

Here, specific examples of the circuit WCS and the circuit XCS will be described.

Figure 17A:
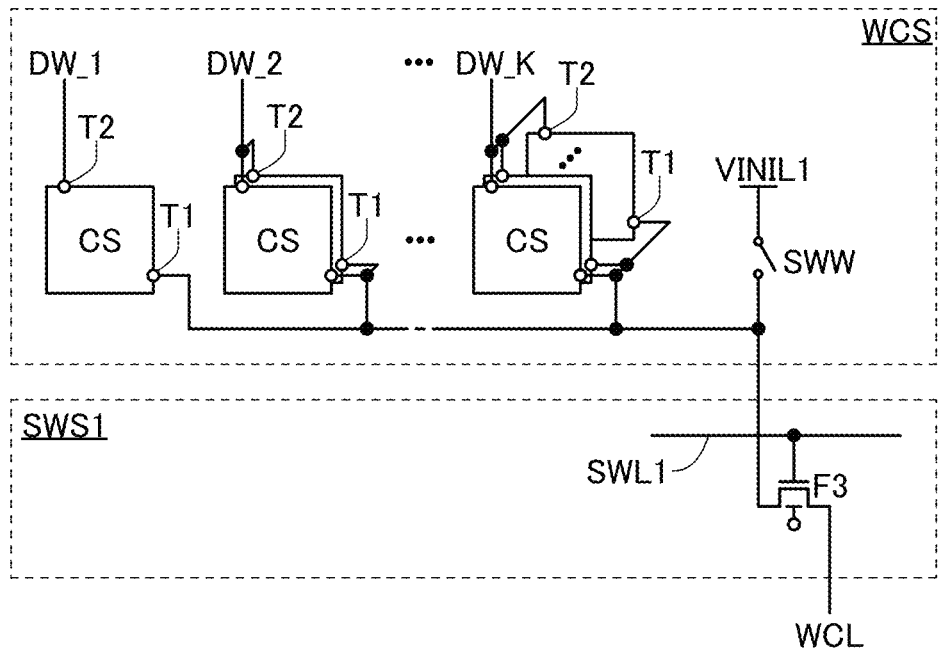
FIG. 17A, FIG. 17B, and FIG. 17C are diagrams illustrating structure examples of an arithmetic circuit.

First, the circuit WCS is described. FIG. 17A is a block diagram illustrating an example of the circuit WCS. In FIG. 17A, to illustrate the electrical connection between the circuit WCS and its peripheral circuits, the circuit SWS1, the transistor F3, the wiring SWL1, and the wiring WCL are also illustrated. The transistor F3 is any one of the transistor F3_1 to the transistor F3_n included in the arithmetic device MAC1 in FIG. 16, and the wiring WCL is any one of the wiring WCL_1 to the wiring WCL_n included in the arithmetic device MAC1 in FIG. 16.

The circuit WCS illustrated in FIG. 17A includes a switch SWW, for example. A first terminal of the switch SWW is electrically connected to the second terminal of the transistor F3, and a second terminal of the switch SWW is electrically connected to a wiring VINIL1. The wiring VINIL1 functions as a wiring supplying an initialization potential to the wiring WCL, and the initialization potential can be set to a ground potential (GND), a low-level potential, a high-level potential, or the like. Note that the switch SWW is in an on state only when the initialization potential is supplied to the wiring WCL; otherwise, the switch is in an off state.

As the switch SWW, an electrical switch such as an analog switch or a transistor can be used, for example. Note that in the case where a transistor is used as the switch SWW, for example, the transistor can be a transistor that can be used as any of the transistors included in the cell array CA, for example. Other than the electrical switch, a mechanical switch may be used.

The circuit WCS in FIG. 17A includes a plurality of current sources CS, for example. Specifically, the circuit WCS has a function of outputting K-bit first data ($2^K$ values) (K is an integer greater than or equal to 1) as a current; in this case, the circuit WCS includes $2_K$–1 current sources CS. Note that the circuit WCS includes one current source CS that outputs information corresponding to the first bit value as a current, two current sources CS that output information corresponding to the second bit value as a current, and the $2^K$–1 current sources CS that output information corresponding to the K-th bit value as a current.

Each of the current sources CS in FIG. 17A includes a terminal T1 and a terminal T2. The terminal T1 of each of the current sources CS is electrically connected to the second terminal of the transistor F3 included in the circuit SWS1. The terminal T2 of the one current source CS is electrically connected to a wiring DW_1, the terminals T2 of the two current sources CS are electrically connected to a wiring DW_2, and the terminals T2 of the $2^K$–1 current sources CS are electrically connected to a wiring DW_K.

The plurality of current sources CS included in the circuit WCS have a function of outputting the same constant current $I_{Wut}$ from the terminals T1. The constant current $I_{Wut}$ corresponds to the normalized current $I_{Wut}$ described in Embodiment 1. In practice, at the manufacturing stage of the arithmetic device MAC1, transistors included in the current sources CS may have different electrical characteristics; this may yield an error. The error in the constant current $I_{Wut}$ output from each of the terminals T1 of the plurality of current sources CS is thus preferably within 10%, further preferably within 5%, still further preferably within 1%. In this embodiment, the description is made on the assumption that there is no error in the constant current $I_{Wut}$ output from each of the terminals T1 of the plurality of current sources CS included in the circuit WCS.

The wiring DW_1 to the wiring DW_K function as wirings transmitting control signals for making the current sources CS, which are electrically connected to the wiring DW_1 to the wiring DW_K, output the constant currents $I_{Wut}$. Specifically, for example, when a high-level potential is supplied to the wiring DW_1, the current source CS electrically connected to the wiring DW_1 supplies $I_{Wut}$ as a constant current to the second terminal of the transistor F3, and when a low-level potential is supplied to the wiring DW_1, the current source CS electrically connected to the wiring DW_1 does not output $I_{Wut}$.

The current flowing from the one current source CS electrically connected to the wiring DW_1 corresponds to the value of the first bit, the current flowing from the two current sources CS electrically connected to the wiring DW_2 corresponds to the value of the second bit, and the current flowing from the K current sources CS electrically connected to the wiring DW_K corresponds to the value of the K-th bit.

FIG. 17A illustrates the circuit WCS with K of an integer greater than or equal to 3; when K is 1, a structure in which the current sources CS electrically connected to the wiring DW_2 to the wiring DW_K are not provided in the circuit WCS in FIG. 17A can be employed. In the case where K is 2, a structure in which the current sources CS electrically connected to the wiring DW_3 to the wiring DW_K are not provided in the circuit WCS in FIG. 17A can be employed.

Next, a specific configuration example of the current source CS is described.

Figure 18A:
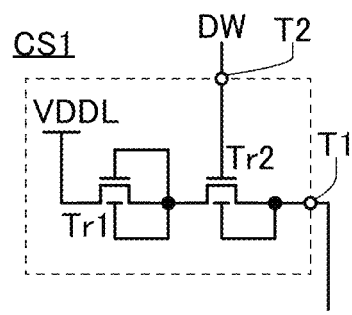
FIG. 18A, FIG. 18B, FIG. 18C, and FIG. 18D are diagrams illustrating structure examples of arithmetic circuits.

A current source CST illustrated in FIG. 18A is a circuit that can be used as the current source CS included in the circuit WCS in FIG. 17A, and the current source CST includes a transistor Tr and a transistor Tr2.

A first terminal of the transistor Tr is electrically connected to a wiring VDDL, and a second terminal of the transistor Tr is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the wiring DW.

The wiring DW is any one of the wiring DW_1 to the wiring DW_K in FIG. 17A.

The wiring VDDL functions as a wiring for supplying a constant potential. The constant potential can be a high-level potential, for example.

When a constant potential supplied from the wiring VDDL is set to a high-level potential, a high-level potential is input to the first terminal of the transistor Tr1. The potential of the second terminal of the transistor Tr is lower than the high-level potential. At this time, the first terminal of the transistor Tr functions as a drain, and the second terminal of the transistor Tr functions as a source. Since the gate of the transistor Tr and the second terminal of the transistor Tr are electrically connected to each other, the gate-source voltage of the transistor Tr is 0 V. In the case where the threshold voltage of the transistor Tr is within an appropriate range, a current in the current range of the subthreshold region (drain current) flows between the first terminal and the second terminal of the transistor Tr1. The amount of the current is preferably smaller than or equal to $1.0 \times 10^{-8}$ A, further preferably smaller than or equal to $1.0 \times 10^{-12}$ A, still further preferably smaller than or equal to $1.0 \times 10^{-15}$ A, for example, in the case where the transistor Tr is an OS transistor. For example, the current is further preferably within a range where the current exponentially increases with respect to the gate-source voltage. That is, the transistor Tr1 functions as a current source for supplying a current within a current range of the transistor Tr1 operating in the subthreshold region. Note that the current corresponds to $I_{Wut}$ described above or $I_{Xut}$ described later.

The transistor Tr2 functions as a switching element. In the case where the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected to each other, a back gate-source voltage becomes 0 V. Thus, in the case where the threshold voltage of the transistor Tr2 is within an appropriate range, the transistor Tr2 is brought into an on state when a high-level potential is input to the gate of the transistor Tr2, and the transistor Tr2 is brought into an off state when a low-level potential is input to the gate of the transistor Tr2. Specifically, when the transistor Tr2 is in an on state, a current within the current range of the subthreshold region flows from the second terminal of the transistor Tr to the terminal T1, and when the transistor Tr2 is in an off state, the current does not flow from the second terminal of the transistor Tr to the terminal T1.

Figure 18B:
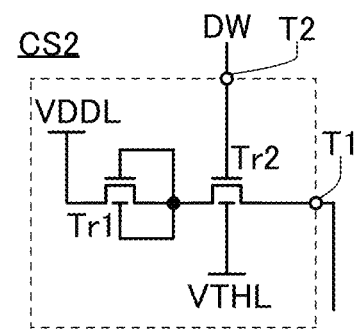

The circuit that can be used as the current source CS included in the circuit WCS in FIG. 17A is not limited to current source CS1 in FIG. 18A. For example, the current source CS1 has a structure in which the back gate of the transistor Tr2 and the second terminal of the transistor Tr2 are electrically connected to each other; however, a structure in which the back gate of the transistor Tr2 is electrically connected to another wiring may be employed. Such a structure example is illustrated in FIG. 18B. In a current source CS2 illustrated in FIG. 18B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. In particular, the off-state current of the transistor Tr2 can be reduced by an increase in the threshold voltage of the transistor Tr2.

Figure 18C:
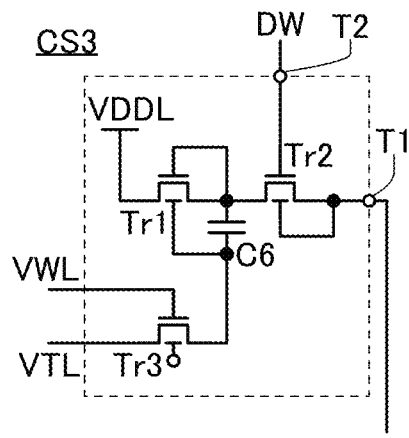

For example, the current source CST has a structure in which the back gate of the transistor Tr and the second terminal of the transistor Tr are electrically connected to each other; however, a structure in which the voltage between the back gate and the second terminal of the transistor Tr2 is retained with a capacitor may be employed. Such a structure example is illustrated in FIG. 18C. A current source CS3 illustrated in FIG. 18C includes a transistor Tr3 and a capacitor C6 in addition to the transistor Tr and the transistor Tr2. The current source CS3 is different from the current source CS1 in that the second terminal of the transistor Tr1 and the back gate of the transistor Tr1 are electrically connected to each other through the capacitor C6, and the back gate of the transistor Tr1 and a first terminal of the transistor Tr3 are electrically connected to each other. In the current source CS3, a second terminal of the transistor Tr3 is electrically connected to a wiring VTL, and a gate of the transistor Tr3 is electrically connected to a wiring VWL. In the current source CS3, a high-level potential is supplied to the wiring VWL to bring the transistor Tr3 into an on state, so that electrical continuity can be established between the wiring VTL and the back gate of the transistor Tr1. In this case, a predetermined potential can be input to the back gate of the transistor Tr from the wiring VTL. When a low-level potential is supplied to the wiring VWL to bring the transistor Tr3 into an off state, a voltage between the second terminal of the transistor Tr1 and the back gate of the transistor Tr can be retained with the capacitor C6. That is, by setting the voltage supplied to the back gate of the transistor Tr from the wiring VTL, the threshold voltage of the transistor Tr can be changed and the threshold voltage of the transistor Tr can be fixed with the transistor Tr3 and the capacitor C6.

Figure 18D:
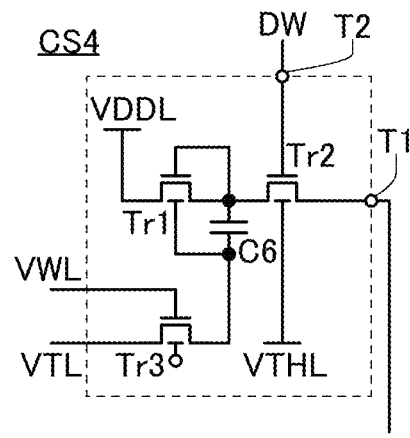

Alternatively, for example, as the circuit that can be used as the current source CS included in the circuit WCS in FIG. 17A, a current source CS4 illustrated in FIG. 18D may be used. The current source CS4 is different from the current source CS3 in FIG. 18C in that the back gate of the transistor Tr2 is electrically connected not to the second terminal of the transistor Tr2 but to the wiring VTHL. That is, the current source CS4 can change the threshold voltage of the transistor Tr2 with the potential supplied from the wiring VTHL, like the current source CS2 in FIG. 18B.

When a high current flows between the first terminal and the second terminal of the transistor Tr in the current source CS4, the on-state current of the transistor Tr2 needs to be increased to supply the current from the terminal T1 to the outside of the current source CS4. In this case, in the current source CS4, a high-level potential is supplied to the wiring VTHL to decrease the threshold voltage of the transistor Tr2 and increase the on-state current of the transistor Tr2, whereby the high current flowing between the first terminal and the second terminal of the transistor Tr can be supplied from the terminal T1 to the outside of the current source CS4.

The use of the current source CS1 to the current source CS4 illustrated in FIG. 18A to FIG. 18D as the current sources CS included in the circuit WCS in FIG. 17A enables the circuit WCS to output a current corresponding to the K-bit first data. The amount of the current can be, for example, that of a current flowing between the first terminal and the second terminal of the transistor 34 in the range where the transistor 34 operates in the subthreshold region.

Figure 17B:
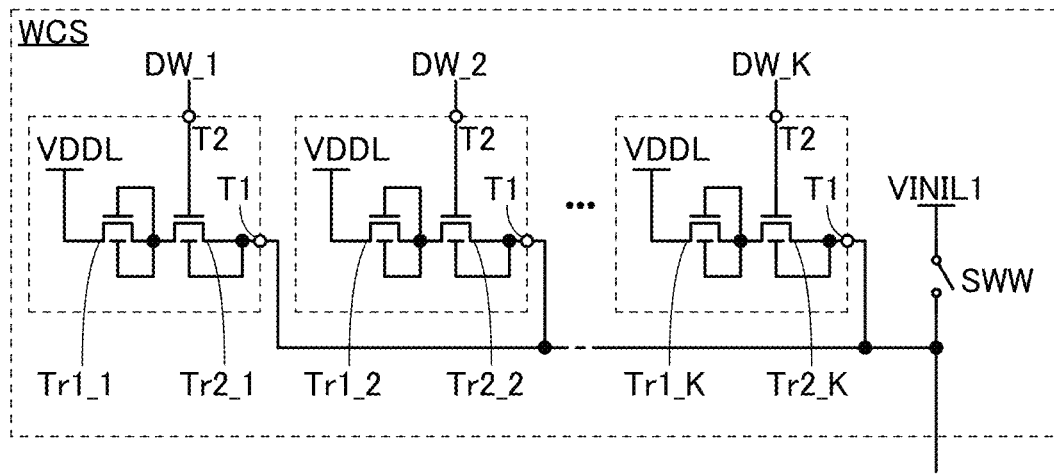

As the circuit WCS in FIG. 17A, the circuit WCS illustrated in FIG. 17B can be used. In the circuit WCS in FIG. 17B, one current source CS in FIG. 18A is connected to each of the wiring DW_1 to the wiring DW_K. When the channel width of a transistor Tr1_1 is w_1, the channel width of a transistor Tr1_2 is w_2, and the channel width of a transistor Tr1_K is w_K, the ratio of the channel widths is w_1:w_2: w_K=1:2:$2^{K-1}$. Since a current flowing between a source and a drain of a transistor that operates in the subthreshold region is proportional to the channel width, the circuit WCS illustrated in FIG. 17B can output a current corresponding to the K-bit first data like the circuit WCS in FIG. 17A.

As the transistor Tr (including the transistor Tr1_1 to a transistor Tr2_K), the transistor Tr2 (including the transistor Tr2_1 to the transistor Tr2_K), and the transistor Tr3, a transistor that can be used as any of the transistors included in the cell array CA can be used, for example. In particular, as the transistor Tr (including the transistor Tr1_1 to the transistor Tr2_K), the transistor Tr2 (including the transistor Tr2_1 to the transistor Tr2_K), and the transistor Tr3, OS transistors are preferably used.

Next, a specific example of the circuit XCS will be described.

Figure 17C:
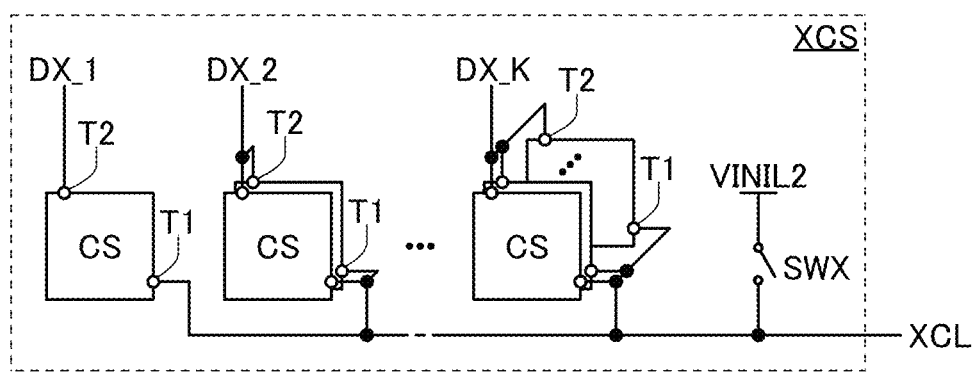

FIG. 17C is a block diagram illustrating an example of the circuit XCS. FIG. 17C also illustrates the wiring XCL to show the electrical connection between the circuit WCS and its peripheral circuits. The wiring XCL is any one of the wiring XCL_1 to the wiring XCL_m included in the arithmetic device MAC1 in FIG. 16.

The circuit XCS illustrated in FIG. 17C includes a switch SWX, for example. A first terminal of the switch SWX is electrically connected to the wiring XCL and a plurality of the current sources CS, and a second terminal of the switch SWX is electrically connected to a wiring VINIL2. The wiring VINIL2 functions as a wiring supplying an initialization potential to the wiring XCL, and the initialization potential can be a ground potential (GND), a low-level potential, a high-level potential, or the like. The initialization potential supplied by the wiring VINIL2 can be the same as the potential supplied by the wiring VINIL1. Note that the switch SWX is in an on state only when the initialization potential is supplied to the wiring XCL; otherwise, the switch is in an off state.

The switch SWX can be, for example, a switch that can be used as the switch SWW.

The circuit XCS in FIG. 17C can have almost the same circuit structure as the circuit WCS in FIG. 17A. Specifically, the circuit XCS has a function of outputting reference data as a current, and a function of outputting L-bit second data ($2^L$ values) (L is an integer greater than or equal to 1) as a current; in this case, the circuit XCS includes $2^L-1$ current sources CS. The circuit XCS includes one current source CS that outputs information corresponding to the first bit value as a current, two current sources CS that output information corresponding to the second bit value as a current, and $2^{L-1}$ current sources CS that output information corresponding to the L-th bit value as a current.

The reference data output from the circuit XCS as a current can be information in which the first bit value is "1" and the second and subsequent bit values are "0", for example.

In FIG. 17C, the terminal T2 of the one current source CS is electrically connected to a wiring DX_1, the terminals T2 of the two current sources CS are electrically connected to a wiring DX_2, and the terminals T2 of the $2^{L-1}$ current sources CS are electrically connected to a wiring DX_K.

The plurality of current sources CS included in the circuit XCS have a function of outputting the same constant currents $I_{Xut}$ from the terminals T1. The wiring DX_1 to the wiring DX_K electrically connected to the current sources CS function as wirings transmitting control signals for making the current sources CS output $I_{Xut}$. In other words, the circuit XCS has a function of supplying a current corresponding to the L-bit data transmitted from the wiring DX_1 to the wiring DX_K to the wiring XCL.

When the transistors included in the current sources CS included in the circuit XCS have different electrical characteristics and this yields errors, the errors in the constant currents $I_{Xut}$ output from the terminals T1 of the plurality of current sources CS are preferably within 10%, further preferably within 5%, still further preferably within 1%. In this embodiment, the description is made on the assumption that there is no error in the constant currents $I_{Xut}$ output from the terminals T1 of the plurality of current sources CS included in the circuit XCS.

As the current source CS of the circuit XCS, any of the current source CS1 to the current source CS4 in FIG. 18A to FIG. 18D can be used as in the case of the current source CS of the circuit WCS. In this case, the wiring DW illustrated in FIG. 18A to FIG. 18D is replaced with the wiring DX. This allows the circuit XCS to supply a current within the current range of the subthreshold region to the wiring XCL as the reference data or the L-bit second data.

The circuit XCS in FIG. 17C can have a circuit structure similar to that of the circuit WCS illustrated in FIG. 17B. In this case, the circuit WCS illustrated in FIG. 17B is replaced with the circuit XCS, the wiring DW_1 is replaced with the wiring DX_1, the wiring DW_2 is replaced with the wiring DX_2, the wiring DW_K is replaced with the wiring DX_K, the switch SWW is replaced with the switch SWX, and the wiring VINIL1 is replaced with the wiring VINIL2.

<<Converter circuit ITRZ_1 to converter circuit ITRZ_n>>

Here, specific examples of a circuit that can be used as the converter circuit ITRZ_1 to the converter circuit ITRZ_n included in the arithmetic device MAC1 in FIG. 16 will be described.

Figure 19A:
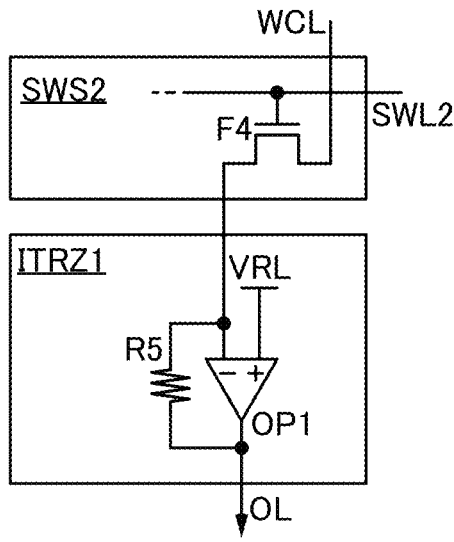
FIG. 19A, FIG. 19B, and FIG. 19C are diagrams illustrating structure examples of arithmetic circuits.

A converter circuit ITRZ1 illustrated in FIG. 19A is an example of a circuit that can be used as the converter circuit ITRZ_1 to the converter circuit ITRZ_n in FIG. 16. FIG. 19A also illustrates the circuit SWS2, the wiring WCL, the wiring SWL2, and the transistor F4 to show the electrical connection between the converter circuit ITRZ1 and its peripheral circuits. The wiring WCL is any one of the wiring WCL_1 to the wiring WCL_n included in the arithmetic device MAC1 in FIG. 16, and the transistor F4 is any one of the transistor F4_1 to the transistor F4_n included in the arithmetic device MAC1 in FIG. 16.

The converter circuit ITRZ1 in FIG. 19A is electrically connected to the wiring WCL through the transistor F4. The converter circuit ITRZ1 is electrically connected to the wiring OL. The converter circuit ITRZ1 has a function of converting a current flowing from the converter circuit ITRZ1 to the wiring WCL, or a current flowing from the wiring WCL to the converter circuit ITRZ1 into an analog voltage and outputting the analog voltage to the wiring OL. That is, the converter circuit ITRZ1 includes a current-voltage converter circuit.

The converter circuit ITRZ1 in FIG. 19A includes a resistor R5 and an operational amplifier OP1, for example.

An inverting input terminal of the operational amplifier OP1 is electrically connected to a first terminal of the resistor R5 and a second terminal of the transistor F4. A non-inverting input terminal of the operational amplifier OP1 is electrically connected to a wiring VRL. An output terminal of the operational amplifier OP1 is electrically connected to a second terminal of the resistor R5 and the wiring OL.

The wiring VRL functions as a wiring supplying a constant potential. The constant potential can be a ground potential (GND) or a low-level potential, for example.

The converter circuit ITRZ1 with the structure in FIG. 19A can convert a current flowing from the wiring WCL to the converter circuit ITRZ1 through the transistor F4 or a current flowing from the converter circuit ITRZ1 to the wiring WCL through the transistor F4 into an analog voltage to output it to the wiring OL.

In particular, by setting the constant potential supplied by the wiring VRL to a ground potential (GND), the inverting input terminal of the operational amplifier OP1 is virtually grounded, and the analog voltage output to the wiring OL can be a voltage with the ground potential (GND) set as a reference.

Figure 19B:
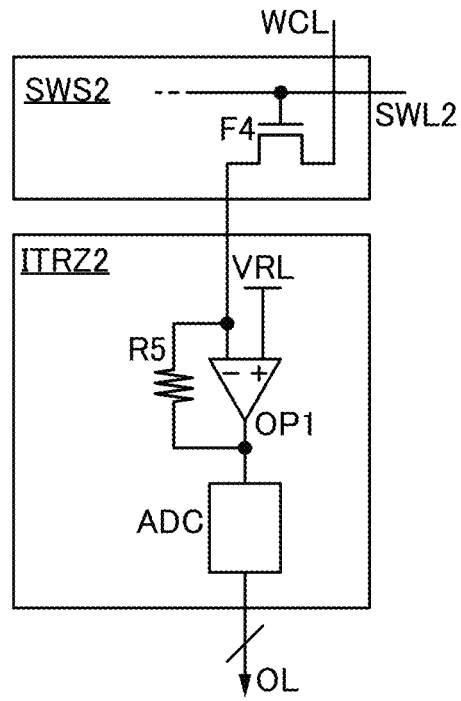

The converter circuit ITRZ1 in FIG. 19A outputs an analog voltage; however, a circuit structure that can be employed for the converter circuit ITRZ_1 to the converter circuit ITRZ_n in FIG. 16 is not limited thereto. For example, the converter circuit ITRZ1 may include an analog-digital converter circuit ADC as illustrated in FIG. 19B. Specifically, in a converter circuit ITRZ2 in FIG. 19B, an input terminal of the analog-digital converter circuit ADC is electrically connected to the output terminal of the operational amplifier OP1 and the second terminal of the resistor R5, and an output terminal of the analog-digital converter circuit ADC is electrically connected to the wiring OL. With such a structure, the converter circuit ITRZ2 in FIG. 19B can output a digital signal to the wiring OL.

Figure 19C:
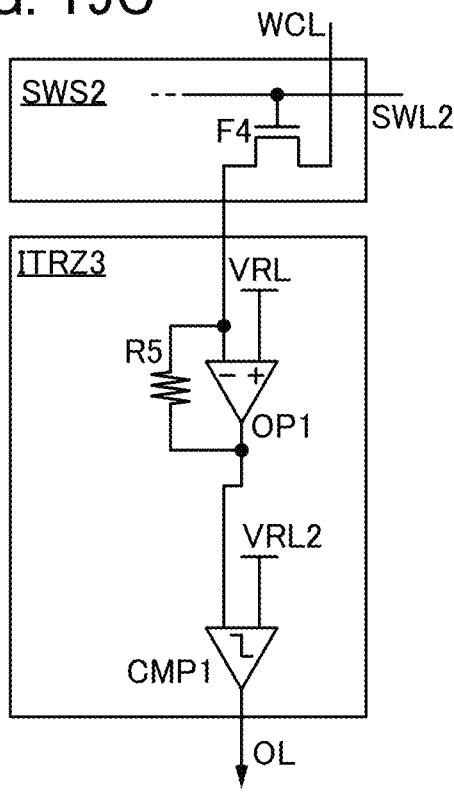

In the case where the digital signal output to the wiring OL is a 1-bit (binary) signal in the converter circuit ITRZ2, the converter circuit ITRZ2 may be replaced with a converter circuit ITRZ3 illustrated in FIG. 19C. The converter circuit ITRZ3 in FIG. 19C has a structure in which a comparator CMP1 is provided in the converter circuit ITRZ1 in FIG. 19A. Specifically, the converter circuit ITRZ3 has a structure in which a first input terminal of the comparator CMP1 is electrically connected to the output terminal of the operational amplifier OP1 and the second terminal of the resistor R5, a second input terminal of the comparator CMP1 is electrically connected to a wiring VRL2, and an output terminal of the comparator CMP1 is electrically connected to the wiring OL. The wiring VRL2 functions as a wiring supplying a potential to be compared with the potential of the first terminal of the comparator CMP1. With such a structure, the converter circuit ITRZ3 in FIG. 19C can output a low-level potential or a high-level potential (a binary digital signal) to the wiring OL in accordance with the magnitude relationship between the voltage converted with the current-voltage converter circuit from a current flowing between the source and the drain of the transistor F4 and the voltage supplied from the wiring VRL2.

The converter circuit ITRZ_1 to the converter circuit ITRZ_n that can be used for the arithmetic device MAC1 in FIG. 16 are not limited to the converter circuit ITRZ1 to the converter circuit ITRZ3 illustrated in FIG. 19A to FIG. 19C. In the case where the arithmetic device MAC1 is used for arithmetic operation of a hierarchical neural network, for example, the converter circuit ITRZ1 to the converter circuit ITRZ3 preferably have arithmetic devices of a function system. As an arithmetic device of a function system, an arithmetic device with a sigmoid function, a tanh function, a softmax function, a ReLU function, a threshold function, or the like can be used.

<Operation Example of Arithmetic Device>

Next, an operation example of the arithmetic device MAC1 will be described.

Figure 20:
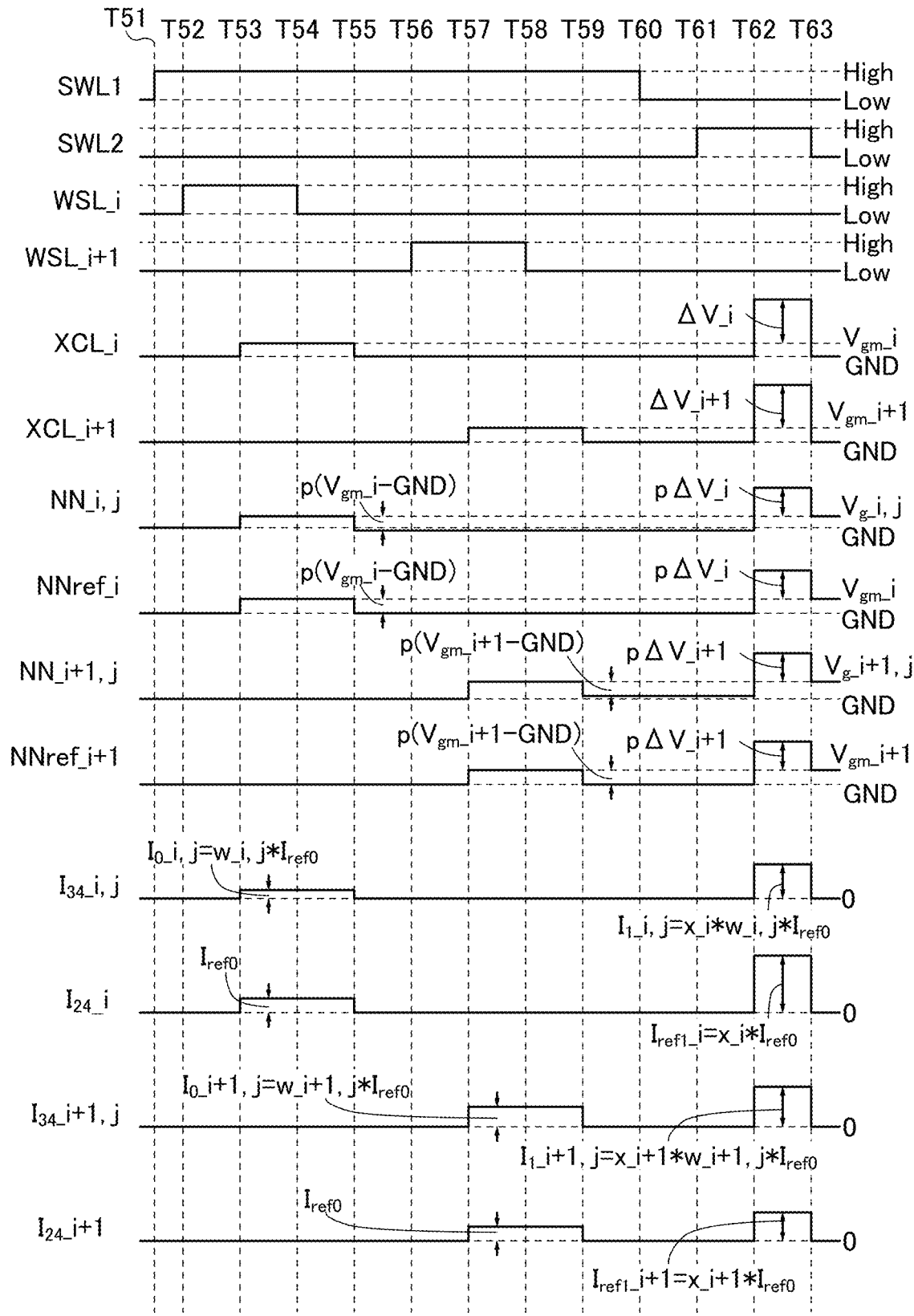
FIG. 20 is a diagram illustrating a structure example of an arithmetic circuit.

FIG. 20 is a timing chart showing an operation example of the arithmetic device MAC1. The timing chart in FIG. 20 shows changes in the potentials of the wiring SWL1, the wiring SWL2, the wiring WSL_i (i is an integer greater than or equal to 1 and less than or equal to m−1), the wiring WSL_i+1, the wiring XCL_i, the wiring XCL_i+1, the node NN_i,j (j is an integer greater than or equal to 1 and less than or equal to n−1), the node NN_i+1,j, the node NNref_i, and the node NNref_i+1 from Time T51 to Time T63 and around the period. The timing chart in FIG. 20 also shows changes in a current $I_{34}\_i,j$ flowing between the first terminal and the second terminal of the transistor 34 included in the arithmetic cell 31_i,j; a current $I_{24}\_i$ flowing between the first terminal and the second terminal of the transistor 24 included in the reference cell 21_i; a current $I_{34}\_i+1,j$ flowing between the first terminal and the second terminal of the transistor 34 included in the arithmetic cell 31_i+1,j; and a current $I_{24}\_i+1$ flowing between the first terminal and the second terminal of the transistor 24 included in the reference cell 21_i+1.

The circuit WCS in FIG. 17A is used as the circuit WCS of the arithmetic device MAC1, and the circuit XCS in FIG. 17C is used as the circuit XCS of the arithmetic device MAC1.

Note that in this operation example, the source potentials of the transistor 24 and the transistor 34 are set to a ground potential GND. Before Time T51, each potential of the node NN_i,j, the node NN_i+1,j, the node NNref_i, and the node NNref_i+1 is the ground potential GND. Specifically, for example, the initialization potential of the wiring VINIL1 in FIG. 17A is set to the ground potential GND, and the switch SWW, the transistor F3, and the transistor 32 included in each of the arithmetic cell 31_i,j and the arithmetic cell 31_i+1,j are brought into an on state, whereby the potentials of the node NN_i,j and the node NN_i+1,j can be set to the ground potential GND. As another example, the initialization potential of the wiring VINIL2 in FIG. 17C is set to the ground potential GND, and the switch SWX and the transistor 22 included in each of the arithmetic cell 31_i,j and the arithmetic cell 31_i+1,j are brought into an on state, whereby the potentials of the node NNref_i,j and the node NNref_i+1,j can be set to the ground potential GND.

<<From Time T51 to Time T52>>

From Time T51 to Time T52, a high-level potential (denoted by High in FIG. 20) is applied to the wiring SWL1, and a low-level potential (denoted by Low in FIG. 20) is applied to the wiring SWL2. Accordingly, the high-level potential is applied to each of the gates of the transistor F3_1 to the transistor F3_n so that each of the transistor F3_1 to the transistor F3_n is brought into an on state, and the low-level potential is applied to each of the gates of the transistor F4_1 to the transistor F4_n so that each of the transistor F4_1 to the transistor F4_n is brought into an off state.

From Time T51 to Time T52, a low-level potential is applied to the wiring WSL_i and the wiring WSL_i+1. Accordingly, in the i-th row of the cell array CA, a low-level potential is applied to the gates of the transistors 32 included in the arithmetic cell 31_i,1 to the arithmetic cell 31_i,n and the gate of the transistor 22 included in the reference cell 21_i so that each of the transistors 32 and the transistor 22 is brought into an off state. In addition, in the i+1-th row of the cell array CA, a low-level potential is applied to the gates of the transistors 32 included in the arithmetic cell 31_i+1,1 to the arithmetic cell 31_i+1,n and the gate of the transistor 22 included in the reference cell 21_i+1 so that each of the transistors 32 and the transistor 22 is brought into an off state.

From Time T51 to Time T52, the ground potential GND is applied to the wiring XCL_i and the wiring XCL_i+1. Specifically, for example, in the case where the wiring XCL illustrated in FIG. 17C is the wiring XCL_i and the wiring XCL_i+1, the initialization potential of the wiring VINIL2 is set to the ground potential GND and the switch SWX is brought into an on state, whereby the potentials of the wiring XCL_i and the wiring XCL_i+1 can be set to the ground potential GND.

From Time T51 to Time T52, in the case where the wiring WCL illustrated in FIG. 17A is each of the wiring WCL_1 to the wiring WCL_K, the first data is not input to the wiring DW_1 to the wiring DW_K. In the case where the wiring XCL illustrated in FIG. 17C is each of the wiring XCL_1 to the wiring XCL_K, the second data is not input to the wiring DX_1 to the wiring DX_K. Here, it is assumed that a low-level potential is input to each of the wiring DW_1 to the wiring DW_K in the circuit WCS in FIG. 17A and a low-level potential is input to each of the wiring DX_1 to the wiring DX_K in the circuit XCS in FIG. 17C.

From Time T51 to Time T52, a current does not flow through a wiring WCL_j, the wiring XCL_i, and the wiring XCL_i+1. Therefore, $I_{34}\_i,j$, $I_{24}\_i$, $I_{34}\_i+1,j$, and $I_{24}\_i+1$ are each 0.

<<From Time T52 to Time T53>>

From Time T52 to Time T53, a high-level potential is applied to the wiring WSL_i.

Accordingly, in the i-th row of the cell array CA, a high-level potential is applied to the gates of the transistors 32 included in the arithmetic cell 31_i,1 to the arithmetic cell 31_i,n and the gate of the transistor 22 included in the reference cell 21_i so that each of the transistors 32 and the transistor 22 is brought into an on state. Furthermore, from Time T52 to Time T53, a low-level potential is applied to the wiring WSL_1 to the wiring WSL_m other than the wiring WSL_i, and in the cell array CA, the transistors 32 included in the arithmetic cell 31_1,1 to the arithmetic cell 31_m,n in the rows other than the i-th row and the transistors 22 included in the reference cell 21_1 to the reference cell 21_m in the rows other than the i-th row are in an off state.

The ground potential GND has been continuously applied to the wiring XCL_1 to the wiring XCL_m since before Time T52.

<<From Time T53 to Time T54>>

From Time T53 to Time T54, a current $I_0\_i,j$ flows as the first data from the circuit WCS to the cell array CA through the transistor F3_j. Specifically, when the wiring WCL illustrated in FIG. 17A is the wiring WCL_j, signals corresponding to the first data are input to the wiring DW_1 to the wiring DW_K, whereby the current $I_0$_i,j flows from the circuit WCS to the second terminal of the transistor F3_*j*. That is, when the value of the K-bit signal input as the first data is α_i,j (α_i,j is an integer greater than or equal to 0 and less than or equal to $2^K$−1), $I_0$_i,j=α_i,j×$I_{Wut}$ is satisfied ("x" is shown as "*" in the drawing).

Since $I_0$_i,j=0 is satisfied when α_i,j is 0, a current does not flow from the circuit WCS to the cell array CA through the transistor F3_*j* in a strict sense, but in this specification and the like, the expression such as "a current of $I_0$_i,j=0 flows" is sometimes used.

From Time T53 to Time T54, electrical continuity is established between the wiring WCL_j and the first terminal of the transistor 32 included in the arithmetic cell 31_*i,j* in the i-th row of the cell array CA, and electrical continuity is not established between the wiring WCL_j and the first terminals of the transistors 32 included in the arithmetic cell 31_1*j* to the arithmetic cell 31_*m,j* in the rows other than the i-th row of the cell array CA; accordingly, the current $I_0$_i,j flows from the wiring WCL_j to the arithmetic cell 31_*i,j*.

Note that the transistor 32 included in the arithmetic cell 31_*i,j* is brought into an on state. In the transistor 34, the gate-source voltage becomes $V_g$_i,j−GND, and the current $I_0$_i,j is set as a current flowing between the first terminal and the second terminal of the transistor 34.

From Time T53 to Time T54, a current $I_{ref0}$ flows as the reference data from the circuit XCS to the wiring XCL_i. Specifically, in the case where the wiring XCL illustrated in FIG. 17C is the wiring XCL_i, a high-level potential is input to the wiring DX_1, a low-level potential is input to the wiring DX_2 to the wiring DX_K, and the current $I_{ref0}$ flows from the circuit XCS to the wiring XCL_i. In other words, $I_{ref0}$=$I_{Xut}$ is satisfied.

From Time T53 to Time T54, since electrical continuity is established between the first terminal of the transistor 22 included in the reference cell 21_*i* and the wiring XCL_i, the current Irem flows from the wiring XCL_i to the reference cell 21_*i*.

As in the arithmetic cell 31_*i,j*, the transistor 22 included in the reference cell 21_*i* is brought into an on state. In the transistor 24, the gate-source voltage becomes $V_{gm}$_i−GND, and the current $I_{ref0}$ is set as a current flowing between the first terminal and the second terminal of the transistor 24.

<<From Time T54 to Time T55>>

From Time T54 to Time T55, a low-level potential is applied to the wiring WSL_i. Accordingly, in the i-th row of the cell array CA, a low-level potential is applied to the gates of the transistors 32 included in the arithmetic cell 31_*i*,1 to the arithmetic cell 31_*i,n* and the gate of the transistor 22 included in the reference cell 21_*i* so that each of the transistors 32 and the transistor 22 is brought into an off state.

When the transistor 32 included in the arithmetic cell 31_*i,j* is brought into an off state, $V_g$_i,j-$V_{gm}$_i, which is a difference between the potential of the gate of the transistor 34 (the node NN_i,j) and the potential of the wiring XCL_i, is retained in the capacitor 35. When the transistor 32 included in the reference cell 21_*i* is brought into an off state, 0, which is a difference between the potential of the gate of the transistor 24 (the node NNref_i) and the potential of the wiring XCL_i, is retained in the capacitor 25.

<<From Time T55 to Time T56>>

From Time T55 to Time T56, GND is applied to the wiring XCL_i. Specifically, for example, in the case where the wiring XCL illustrated in FIG. 17C is the wiring XCL_i, the initialization potential of the wiring VINIL2 is set to the ground potential GND and the switch SWX is brought into an on state, so that the potential of the wiring XCL_i can be set to the ground potential GND.

Thus, the potentials of the node NN_i,1 to the node NN_i,n change due to capacitive coupling of the capacitors 35 included in the arithmetic cell 31_*i*,1 to the arithmetic cell 31_*i,n* in the i-th row, and the potential of the node NNref_i changes due to capacitive coupling of the capacitor 25 included in the reference cell 21_*i*.

The amount of change in the potentials of the node NN_i,1 to the node NN_i,n is a potential obtained by multiplying the amount of change in the potential of the wiring XCL_i by a capacitive coupling coefficient determined by the structures of the arithmetic cell 31_*i*,1 to the arithmetic cell 31_*i,n* included in the cell array CA. The capacitive coupling coefficient is calculated using the capacitance of the capacitor 35, the gate capacitance of the transistor 34, the parasitic capacitance, and the like. When the capacitive coupling coefficient due to the capacitor 35 is p in each of the arithmetic cell 31_*i*,1 to the arithmetic cell 31_*i,n*, the potential of the node NN_i,j in the arithmetic cell 31_*i,j* decreases by p($V_{gm}$_i−GND) from the potential of the period from Time T54 to Time T55.

Similarly, when the potential of the wiring XCL_i changes, the potential of the node NNref_i also changes due to capacitive coupling of the capacitor 25 included in the reference cell 21_*i*. In the case where the capacitive coupling coefficient due to the capacitor 25 is p as in the case of the capacitor 35, the potential of the node NNref_i in the reference cell 21_*i* decreases by p($V_{gm}$_i−GND) from the potential of the period from Time T54 to Time T55. In the timing chart in FIG. 20, p=1, for example. Thus, the potential of the node NNref_i is GND from Time T55 to Time T56.

Accordingly, the potential of the node NN_i,j of the arithmetic cell 31_*i,j* decreases, so that the transistor 34 is brought into an off state; similarly, the potential of the node NNref_i of the reference cell 21_*i* decreases, so that the transistor 24 is also brought into an off state. Therefore, $I_{34}$_i,j and $I_{24}$_i are each 0 from Time T55 to Time T56.

<<From Time T56 to Time T57>>

From Time T56 to Time T57, a high-level potential is applied to the wiring WSL_i+1. Accordingly, in the i+1-th row of the cell array CA, a high-level potential is applied to the gates of the transistors 32 included in the arithmetic cell 31_*i*+1,1 to the arithmetic cell 31_*i*+1,n and the gate of the transistor 22 included in the reference cell 21_*i*+1 so that each of the transistors 32 and the transistor 22 is brought into an on state. Furthermore, from Time T56 to Time T57, a low-level potential is applied to the wiring WSL_1 to the wiring WSL_m other than the wiring WSL_i+1, and in the cell array CA, the transistors 32 included in the arithmetic cell 31_1,1 to the arithmetic cell 31_*m,n* in the rows other than the i+1-th row and the transistors 22 included in the reference cell 21_1 to the reference cell 21_*m* in the rows other than the i+1-th row are in an off state.

The ground potential GND has been continuously applied to the wiring XCL_1 to the wiring XCL_m since before Time T56.

<<From Time T57 to Time T58>>

From Time T57 to Time T58, a current $I_0$_i+1,j flows as the first data from the circuit WCS to the cell array CA through the transistor F3_*j*. Specifically, in the case where the wiring WCL illustrated in FIG. 17A is the wiring WCL_j+1, signals corresponding to the first data are input to the wiring DW_1 to the wiring DW_K, whereby the current $I_0$_i+1,j flows from the wiring WCS to the second terminal of the transistor F3_$j$. That is, when the value of the K-bit signal input as the first data is α_$i$+1,j (α_$i$+1,j is an integer greater than or equal to 0 and less than or equal to $2^K$−1), α_$i$+1,j=α_$i$+1,j×$I_{Wut}$ is satisfied ("x" is shown as "*" in the drawing).

Since $I_0$_$i$+1,j=0 is satisfied when α_$i$+1,j is 0, a current does not flow from the circuit WCS to the cell array CA through the transistor F3_$j$ in a strict sense, but in this specification and the like, the expression such as "a current of $I_0$_$i$+1,j=0 flows" is sometimes used, as in the case of $I_0$_$i$,j=0.

At this time, electrical continuity is established between the wiring WCL_j and the first terminal of the transistor 32 included in the arithmetic cell 31_$i$+1,j in the $i$+1-th row of the cell array CA, and electrical continuity is not established between the wiring WCL_j and the first terminals of the transistors 32 included in the arithmetic cell 31_1$j$ to the arithmetic cell 31_$m$,$j$ in the rows other than the $i$+1-th row of the cell array CA; accordingly, the current $I_0$_$i$+1,j flows from the wiring WCL_j to the arithmetic cell 31_$i$+1,j.

Note that the transistor 32 included in the arithmetic cell 31_$i$+1,j is brought into an on state. In the transistor 34, the gate-source voltage becomes $V_g$_$i$+1,j−GND, and the current $I_0$_$i$+1,j is set as a current flowing between the first terminal and the second terminal of the transistor 34.

From Time T57 to Time T58, the current $I_{ref0}$ flows as the reference data from the circuit XCS to the wiring XCL_$i$+1. Specifically, as in the period from Time T53 to Time T54, when the wiring XCL illustrated in FIG. 17C is the wiring XCL_$i$+1, a high-level potential is input to the wiring DX_1, a low-level potential is input to the wiring DX_2 to the wiring DX_K, and the current remo=$I_{Xut}$ flows from the circuit XCS to the wiring XCL_$i$+1.

From Time T57 to Time T58, since electrical continuity is established between the first terminal of the transistor 22 included in the reference cell 21_$i$+1 and the wiring XCL_$i$+1, the current $I_{ref0}$ flows from the wiring XCL_$i$+1 to the reference cell 21_$i$+1.

As in the arithmetic cell 31_$i$+1,j, the transistor 22 included in the reference cell 21_$i$+1 is brought into an on state. In the transistor 24, the gate-source voltage becomes $V_{gm}$_$i$+1−GND, and the current $I_{ref0}$ is set as a current flowing between the first terminal and the second terminal of the transistor 24.

<<From Time T58 to Time T59>>

From Time T58 to Time T59, a low-level potential is applied to the wiring WSL_$i$+1. Accordingly, in the $i$+1-th row of the cell array CA, a low-level potential is applied to the gates of the transistors 32 included in the arithmetic cell 31_$i$+1,1 to the arithmetic cell 31_$i$+1,n and the gate of the transistor 22 included in the reference cell 21_$i$+1 so that each of the transistors 32 and the transistor 22 is brought into an off state.

When the transistor 32 included in the arithmetic cell 31_$i$+1,j is brought into an off state, $V_g$_$i$+1,j−$V_{gm}$_$i$+1, which is a difference between the potential of the gate of the transistor 34 (the node NN_$i$+1,j) and the potential of the wiring XCL_$i$+1, is retained in the capacitor 35. When the transistor 32 included in the reference cell 21_$i$+1 is brought into an off state, 0, which is a difference between the potential of the gate of the transistor 24 (the node NNref_$i$+1) and the potential of the wiring XCL_$i$+1, is retained in the capacitor 25. In the operation from Time T58 to Time T59, the voltage retained in the capacitor 25 might be a voltage that is not 0 (for example, $V_{ds}$ here) depending on the transistor characteristics and the like of the transistor 22 and the transistor 24. In this case, the potential of the node NNref_$i$+1 is regarded as a potential obtained by adding $V_{ds}$ to the potential of the wiring XCL_$i$+1.

<<From Time T59 to Time T60>>

From Time T59 to Time T60, the ground potential GND is applied to the wiring XCL_$i$+1. Specifically, for example, when the wiring XCL illustrated in FIG. 17C is the wiring XCL_$i$+1, the potential of the wiring XCL_$i$+1 can be set to the ground potential GND by setting the initialization potential of the wiring VINIL2 to the ground potential GND and bringing the switch SWX into an on state.

Thus, the potentials of the node NN_$i$,1 to the node NN_$i$+1,n change due to capacitive coupling of the capacitors 35 included in the arithmetic cell 31_$i$+1,1 to the arithmetic cell 31_$i$+1,n in the $i$+1-th row, and the potential of the node NNref_$i$+1 changes due to capacitive coupling of the capacitor 25 included in the reference cell 21_$i$+1.

The amount of change in the potentials of the node NN_$i$+1,1 to the node NN_$i$+1,n is a potential obtained by multiplying the amount of change in the potential of the wiring XCL_$i$+1 by a capacitive coupling coefficient determined by the structures of the arithmetic cell 31_$i$+1,1 to the arithmetic cell 31_$i$+1,n included in the cell array CA. The capacitive coupling coefficient is calculated using the capacitance of the capacitor 35, the gate capacitance of the transistor 34, the parasitic capacitance, and the like. In the case where the capacitive coupling coefficient due to the capacitor 35 in each of the arithmetic cell 31_$i$+1,1 to the arithmetic cell 31_$i$+1,n is p, which is the same as the capacitive coupling coefficient due to the capacitor 35 in each of the arithmetic cell 31_$i$,1 to the arithmetic cell 31_$i$,n, the potential of the node NN_$i$+1,j in the arithmetic cell 31_$i$+1,j decreases by p($V_{gm}$_$i$+1−GND) from the potential of the period from Time T58 to Time T59.

Similarly, when the potential of the wiring XCL_$i$+1 changes, the potential of the node NNref_$i$+1 also changes due to capacitive coupling of the capacitor 25 included in the reference cell 21_$i$+1. In the case where the capacitive coupling coefficient due to the capacitor 25 is p as in the case of the capacitor 35, the potential of the node NNref_$i$+1 in the reference cell 21_$i$+1 decreases by p($V_{gm}$_$i$+1−GND) from the potential of the period from Time T58 to Time T59. In the timing chart in FIG. 20, p=1, for example. Thus, the potential of the node NNref_$i$+1 is GND from Time T60 to Time T61.

Accordingly, the potential of the nodeNN_$i$+1,j of the arithmetic cell 31_$i$+1 j decreases, so that the transistor 34 is brought into an off state; similarly, the potential of the node NNref_$i$+1 of the reference cell 21_$i$+1 decreases, so that the transistor 24 is also brought into an off state. Therefore, $I_{34}$_$i$+1,j and $I_{24}$_$i$+1 are each 0 in the period Time T59 to Time T60.

<<From Time T60 to Time T61>>

From Time T60 to Time T61, a low-level potential is applied to the wiring SWL1. Accordingly, a low-level potential is applied to each of the gates of the transistor F3_1 to the transistor F3_$n$, whereby each of the transistor F3_1 to the transistor F3_$n$ is brought into an off state.

<<From Time T61 to Time T62>>

From Time T61 to Time T62, a high-level potential is applied to the wiring SWL2.

Accordingly, a high-level potential is applied to each of the gates of the transistor F4_1 to the transistor F4_$n$, whereby each of the transistor F4_1 to the transistor F4_$n$ is brought into an on state.

<<From Time T62 to Time T63>>

From Time T62 to Time T63, a current x_i$I_{ref0}$, which is x_i times as high as the current $I_{ref0}$, flows as the second data from the circuit XCS to the wiring XCL_i. Specifically, for example, when the wiring XCL illustrated in FIG. 17C is the wiring XCL_i, a high-level potential or a low-level potential is input to the wiring DX_1 to the wiring DX_K in accordance with the value of x_i, and the current x_Irefo=x_iIx$_u$t flows from the circuit XCS to the wiring XCL_i. In this operation example, x_i corresponds to the value of the second data. At this time, the potential of the wiring XCL_i changes from 0 to V$_{gm}$_i+ΔV_i.

When the potential of the wiring XCL_i changes, the potentials of the node NN_i,1 to the node NN_i,n also change due to the capacitive coupling of the capacitors 35 included in the arithmetic cell 31_*i*,1 to the arithmetic cell 31_*i*,n in the i-th row of the cell array CA. Thus, the potential of the node NN_i,j in the arithmetic cell 31_*i*,j becomes V$_g$_i,j+pΔV_i.

Similarly, when the potential of the wiring XCL_i changes, the potential of the node NNref_i also changes due to capacitive coupling of the capacitor 25 included in the reference cell 21_*i*. Thus, the potential of the node NNref_i in the reference cell 21_*i* becomes V$_{gm}$_i+pΔV_i.

Thus, a current flowing between the first terminal and the second terminal of the transistor 34 included in the arithmetic cell 31_*i*,j is proportional to the product of first data w_i,j and second data x_i, as described in Embodiment 1.

From Time T62 to Time T63, a current x_i+1I$_{ref0}$, which is x_+1 times as high as the current Irefo, flows as the second data from the circuit XCS to the wiring XCL_i+1. Specifically, for example, in the case where the wiring XCL illustrated in FIG. 17C is the wiring XCL_i+1, a high-level potential or a low-level potential is input to the wiring DX_1 to the wiring DX_K in accordance with the value of x_i+1, and the current x_i+1I$_{ref0}$=x_i+1I$_{Xut}$ flows from the circuit XCS to the wiring XCL_i+1. In this operation example, x_i+1 corresponds to the value of the second data. At this time, the potential of the wiring XCL_i+1 changes from 0 to V$_{gm}$_i+1+ΔV_i+1.

When the potential of the wiring XCL_i+1 changes, the potentials of the node NN_i+1,1 to the node NN_i+1,n also change due to the capacitive coupling of the capacitors 35 included in the arithmetic cell 31_*i*+1,1 to the arithmetic cell 31_*i*+1,n in the i+1-th row of the cell array CA. Thus, the potential of the node NN_i+1,j in the arithmetic cell 31_*i*+1,j becomes V$_g$_i+1,j+pΔV_i+1.

Similarly, when the potential of the wiring XCL_i+1 changes, the potential of the node NNref_i+1 also changes due to capacitive coupling of the capacitor 25 included in the reference cell 21_*i*+1. Thus, the potential of the node NNref_i+1 in the reference cell 21_*i*+1 becomes V$_{gm}$_i+1+pΔV_i+1.

Thus, a current flowing between the first terminal and the second terminal of the transistor 34 included in the arithmetic cell 31_*i*+1,j is proportional to the product of first data w_i+1,j and second data x_i+1, as described in Embodiment 1.

Thus, a current output from the converter circuit ITRZ_j is a current proportional to the sum of products of the weight coefficients w_i,j and w_i+1,j that are the first data and the values x_i and x_i+1 of the signals of the neurons that are the second data.

Thus, even in the case of the arithmetic device MAC1 including the cell array CA with three or more rows and two or more columns, product-sum operation can be performed in the above-described manner. In the arithmetic device MAC1 of such a case, cells in one of the plurality of columns are used for retaining I$_{ref0}$ and xI$_{ref0}$ as a current, whereby product-sum operations, the number of which corresponds to the number of rest of the columns among the plurality of columns, can be executed concurrently. That is, when the number of columns in a memory cell array increases, a semiconductor device that achieves high-speed product-sum operation can be provided. Accordingly, an arithmetic device with high arithmetic processing performance per unit electric power can be provided.

Although this embodiment describes the case where the transistors included in the arithmetic device MAC1 are OS transistors or Si transistors, one embodiment of the present invention is not limited thereto. The transistor included in the arithmetic device MAC1 can be, for example, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, or a transistor including an organic semiconductor in a channel formation region.

Note that this embodiment can be combined with any of the other embodiments described in this specification as appropriate.

Embodiment 3

A hierarchical artificial neural network (hereinafter, referred to as a neural network) will be described in this embodiment. Note that arithmetic operation of a hierarchical neural network can be performed using the semiconductor device and the arithmetic device described in the above embodiments.

In a neural network, the connection strength between synapses can be changed by providing the neural network with existing information. The processing for determining a connection strength by providing a neural network with existing information in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases. A signal is input from a neuron in one layer to a neuron in the subsequent layer, and the connection strength (hereinafter, referred to as a weight coefficient) of the synapse that connects the neurons to each other corresponds to the weight data described in the above embodiment.

Examples of the model of a neural network include a Hopfield type and a hierarchical type. In particular, a neural network with a multilayer structure is called a "deep neural network" (DNN), and machine learning using a deep neural network is called "deep learning" in some cases.

<Hierarchical Neural Network>

Figure 21A:
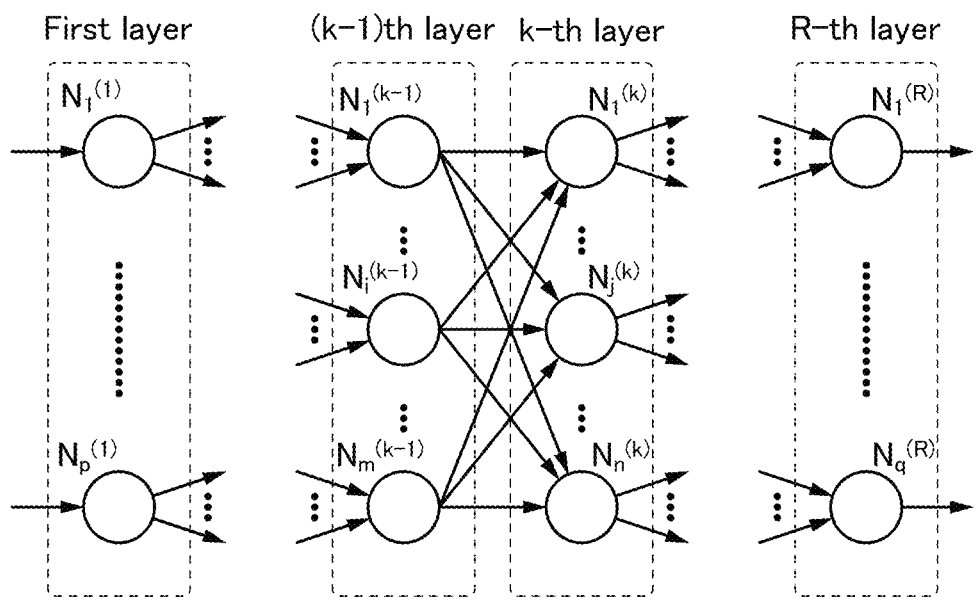
FIG. 21A and FIG. 21B are diagrams illustrating a neural network.

A hierarchical neural network includes one input layer, one or a plurality of intermediate layers (hidden layers), and one output layer, for example, and is configured with a total of at least three layers. A hierarchical neural network 100 illustrated in FIG. 21A is one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 21A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 21A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

FIG. 21A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made focusing on the neuron $N_j^{(k)}$ in the k-th layer.

Figure 21B:
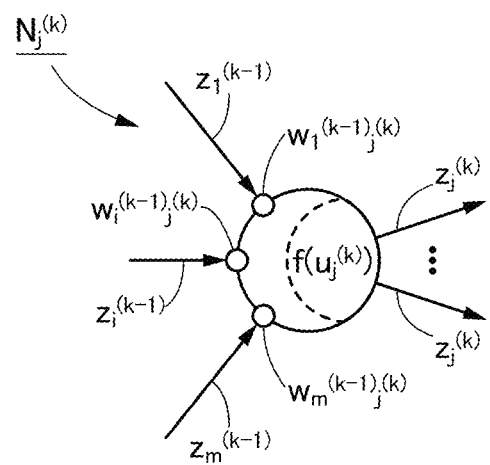

FIG. 21B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter, referred to as a weight coefficient) of the synapse that connects the neurons to each other. In the neural network 100, a signal output from a neuron in one layer is multiplied by the corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_{1\ j}^{(k-1)(k)}$, a signal input to the neuron $N_j^{(k)}$ in the k-th layer can be expressed by Formula (17).

[Formula 17]

$$w_{ij}^{(k-1)(k)} \cdot z_i^{(k-1)} \tag{17}$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the respective weight coefficients ($w_{1\ j}^{(k-1)(k)}$ to $w_{m\ j}^{(k-1)(k)}$). Then, $w_{1\ j}^{(k-1)(k)} \cdot z_1^{(k-1)}$ to $w_{m\ j}^{(k-1)(k)} \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (18).

[Formula 18]

$$u_j^{(k)} = \sum_{i=1}^{m} w_{ij}^{(k-1)(k)} \cdot z_i^{(k-1)} \tag{18}$$

In addition, a bias may be added to the product-sum result of the weight coefficients $w_{1\ j}^{(k-1)(k)}$ to $w_{m\ j}^{(k-1)(k)}$ and the signals $z_1^{(k-1)}$ to $z_m^{(k-1)}$ of the neurons. When the bias is denoted by b, Formula (18) can be rewritten to the following Formula (19).

[Formula 19]

$$u_j^{(k)} = \sum_{i=1}^{m} w_{ij}^{(k-1)(k)} \cdot z_i^{(k-1)} + b \tag{19}$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following Formula (20).

[Formula 20]

$$z_j^{(k)} = f(u_j^{(k)}) \tag{20}$$

A function $f(u_j^{(k)})$ is an activation function in a hierarchical neural network, and a step function, a linear ramp function, a sigmoid function, or the like can be used. Note that the activation function may be the same or different among all neurons. In addition, the neuron activation function may be the same or different between the layers.

Signals output from the neurons in the layers, the weight coefficients w, or the bias b may be an analog value or a digital value. The digital value may be, for example, a binary value or a ternary value. A value having a larger number of bits may be used. In the case of an analog value, for example, a linear ramp function or a sigmoid function is used as the activation function. In the case of a binary digital value, for example, a step function with an output of −1 or 1 or an output of 0 or 1 is used. Alternatively, the neurons in the layers may each output a ternary or higher-level signal; in this case, a step function with an output of three or more values, for example, an output of −1, 0, or 1 or an output of 0, 1, or 2 is used as an activation function. Furthermore, as an activation function for outputting five values, a step function with an output of −2, −1, 0, 1, or 2 may be used, for example. Using a digital value as at least one of the signals output from the neurons in the layers, the weight coefficients w, and the bias b enables a reduction in the circuit scale, a reduction in power consumption, or an increase in operation speed, for example. Furthermore, the use of an analog value as at least one of the signals output from the neurons in the layers, the weight coefficients w, and the bias b can improve the arithmetic accuracy.

The neural network 100 performs operation in which by input of an input signal to the first layer (the input layer), output signals are sequentially generated in the layers from the first layer (the input layer) to the last layer (the output layer) according to Formula (17), Formula (18) (or Formula (19)), and Formula (20) on the basis of the signals input from the previous layers, and the output signals are output to the subsequent layers. The signal output from the last layer (the output layer) corresponds to the calculation results of the neural network 100.

In the case where the arithmetic device MAC1 described in Embodiment 2 is used as the above-described hidden layer, the weight coefficient $w_{s[k-1]}^{(k-1)}{}_{s\_K}^{(k)}{}_{s\_K}^{(k)}$ (s[k-1] is an integer greater than or equal to 1 and less than or equal to m, and s_K is an integer greater than or equal to 1 and less than or equal to n) is used as the first data, a current corresponding to the first data is stored in the cells in the same column sequentially, the output signal $z_{s[k-1]}^{(k-1)}$ from the neuron $N_{s[k-1]}^{(k-1)}$ in the (k-1)-th layer is used as the second data, and a current corresponding to the second data is supplied from the circuit XCS to the wiring XCL in each row, so that the sum of products of the first data and the second data can be obtained from a current Is input to the converter circuit ITRZ. In addition, the value of the activation function is obtained using the value of the sum of products, so that the value of the activation function can be the output signal $z_{s\_K}^{(k)}$ of the neuron $N_{s\_K}^{(k)}$ in the k-th layer.

In the case where the arithmetic device MAC1 described in Embodiment 2 is used as the above-described output layer, the weight coefficient $w_{s[R-1]}^{(R-1)}{}_{s[R]}^{(R)}$ (s[R-1] is an integer greater than or equal to 1, and s[R] is an integer greater than or equal to 1 and less than or equal to q) is used as the first data, the current corresponding to the first data is stored in the cells in the same column sequentially, the output signal $z_{s[R-1]}^{(R-1)}$ from the neuron $N_{s[R-1]}^{(R-1)}$ in the (R-1)-th layer is used as the second data, and the current corresponding to the second data is supplied from the circuit XCS to the wiring XCL in each row, so that the sum of products of the first data and the second data can be obtained from the current Is input to the converter circuit ITRZ. In addition, the value of the activation function is obtained using the value of the sum of products, so that the value of the activation function can be the output signal $z_{s[R]}^{(R)}$ of the neuron $N_{s[R]}^{(R)}$ in the R-th layer.

Note that the input layer described in this embodiment may function as a buffer circuit that outputs an input signal to the second layer.

Note that this embodiment can be combined with any of the other embodiments described in this specification as appropriate.

Embodiment 4

This embodiment describes structure examples of the semiconductor device described in the above embodiments and structure examples of transistors that can be used in the semiconductor device described in the above embodiments.

<Structure Example 1 of Semiconductor Device>

Figure 22A:
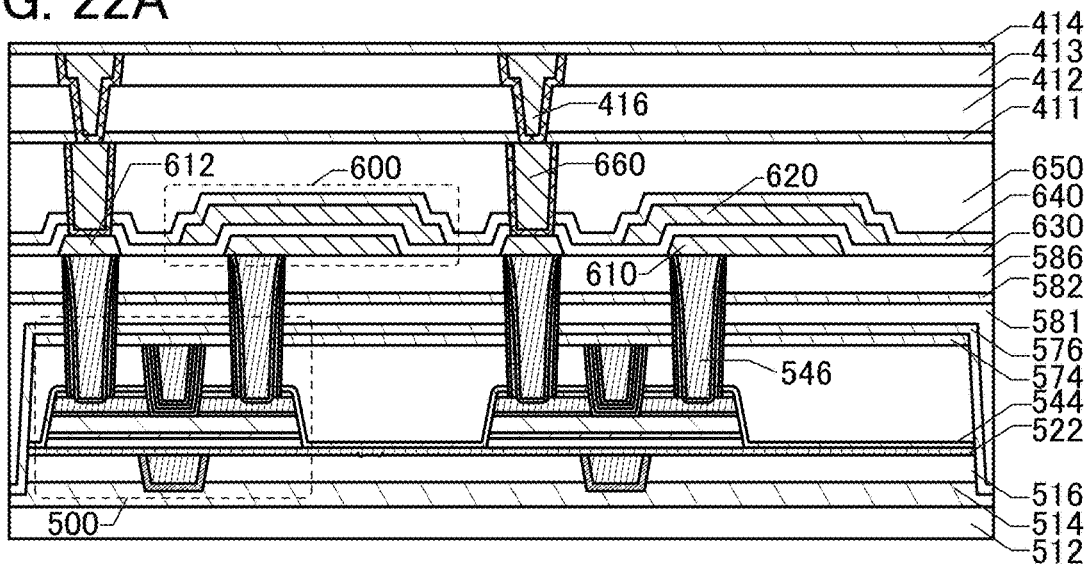
FIG. 22A is a diagram illustrating a structure example of a semiconductor device.
Figure 22B:
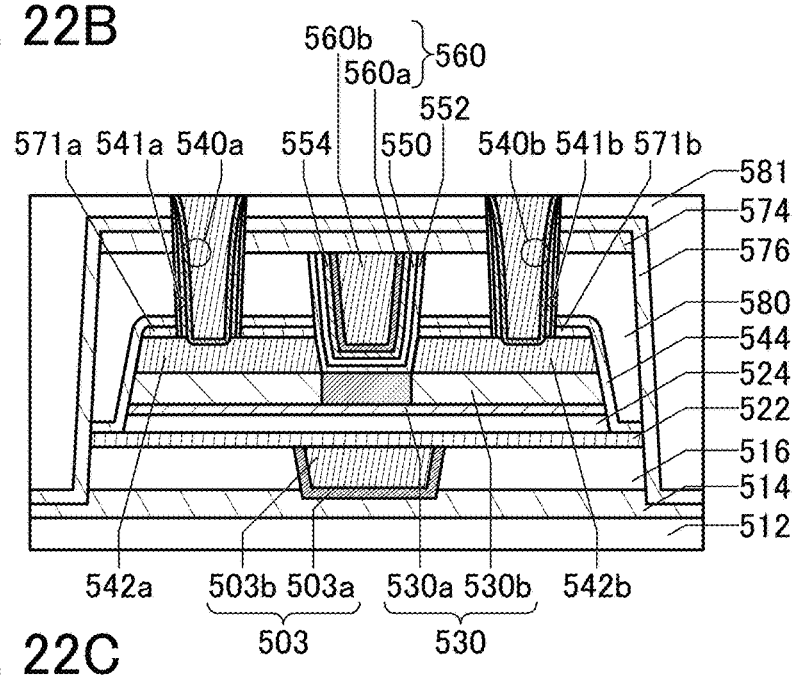
FIG. 22B and FIG. 22C are diagrams illustrating structure examples of transistors.
Figure 22C:
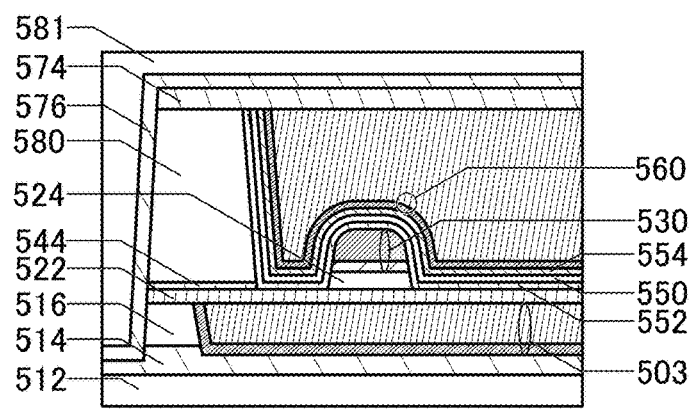

FIG. 22A illustrates the semiconductor device described in the above embodiment as an example, and the semiconductor device includes a transistor 500 and a capacitor 600. FIG. 22B is a cross-sectional view of the transistor 500 in the channel length direction, and FIG. 22C is a cross-sectional view of the transistor 500 in the channel width direction.

The transistor 500 can be an OS transistor. The transistor 500 can be used as, for example, the transistor 22 or the transistor 32 described in the above embodiment. Note that the transistor 500 may be a Si transistor; as the silicon, amorphous silicon (sometimes referred to as hydrogenated amorphous silicon), microcrystalline silicon, polycrystalline silicon, single crystal silicon, or the like can be used, for example.

The transistor 500 is provided above an insulator 512 provided above a substrate (not illustrated), for example. The capacitor 600 is provided above the transistor 500, for example. The capacitor 600 can be used as the capacitor 25 or the like described in the above embodiment.

An insulator 514 and an insulator 516 are provided to be stacked in this order over the insulator 512. A substance having a barrier property against oxygen and hydrogen is preferably used for one of the insulator 512, the insulator 514, and the insulator 516.

For example, for the insulator 514, it is preferable to use a film having a barrier property so as to prevent diffusion of hydrogen and impurities from the region where the substrate is provided, for example, into the region where the transistor 500 is provided.

For the film having a barrier property against hydrogen, silicon nitride formed by a CVD method can be used, for example. Here, hydrogen diffusion into a semiconductor element including an oxide semiconductor, such as the transistor 500, degrades the characteristics of the semiconductor element in some cases. Thus, the use of a film inhibiting hydrogen diffusion as the insulator 514 can inhibit degradation of the characteristics of the semiconductor element such as the transistor 500. Here, the film inhibiting hydrogen diffusion is specifically a film from which a small amount of hydrogen is released.

As the film having a barrier property against hydrogen, a metal oxide such as aluminum oxide, hafnium oxide, or tantalum oxide is preferably used for the insulator 514, for example.

In particular, aluminum oxide has a high blocking effect that inhibits passage of both oxygen and impurities such as hydrogen and moisture which are factors of a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide included in the transistor 500 can be inhibited. Therefore, aluminum oxide is suitably used for a protective film of the transistor 500.

The insulator 512 and the insulator 516 can be formed using, for example, silicon oxide, silicon oxynitride, silicon nitride oxide, silicon nitride, aluminum oxide, aluminum oxynitride, aluminum nitride oxide, or aluminum nitride. Furthermore, when a material with a relatively low permittivity is used for these insulators, parasitic capacitance generated between wirings can be reduced.

In this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

A conductor included in the transistor 500 (e.g., a conductor 503 illustrated in FIG. 22B and FIG. 22C), and the like are embedded in the insulator 512, the insulator 514, and the insulator 516.

The transistor 500 is provided above the insulator 516.

As illustrated in FIG. 22B and FIG. 22C, the transistor 500 includes the insulator 516 over the insulator 514, the conductor 503 (a conductor 503a and a conductor 503b) placed to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is positioned over the insulator 554 and overlaps with part of the oxide 530b, and an insulator 544 placed over the insulator 522, the insulator 524, the oxide 530a, the oxide 530b, the conductor 542a, the conductor 542b, the insulator 571a, and the insulator 571b. Here, as illustrated in FIG. 22B and FIG. 22C, the insulator 552 is in contact with a top surface of the insulator 522, a side surface of the insulator 524, a side surface of the oxide 530a, a side surface and a top surface of the oxide 530b, a side surface of the conductor 542, a side surface of the insulator 571, a side surface of the insulator 544, a side surface of an insulator 580, and a bottom surface of the insulator 550. A top surface of the conductor 560 is placed to be substantially level with an upper portion of the insulator 554, an upper portion of the insulator 550, an upper portion of the insulator 552, and a top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580. Note that in this specification and the like, in some cases, the conductor 542a and the conductor 542b are collectively referred to as a conductor 542, and the insulator 571a and the insulator 571b are collectively referred to as an insulator 571. The same description applies to other components in some cases.

An opening reaching the oxide 530b is provided in the insulator 580 and the insulator 544. The insulator 552, the insulator 550, the insulator 554, and the conductor 560 are placed in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with a side surface of the conductor 560 and a region in contact with a bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can have a single-layer structure of the oxide 530b or a stacked-layer structure of three or more layers. Alternatively, the oxide 530a and the oxide 530b can each have a stacked-layer structure.

The conductor 560 functions as a gate electrode and the conductor 503 functions as a back gate electrode. Note that the conductor 503 may function as the gate electrode and the conductor 560 may function the back gate electrode. The insulator 552, the insulator 550, and the insulator 554 function as a gate insulator for the conductor 560, and the insulator 522 and the insulator 524 function as a gate insulator for the conductor 503. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 which overlaps with the conductor 560 functions as a channel formation region.

Figure 23A:
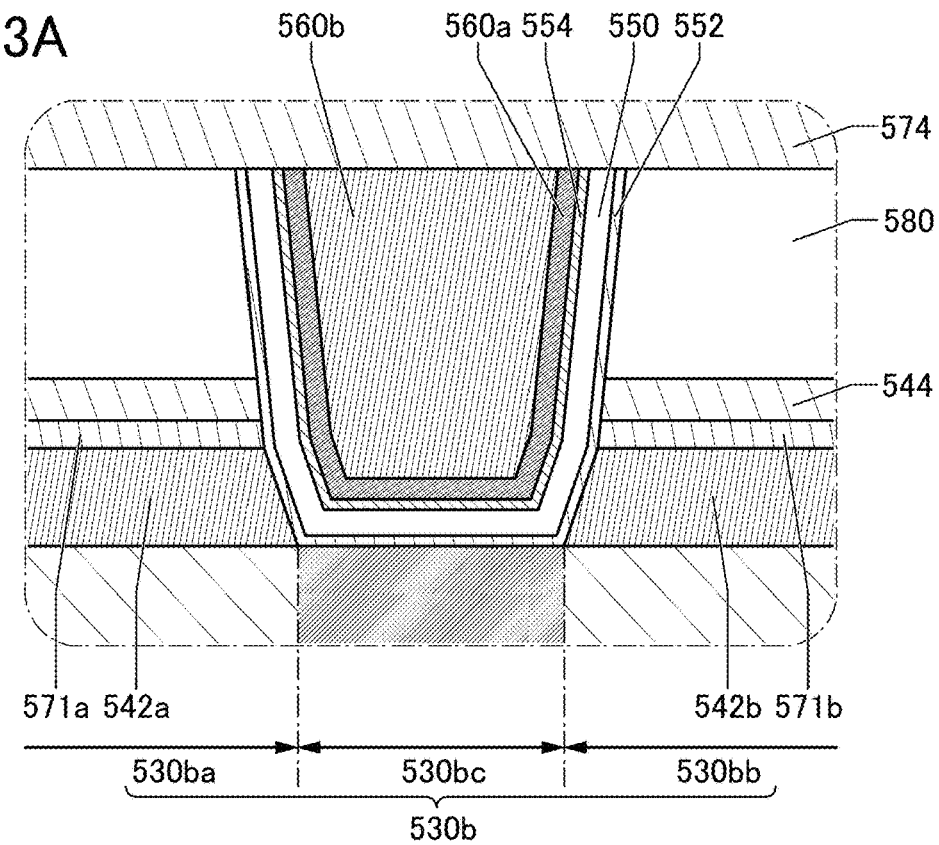
FIG. 23A and FIG. 23B are diagrams illustrating structure examples of a transistor.

FIG. 23A is an enlarged view of the vicinity of the channel formation region in FIG. 22B. Supply of oxygen to the oxide 530b forms the channel formation region in a region between the conductor 542a and the conductor 542b. As illustrated in FIG. 23A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_O H$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and a current flows through the transistor). Thus, impurities, oxygen vacancies, and $V_O H$ are preferably reduced as much as possible in the region of the oxide semiconductor where a channel is formed.

The region 530ba and the region 530bb functioning as the source region and the drain region are each a low-resistance region with an increased carrier concentration because it includes a large amount of oxygen vacancies ($V_O$) or has a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530*bc* in some cases. The amount of oxygen vacancies in the junction region is smaller than or substantially equal to the amounts of oxygen vacancies in the region 530*ba* and the region 530*bb* and larger than or substantially equal to the amount of oxygen vacancies in the region 530*bc* in some cases.

Although FIG. 23A illustrates an example in which the region 530*ba*, the region 530*bb*, and the region 530*bc* are formed in the oxide 530*b*, the present invention is not limited thereto. For example, the above regions may be formed not only in the oxide 530*b* but also in the oxide 530*a*.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530*a* and the oxide 530*b*) including the channel formation region.

The metal oxide functioning as a semiconductor preferably has a band gap of 2 eV or more, further preferably 2.5 eV or more. With the use of such a metal oxide having a large band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530*b* is preferably greater than the atomic ratio of In to the element M in the metal oxide used as the oxide 530*a*.

The oxide 530*a* is placed under the oxide 530*b* in the above manner, whereby impurities and oxygen can be inhibited from diffusing into the oxide 530*b* from components formed below the oxide 530*a*.

When the oxide 530*a* and the oxide 530*b* contain a common element (as the main component) besides oxygen, the density of defect states at an interface between the oxide 530*a* and the oxide 530*b* can be made low. Since the density of defect states at the interface between the oxide 530*a* and the oxide 530*b* can be made low, the influence of interface scattering on carrier conduction is small, and a high on-state current can be obtained.

The oxide 530*b* preferably has crystallinity. It is particularly preferable to use a CAAC-OS (c-axis aligned crystalline oxide semiconductor) as the oxide 530*b*.

The CAAC-OS is a metal oxide having a dense structure with high crystallinity and a small amount of impurities or defects (e.g., oxygen vacancies ($V_O$)). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and a current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation in the amount of oxygen supplied to the source region or the drain region in the substrate plane leads to a variation in characteristics of the semiconductor device including the transistor.

Therefore, the region 530*bc* functioning as the channel formation region in the oxide semiconductor is preferably an i-type or substantially i-type region with a reduced carrier concentration, whereas the region 530*ba* and the region 530*bb* functioning as the source region and the drain region are preferably n-type regions with high carrier concentrations. That is, it is preferable that oxygen vacancies and $V_OH$ in the region 530*bc* of the oxide semiconductor be reduced and the region 530*ba* and the region 530*bb* not be supplied with an excess amount of oxygen.

Thus, in this embodiment, microwave treatment is performed in an oxygen-containing atmosphere in a state where the conductor 542*a* and the conductor 542*b* are provided over the oxide 530*b* so that oxygen vacancies and $V_OH$ in the region 530*bc* can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530*bc* can also be irradiated with the high-frequency wave such as a microwave or RF. By the effect of the plasma, a microwave, or the like, $V_OH$ in the region 530*bc* can be cut; thus, hydrogen H can be removed from the region 530bc and an oxygen vacancy $V_O$ can be filled with oxygen. That is, the reaction "$V_OH \rightarrow H + V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in $V_OH$ and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is placed to be in contact with the side surface of the conductor 542 and a surface of the region 530bc, thereby preventing oxygen more than necessary from being supplied to the region 530bc and preventing the side surface of the conductor 542 from being oxidized. Furthermore, the side surface of the conductor 542 can be inhibited from being oxidized when an insulating film to be the insulator 550 is formed.

The oxygen supplied into the region 530bc has any of a variety of forms such as an oxygen atom, an oxygen molecule, and an oxygen radical (an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the n-type electrical characteristics can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 22C, a curved surface may be provided between a side surface of the oxide 530b and the top surface of the oxide 530b in a cross-sectional view of the transistor 500 in the channel width direction. In other words, an end portion of the side surface and an end portion of the top surface may be curved (hereinafter referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

In the case where the metal oxide is deposited by a sputtering method, the above atomic ratio is not limited to the atomic ratio of the deposited metal oxide and may be the atomic ratio of a sputtering target used for depositing the metal oxide.

As illustrated in FIG. 22B or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be manufactured.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be formed by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ $\Omega$cm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1 \times 10^{10}$ $\Omega$cm and lower than or equal to $1 \times 10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed by the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a nor the conductor 542b. As illustrated in FIG. 22C, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as the gate electrode and the electric field of the conductor 503 functioning as the back gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 22C, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits, for example, release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Furthermore, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with a surface of the oxide 530 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O+O \rightarrow$ null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and a top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above can be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 22C, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_O H$ formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 22B, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or in field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In this case, at least part of the insulator 552 includes a region having the above-described thickness. The thickness of the insulator 552 is preferably smaller than that of the insulator 550. In this case, at least part of the insulator 552 includes a region having a thickness smaller than that of the insulator 550.

To form the insulator 552 having a small thickness as described above, an ALD method is preferably used for deposition. Examples of an ALD method include a thermal ALD method, in which a precursor and a reactant react with each other only by thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors used in an ALD method contain carbon or the like. Thus, a film formed by an ALD method might contain impurities such as carbon in a larger amount than a film formed by another deposition method. Note that impurities can be quantified by secondary ion mass spectrometry (SIMS) or X-ray photoelectron spectroscopy (XPS).

The insulator 550 functions as part of the gate insulator. The insulator 550 is preferably placed in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15 nm or less than or equal to 20 nm. Note that the above-described lower limits and upper limits can be combined with each other. In this case, at least part of the insulator 550 includes a region having the above-described thickness.

Although FIG. 22B, FIG. 22C, and the like illustrate a single-layer structure of the insulator 550, the present invention is not limited to this structure, and a stacked-layer structure of two or more layers may be employed. For example, as illustrated in FIG. 23B, the insulator 550 may have a stacked-layer structure including two layers of an insulator 550a and an insulator 550b over the insulator 550a.

Figure 23B:
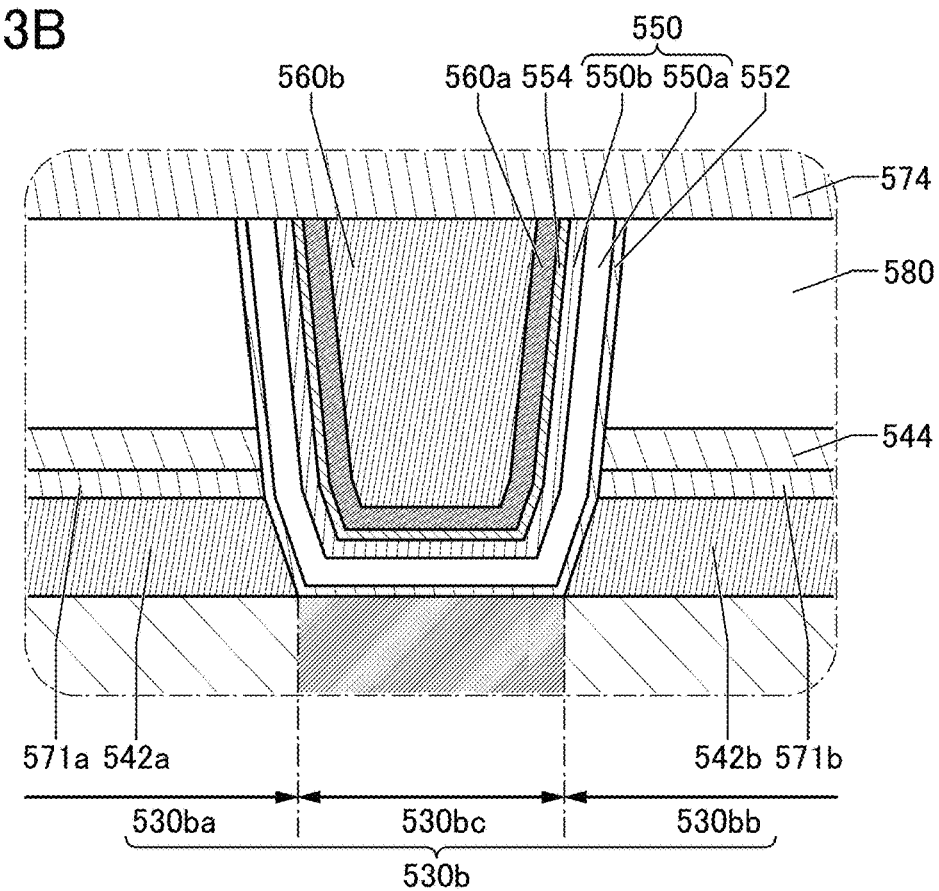

In the case where the insulator 550 has a stacked-layer structure of two layers as illustrated in FIG. 23B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In this case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above can be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

The insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In this case, at least part of the insulator 554 includes a region having the above-described thickness. The thickness of the insulator 554 is preferably smaller than that of the insulator 550. In this case, at least part of the insulator 554 includes a region having a thickness smaller than that of the insulator 550.

The conductor 560 functions as the first gate electrode of the transistor 500. The conductor 560 preferably includes the conductor 560a and the conductor 560b placed over the conductor 560a. For example, the conductor 560a is preferably placed to cover a bottom surface and a side surface of the conductor 560b. As illustrated in FIG. 22B and FIG. 22C, the upper portion of the conductor 560 is substantially level with the upper portion of the insulator 550. Note that although the conductor 560 has a two-layer structure of the conductor 560a and the conductor 560b in FIG. 22B and FIG. 22C, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, the conductor 560a is preferably formed using a conductive material having a function of inhibiting diffusion of oxygen (e.g., at least one of oxygen atoms, oxygen molecules, and the like).

In addition, when the conductor 560a has a function of inhibiting diffusion of oxygen, the conductivity of the conductor 560b can be inhibited from being lowered due to oxidation caused by oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 22C, in the channel width direction of the transistor 500, with reference to a bottom surface of the insulator 522, the level of the bottom surface of the conductor 560 in a region where the conductor 560 and the oxide 530b do not overlap with each other is preferably lower than the level of a bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. In particular, materials such as silicon oxide, silicon oxynitride, and porous silicon oxide are preferably used, in which case a region containing oxygen to be released by heating can be easily formed.

As for the insulator 580, the concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region interposed between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be manufactured.

The insulator 576 functions as a barrier insulating film that inhibits impurities such as water and hydrogen from diffusing into the insulator 580 from above. The insulator 576 is placed over the insulator 574. The insulator 576 is preferably formed using a nitride containing silicon such as silicon nitride or silicon nitride oxide. For example, silicon nitride deposited by a sputtering method is used for the insulator 576. When the insulator 576 is formed by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a functioning as a plug, and the other of the first terminal and the second terminal of the transistor 500 is electrically connected to a conductor 540b. Note that in this specification and the like, the conductor 540a and the conductor 540b are collectively referred to as the conductor 540.

A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings, a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 22B and in an insulator 582 and an insulator 586 illustrated in FIG. 22A in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 22B and in the insulator 582 and the insulator 586 illustrated in FIG. 22A in the region overlapping with the conductor 542b, and the conductor 540b is provided inside the opening portion. Note that the insulator 582 and the insulator 586 will be described later.

As illustrated in FIG. 22B, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as the insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

In the case where the insulator 541a and the insulator 541b each have a stacked-layer structure as illustrated in FIG. 22B, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. Such a structure can inhibit oxidation of the conductor 540 and reduce entry of hydrogen into the conductor 540.

Although the first insulator of the insulator 541 and the second conductor of the insulator 541 are stacked in the transistor 500, the present invention is not limited thereto. For example, the insulator 541 may be provided to have a single-layer structure or a stacked-layer structure of three or more layers. Although the first conductor of the conductor 540 and the second conductor of the conductor 540 are stacked in the transistor 500, the present invention is not limited thereto. For example, the conductor 540 may be provided to have a single-layer structure or a stacked-layer structure of three or more layers.

As illustrated in FIG. 22A, a conductor 610, a conductor 612, and the like functioning as wirings may be placed in contact with an upper portion of the conductor 540a and an upper portion of the conductor 540b. For the conductor 610 and the conductor 612, a conductive material containing tungsten, copper, or aluminum as its main component is preferably used. The conductors can each have a stacked-layer structure. Specifically, the conductors may each be a stack of titanium or a titanium nitride and any of the above conductive materials, for example. Note that the conductor may be formed to be embedded in an opening provided in an insulator.

The structure of the transistor included in the semiconductor device of one embodiment of the present invention is not limited to that of the transistor 500 illustrated in FIG. 22A to FIG. 22C. The structure of the transistor included in the semiconductor device of one embodiment of the present invention may be changed in accordance with circumstances.

Figure 24:
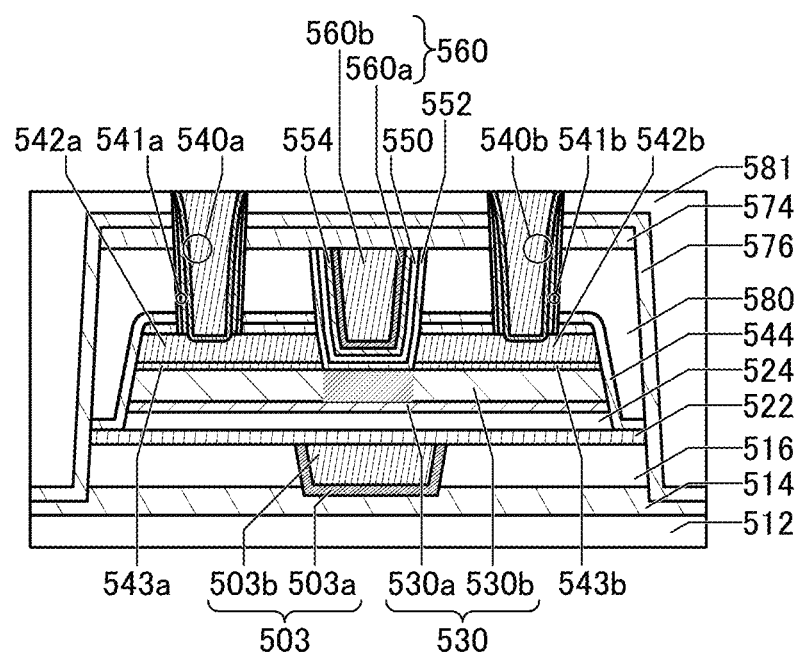
FIG. 24 is a diagram illustrating a structure example of a transistor.

For example, the transistor 500 illustrated in FIG. 22A to FIG. 22C may have a structure illustrated in FIG. 24. The transistor in FIG. 24 is different from the transistor 500 illustrated in FIG. 22A to FIG. 22C in including an oxide 543a and an oxide 543b. Note that in this specification and the like, the oxide 543a and the oxide 543b are collectively referred to as an oxide 543. The cross section in the channel width direction of the transistor in FIG. 24 can have a structure similar to the cross section of the transistor 500 illustrated in FIG. 22C.

The oxide 543a is provided between the oxide 530b and the conductor 542a, and the oxide 543b is provided between the oxide 530b and the conductor 542b. Here, the oxide 543a is preferably in contact with the top surface of the oxide 530b and a bottom surface of the conductor 542a. The oxide 543b is preferably in contact with the top surface of the oxide 530b and the bottom surface of the conductor 542b.

The oxide 543 preferably has a function of inhibiting passage of oxygen. The oxide 543 having a function of inhibiting passage of oxygen is preferably provided between the oxide 530b and the conductor 542 functioning as the source electrode or the drain electrode, in which case the electric resistance between the conductor 542 and the oxide 530b can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530b. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530b. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against oxygen and hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 512 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 22A will be described. Note that the capacitor 600 and the wiring and/or the plug are provided above the transistor 500 illustrated in FIG. 22A.

The capacitor 600 includes the conductor 610, a conductor 620, and an insulator 630, for example.

The conductor 610 is provided over one of the conductor 540a and the conductor 540b, a conductor 546, and the insulator 586. The conductor 610 has a function of one of a pair of electrodes of the capacitor 600.

The conductor 612 is provided over the other of the conductor 540a and the conductor 540b and the insulator 586. The conductor 612 has a function of a plug, a wiring, a terminal, or the like that electrically connects the transistor 500 to a circuit element, a wiring, or the like placed above the transistor 500.

Note that the conductor 612 and the conductor 610 may be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 22A, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric interposed between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as a leakage current from a transistor, a capacitor, and the like might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

The conductor 620 is provided to overlap with the conductor 610 with the insulator 630 therebetween. The conductor 610 has a function of one of a pair of electrodes of the capacitor 600.

Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. For example, the conductor 620 can be formed using a material that can be used for the conductor 610. The conductor 620 may have a stacked-layer structure of two or more layers instead of a single-layer structure.

An insulator 640 is provided over the conductor 620 and the insulator 630. As the insulator 640, a film having a barrier property that prevents diffusion of hydrogen or impurities into the region where the transistor 500 is provided is preferably used. Thus, a material similar to that for the insulator 514 can be used.

An insulator 650 is provided over the insulator 640. The insulator 650 can be provided using a material similar to that for the insulator 512. The insulator 650 may function as a planarization film that covers an uneven shape thereunder. Thus, the insulator 650 can be formed using any of the materials that can be used for the insulator 514, for example.

Although the capacitor 600 illustrated in FIG. 22A is a planar capacitor, the shape of the capacitor is not limited thereto. For example, the capacitor 600 may be a cylindrical capacitor instead of a planar capacitor.

A wiring layer may be provided above the capacitor 600. For example, in FIG. 22A, an insulator 411, an insulator 412, an insulator 413, and an insulator 414 are provided in this order above the insulator 650. In addition, a conductor 416 functioning as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 functions as a plug or a wiring that is electrically connected to the conductor 416 included in the above-described wiring layer.

For example, like the insulator 514 or the like, the insulator 411 and the insulator 414 are each preferably formed using an insulator having a barrier property against impurities such as water and hydrogen. Thus, the insulator 411 and the insulator 414 can be formed using any of the materials that can be used for the insulator 514 or the like, for example.

Like the insulator 512, the insulator 412 and the insulator 413 are each preferably formed using, for example, an insulator having a relatively low dielectric constant to reduce the parasitic capacitance generated between wirings.

<Structure Example of Transistor>

Next, a structure will be described in which a dielectric that can have ferroelectricity is provided in and around the transistor 500 including a metal oxide in its channel formation region.

Figure 25A:
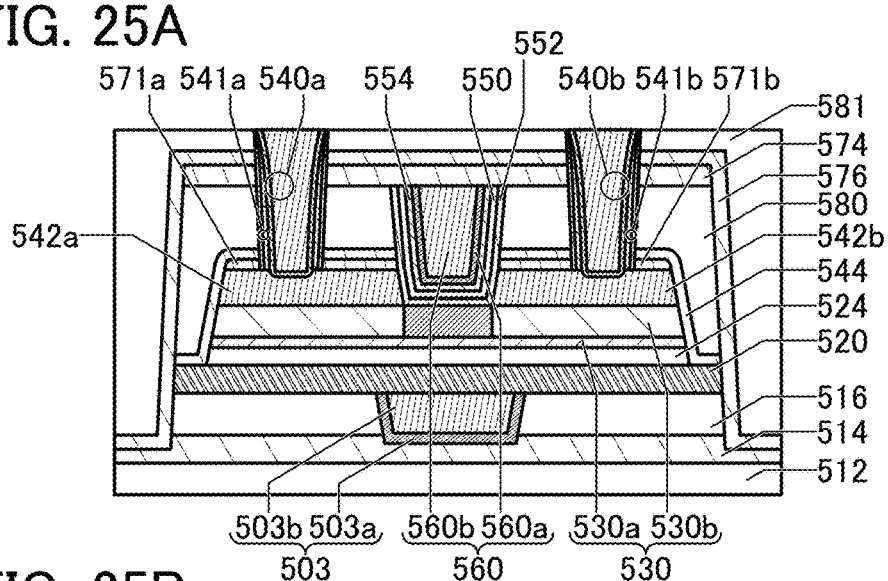
FIG. 25A to FIG. 25C are diagrams illustrating structure examples of a transistor.

FIG. 25A illustrates an example of a transistor structure in which a dielectric that can have ferroelectricity is provided in the transistor 500 in FIG. 22A, FIG. 22B, or the like.

The transistor illustrated in FIG. 25A has a structure in which the insulator 522 functioning as the gate insulator for the conductor 503 is replaced with an insulator 520. As the insulator 520, a dielectric that can have ferroelectricity can be used, for example.

Examples of the material that can have ferroelectricity include hafnium oxide, zirconium oxide, $HfZrO_X$ (X is a real number greater than 0), a material obtained by adding the element J1 (the element J1 here is zirconium (Zr), silicon (Si), aluminum (Al), gadolinium (Gd), yttrium (Y), lanthanum (La), strontium (Sr), or the like) to hafnium oxide, and a material obtained by adding the element J2 (the element J2 here is hafnium (Hf), silicon (Si), aluminum (Al), gadolinium (Gd), yttrium (Y), lanthanum (La), strontium (Sr), or the like) to zirconium oxide. As the material that can have ferroelectricity, piezoelectric ceramic having a perovskite structure, such as $PbTiO_X$, barium strontium titanate (BST), strontium titanate, lead zirconate titanate (PZT), strontium bismuth tantalate (SBT), bismuth ferrite (BFO), or barium titanate may be used. The material that can have ferroelectricity can be, for example, a mixture or a compound selected from the above-listed materials. Alternatively, the material that can have ferroelectricity can be a stacked-layer structure of a plurality of materials selected from the above-listed materials. Note that each of hafnium oxide, zirconium oxide, HfZrO$_X$, the material obtained by adding the element J1 to hafnium oxide, and the like possibly changes its crystal structure (characteristics) depending not only on the deposition condition but also on a variety of processes or the like, and thus is referred to as a material that can have ferroelectricity in this specification and the like.

As the material that can have ferroelectricity, hafnium oxide or a material containing hafnium oxide and zirconium oxide is particularly preferable because it can have ferroelectricity even when being processed into a thin film of several nanometers. Here, the thickness of the insulator 520 can be less than or equal to 100 nm, preferably less than or equal to 50 nm, further preferably less than or equal to 20 nm, still further preferably less than or equal to 10 nm. With the use of a ferroelectric layer having a film form, a ferroelectric capacitor can be combined with the miniaturized transistor 500 to form a semiconductor device.

Figure 25B:
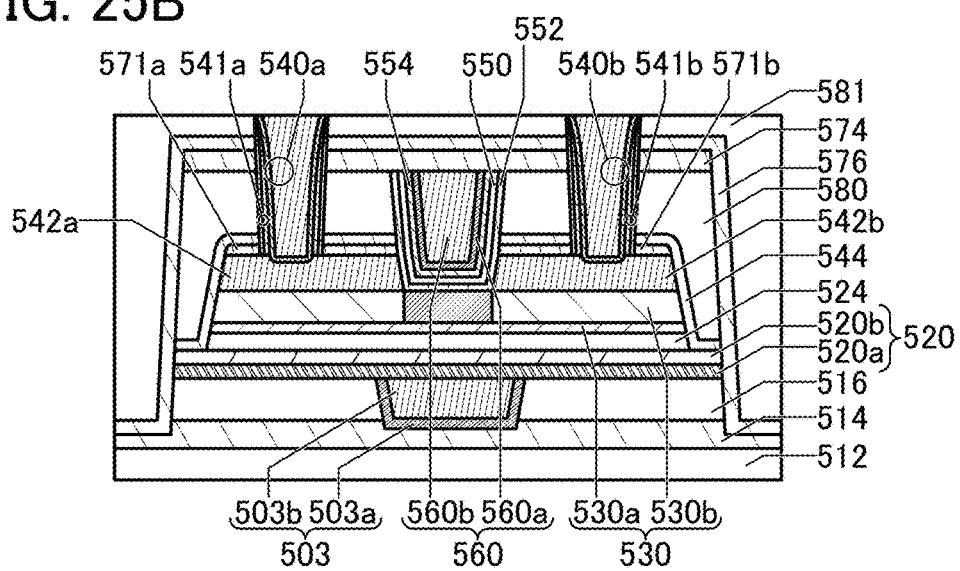

Although the insulator 520 is illustrated as a single layer in FIG. 25A, the insulator 520 may be an insulating film including two or more layers including a dielectric that can have ferroelectricity. FIG. 25B illustrates a specific example of the transistor including such an insulator 520. In FIG. 25B, the insulator 520 includes an insulator 520a and an insulator 520b. The insulator 520a is provided over a top surface of each of the insulator 516 and the conductor 503, and the insulator 520b is provided over a top surface of the insulator 520a.

For the insulator 520a, a dielectric that can have ferroelectricity can be used, for example. For the insulator 520b, silicon oxide can be used, for example. Alternatively, silicon oxide may be used for the insulator 520a and a dielectric that can have ferroelectricity may be used for the insulator 520b.

When the insulator 520 includes two layers as illustrated in FIG. 25B, one of the layers is provided with a dielectric that can have ferroelectricity and the other is provided with silicon oxide, a leakage current flowing between the conductor 503 functioning as a gate electrode and the oxide 530 can be inhibited.

Figure 25C:
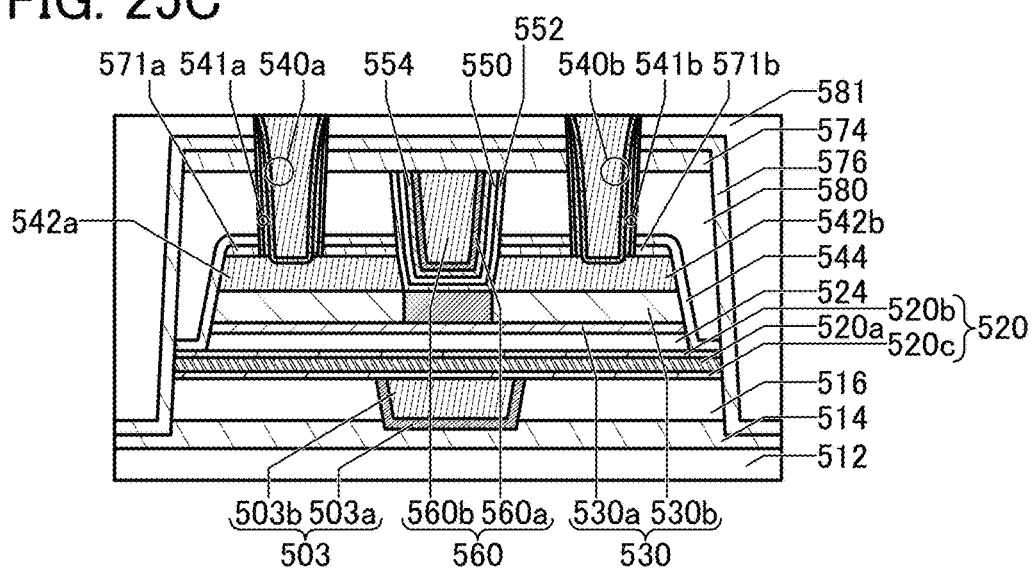

FIG. 25C illustrates a structure example of a transistor in which the insulator 520 includes three layers. In FIG. 25C, the insulator 520 includes the insulator 520a, the insulator 520b, and an insulator 520c, for example. The insulator 520c is provided over a top surface of each of the insulator 516 and the conductor 503, the insulator 520a is provided over a top surface of the insulator 520c, and the insulator 520b is provided over a top surface of the insulator 520a.

For the insulator 520a, a dielectric that can have ferroelectricity can be used, for example. For the insulator 520b and the insulator 520c, silicon oxide can be used, for example.

The transistor structures illustrated in FIG. 25A to FIG. 25C can be employed for the transistor 22 and the transistor 32 that are described in the above embodiment and illustrated in FIG. 1B, for example.

When a semiconductor device using a transistor including an oxide semiconductor has the structure described in this embodiment, a change in electrical characteristics of the transistor can be inhibited and the reliability can be improved.

In a semiconductor device using a transistor including an oxide semiconductor, employing a stacked-layer structure and achieving miniaturization and higher integration, for example, can reduce the area of circuits forming the semiconductor device. In particular, the use of a ferroelectric capacitor as a capacitor included in the semiconductor device can increase the capacitance value of the capacitor, and thus enables miniaturization of the capacitor.

Accordingly, the area of a circuit including the capacitor can be reduced. Furthermore, as described in this embodiment, stacking a transistor and a capacitor can increase the circuit scale while suppressing an increase in circuit area of the semiconductor device.

Note that this embodiment can be combined with any of the other embodiments in this specification as appropriate.

Embodiment 5

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor is described with reference to FIG. 26A. FIG. 26A is a diagram showing classification of crystal structures of an oxide semiconductor, typically IGZO (a metal oxide containing In, Ga, and Zn).

As shown in FIG. 26A, an oxide semiconductor is roughly classified into "Amorphous", "Crystalline", and "Crystal". "Amorphous" includes completely amorphous. The term "Crystalline" includes CAAC (c-axis-aligned crystalline), nc (nanocrystalline), and CAC (Cloud-Aligned Composite). Note that in the classification of "Crystalline," single crystal, poly crystal, and completely amorphous are excluded. The term "Crystal" includes single crystal and poly crystal.

Note that the structures in the thick frame in FIG. 26A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 26B shows an XRD spectrum, which is obtained using GIXD (Grazing-Incidence XRD) measurement, of a CAAC-IGZO film classified into "Crystalline". In FIG. 26B, the horizontal axis represents 2θ [deg.], and the vertical axis represents intensity [a.u.]. Note that a GIXD method is also referred to as a thin film method or a Seemann-Bohlin method. The XRD spectrum that is shown in FIG. 26B and obtained by GIXD measurement is hereinafter simply referred to as an XRD spectrum. The CAAC-IGZO film in FIG. 26B has a composition in the vicinity of In:Ga:Zn=4:2:3 [atomic ratio]. The CAAC-IGZO film in FIG. 26B has a thickness of 500 nm.

As shown in FIG. 26B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 26B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 26C shows a diffraction pattern of a CAAC-IGZO film. FIG. 26C shows a diffraction pattern obtained with the NBED method in which an electron beam is incident in the direction parallel to the substrate. The CAAC-IGZO film in FIG. 26C has a composition in the vicinity of In:Ga:Zn=4:2:3 [atomic ratio]. In the nanobeam electron diffraction method, electron diffraction is performed with a probe diameter of 1 nm.

As shown in FIG. 26C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 26A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities, defects, and the like (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes avoid or a low-density region. That is, the a-like OS has lower crystallinity than the nc-OS and the CAAC-OS. Moreover, the a-like OS has higher hydrogen concentration than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] than the second region and has lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 6

In this embodiment, the structure of an integrated circuit including components of the semiconductor device and the arithmetic device MAC1 described in the above embodiment will be described with reference to FIG. 27.

Figure 27:
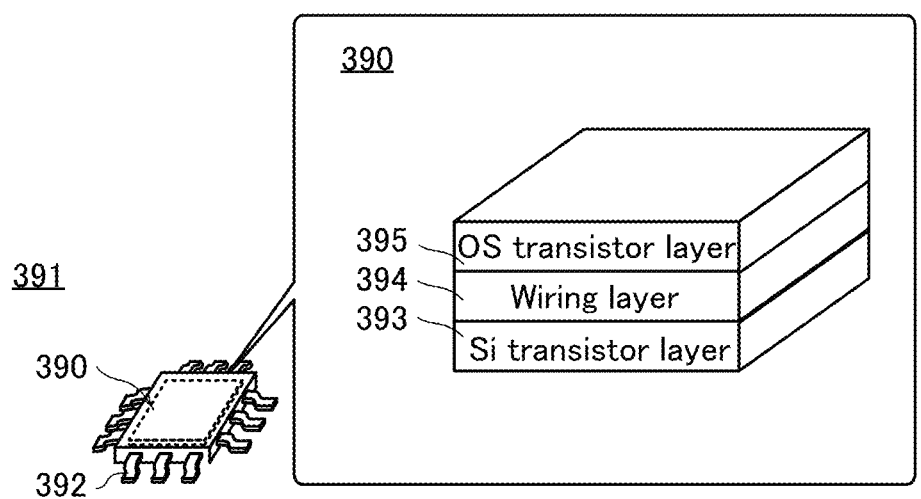
FIG. 27 is a diagram illustrating a structure example of an integrated circuit.

FIG. 27 illustrates an example of a semiconductor chip 391 including an integrated circuit 390. The semiconductor chip 391 illustrated in FIG. 27 includes leads 392 and the integrated circuit 390. As for the integrated circuit 390, various circuits, including the semiconductor device and the arithmetic device MAC1 described in the above embodiments, are provided in one die. The integrated circuit 390 has a stacked-layer structure, which is roughly divided into a layer including Si transistors (a Si transistor layer 393), a wiring layer 394, and a layer including OS transistors (an OS transistor layer 395). Since the OS transistor layer 395 can be provided to be stacked over the Si transistor layer 393, a reduction in the size of the semiconductor chip 391 is facilitated.

Although a QFP (Quad Flat Package) is used as the package of the semiconductor chip 391 in FIG. 27, the form of the package is not limited thereto. For other structure examples, a DIP (Dual In-line Package) and a PGA (Pin Grid Array), which are of an insertion mount type; an SOP (Small Outline Package), an SSOP (Shrink Small Outline Package), a TSOP (Thin-Small Outline Package), an LCC (Leaded Chip Carrier), a QFN (Quad Flat Non-leaded package), a BGA (Ball Grid Array), and an FBGA (Fine pitch Ball Grid Array), which are of a surface mount type; a DTP (Dual Tape carrier Package) and a QTP (Quad Tape-carrier Package), which are of a contact mount type; and the like can be used as appropriate.

The semiconductor device and the arithmetic device MAC1 including Si transistors can be entirely formed in the Si transistor layer 393, the wiring layer 394, and the OS transistor layer 395. In other words, elements included in the semiconductor device can be formed through the same manufacturing process. Thus, the number of steps in the manufacturing process of the semiconductor chip illustrated in FIG. 27 does not need to be increased even when the number of elements is increased, and accordingly the semiconductor device can be incorporated at low cost.

According to one embodiment of the present invention described above, a novel semiconductor device and electronic device can be provided. According to another embodiment of the present invention, a semiconductor device and an electronic device having low power consumption can be provided. According to another embodiment of the present invention, a semiconductor device and an electronic device capable of suppressing heat generation can be provided.

Note that this embodiment can be combined with any of the other embodiments in this specification as appropriate.

Embodiment 7

In this embodiment, an electronic device, a moving object, and an arithmetic system in which the integrated circuit 390 (or the semiconductor chip 391 including the integrated circuit 390) described in the above embodiment can be used will be described with reference to FIG. 28 to FIG. 31.

FIG. 28A illustrates an external view of an automobile as an example of a moving object. FIG. 28B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are collectively analyzed with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving object, the moving object is not limited to an automobile. Examples of the moving object also include a train, a monorail train, a ship, and a flying object (a helicopter, an unmanned aircraft (a drone), an airplane, and a rocket), and these moving objects can include a system utilizing artificial intelligence when equipped with a computer of one embodiment of the present invention.

Figure 29A:
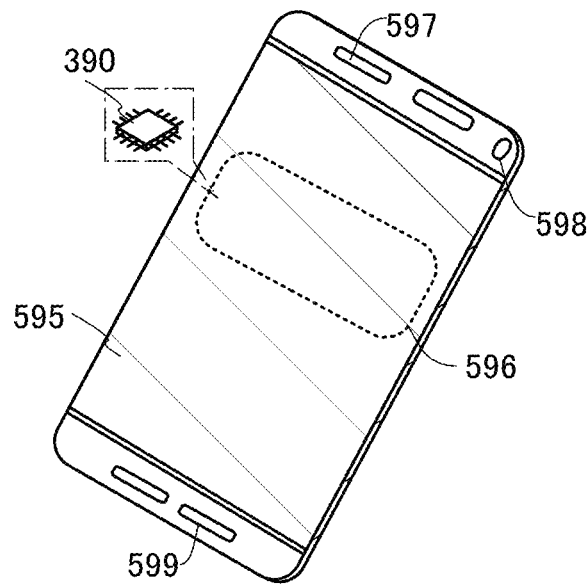
FIG. 29A and FIG. 29B are diagrams illustrating an application example of an integrated circuit.
Figure 29B:
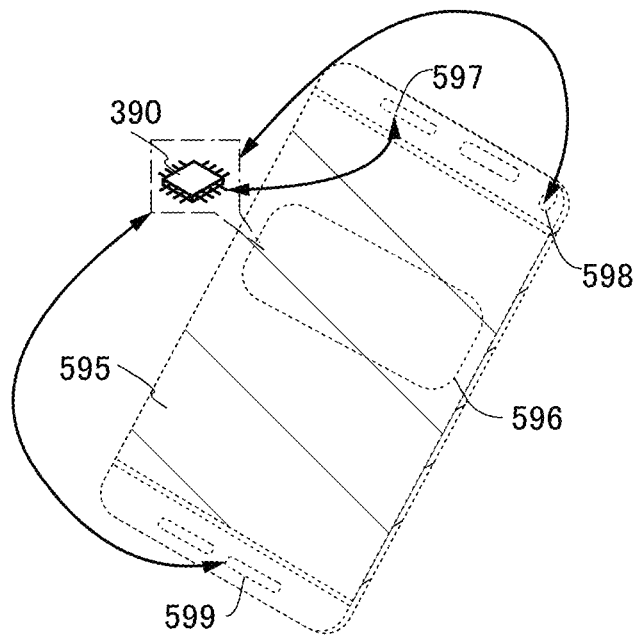

FIG. 29A is an external view illustrating an example of a portable electronic device. FIG. 29B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 30A:
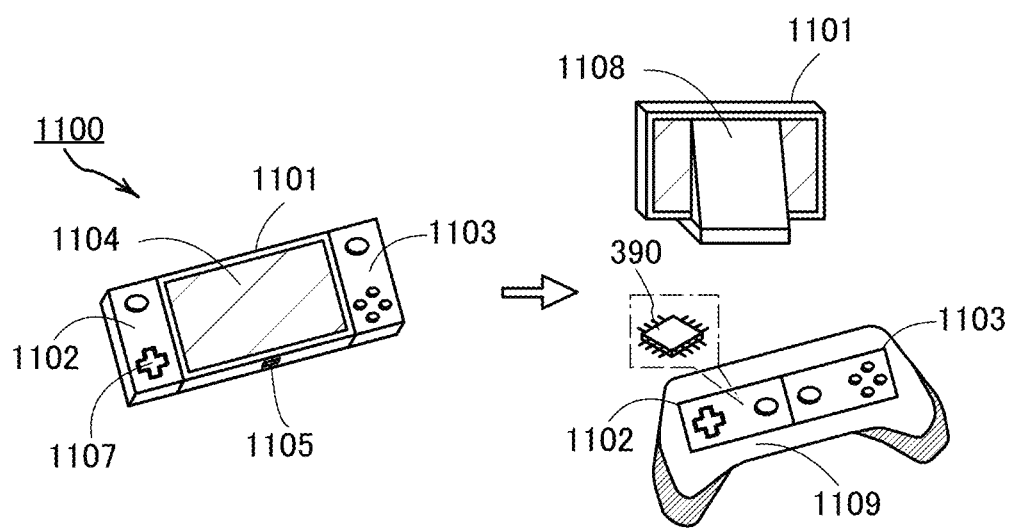
FIG. 30A, FIG. 30B, and FIG. 30C are diagrams illustrating application examples of an integrated circuit.

A portable game machine 1100 illustrated in FIG. 30A includes a housing 1101, a housing 1102, a housing 1103, a display portion 1104, a connection portion 1105, operation keys 1107, and the like. The housing 1101, the housing 1102, and the housing 1103 are detachable. When the connection portion 1105 provided in the housing 1101 is attached to a housing 1108, a video to be output to the display portion 1104 can be output to another video device. When the housing 1102 and the housing 1103 are attached to a housing 1109, the housing 1102 and the housing 1103 are unified and function as an operation portion. The integrated circuit 390 described in the above embodiment can be incorporated into a chip provided on a board in the housing 1102 and the housing 1103, for example.

Figure 30B:
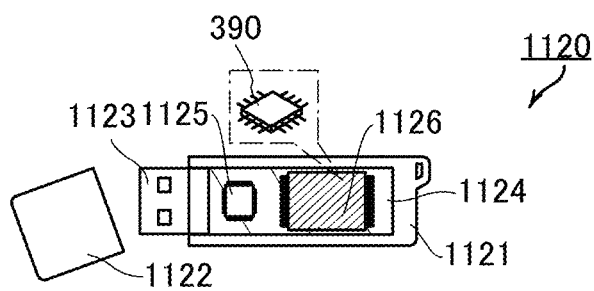

FIG. 30B illustrates a USB connection stick type electronic device 1120. The electronic device 1120 includes a housing 1121, a cap 1122, a USB connector 1123, and a board 1124. The board 1124 is held in the housing 1121. For example, a memory chip 1125 and a controller chip 1126 are attached to the board 1124. The integrated circuit 390 described in the above embodiment can be incorporated into the controller chip 1126 or the like of the board 1124.

Figure 30C:
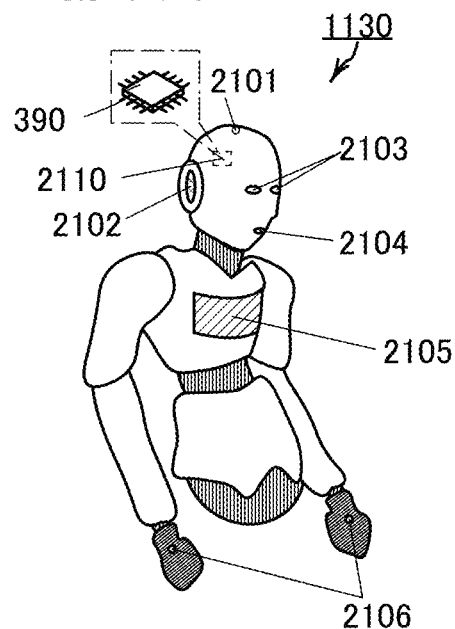

FIG. 30C illustrates a humanoid robot 1130. The robot 1130 includes sensors 2101 to 2106 and a control circuit 2110. For example, the integrated circuit 390 described in the above embodiment can be incorporated into the control circuit 2110.

Figure 31:
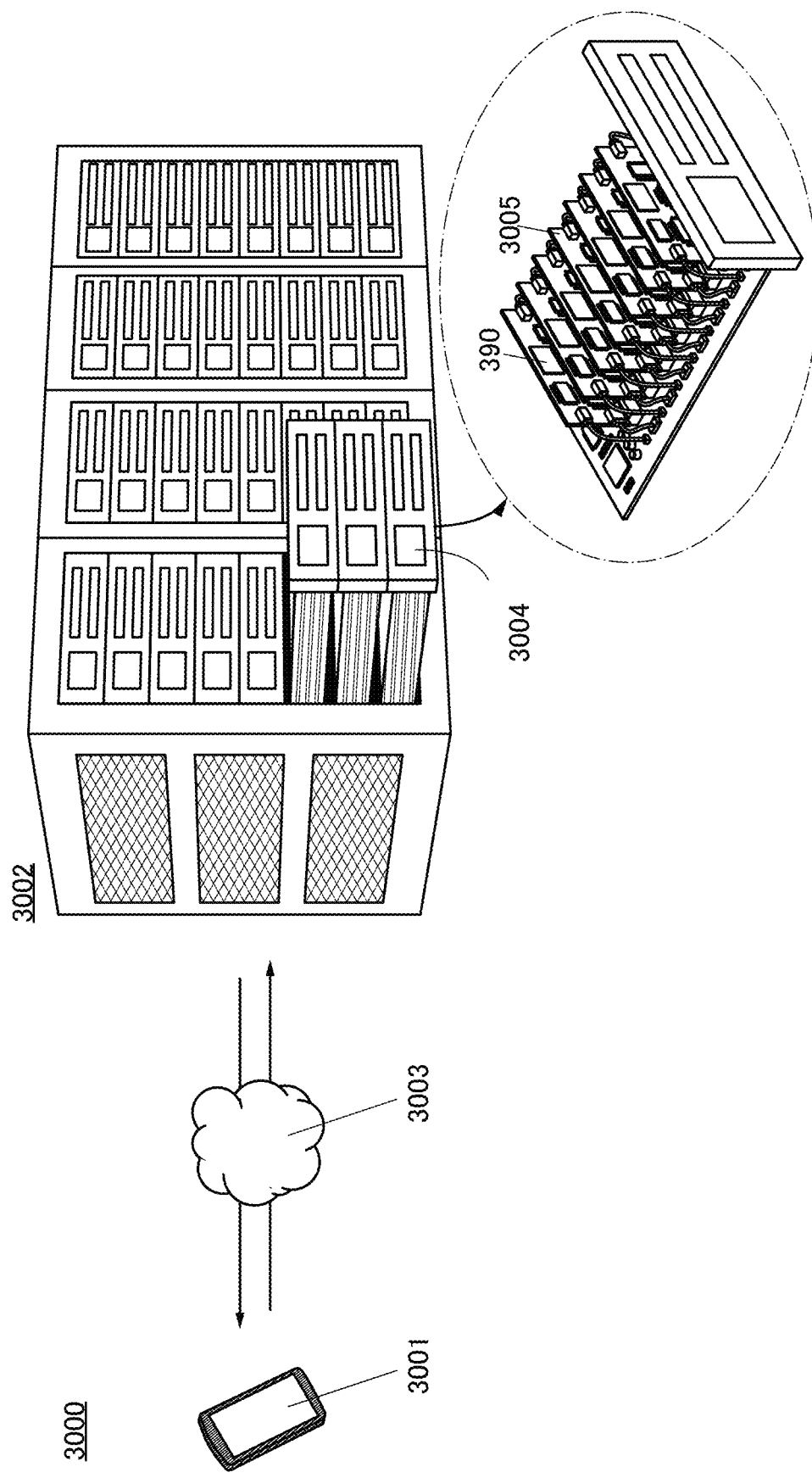
FIG. 31 is a diagram illustrating an application example of an integrated circuit.

The integrated circuit 390 described in the above embodiment can be used for a server that communicates with the electronic devices instead of being incorporated into the electronic devices. In this case, the arithmetic system is configured with the electronic devices and a server. FIG. 31 illustrates a structure example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of boards 3005, and the integrated circuit 390 described in the above embodiment can be mounted on each of the boards 3005. Thus, a neural network is configured in the server 3002. The server 3002 can perform arithmetic processing of the neural network using data input from the electronic device 3001 through the Internet connection 3003. The result of the arithmetic processing executed by the server 3002 can be transmitted as needed to the electronic device 3001 through the Internet connection 3003. Accordingly, a burden of the arithmetic processing in the electronic device 3001 can be reduced.

Note that this embodiment can be combined with any of the other embodiments in this specification as appropriate.

(Notes on Description of this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof)

described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to the shapes, values, or the like shown in the drawings. For example, variation in signal, voltage, or current due to noise or variation in signal, voltage, or current due to a difference in timing, or the like can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a node can be referred to as a terminal, a wiring, an electrode, a conductive layer, a conductor, an impurity region, and the like depending on the circuit structure, the device structure, or the like. Furthermore, a terminal, a wiring, or the like can be referred to as a node.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, the term "high-level potential" or "low-level potential" does not mean a particular potential. For example, in the case where two wirings are both described as "functioning as a wiring supplying a high-level potential", the levels of the high-level potentials supplied from the wirings are not necessarily equal to each other. Similarly, in the case where two wirings are both described as "functioning as a wiring supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a winng or the like refers to the direction in which a carrier with a positive electric charge moves, and is expressed as a positive current. In other words, the direction in which a carrier with a negative electric charge moves is opposite to the direction of a current, and is expressed as a negative current. Thus, in the case where the polarity of a current (or the direction of current) is not specified in this specification and the like, the description "current flows from element A to element B" can be rephrased as "current flows from element B to element A", for example. The description "current is input to element A" can be rephrased as "current is output from element A", for example.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether a current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where a current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where a current flows in a semiconductor when a transistor is in an on state) and a gate electrode overlap with each other or a region where a channel is formed.

Note that in this specification and the like, the terms such as "film" and "layer" can be interchanged with each other depending on the case or circumstances. For example, the term "conductive layer" can be changed into the term "conductive film" in some cases. As another example, the term "insulating film" can be changed into the term "insulating layer" in some cases.

REFERENCE NUMERALS

10A1: semiconductor device, 10A2: semiconductor device, 10A3: semiconductor device, 10B1: semiconductor device, 10B2: semiconductor device, 10B3: semiconductor device, 10C1: semiconductor device, 10C2: semiconductor device, 10C3: semiconductor device, 10D1: semiconductor device, 10D2: semiconductor device, 10D3: semiconductor device, 20: reference cell portion, 21: reference cell, 22: transistor, 23: transistor, 24: transistor, 25: capacitor, 30: arithmetic cell portion, 31: arithmetic cell, 32: transistor, 33: transistor, 34: transistor, 35: capacitor, 100: neural network, 390: integrated circuit, 391: semiconductor chip, 392: lead, 393: Si transistor layer, 394: wiring layer, 395: OS transistor layer, 411: insulator, 412: insulator, 413: insulator, 414: insulator, 416: conductor, 500: transistor, 503: conductor, 503a: conductor, 503b: conductor, 512: insulator, 514: insulator, 516: insulator, 520: insulator, 520a: insulator, 520b: insulator, 520c: insulator, 522: insulator, 524: insulator, 530: oxide, 530a: oxide, 530b: oxide, 530ba: region, 530bb: region, 530bc: region, 540: conductor, 540a: conductor, 540b: conductor, 541: insulator, 541a: insulator, 541b: insulator, 542: conductor, 542a: conductor, 542b: conductor, 543: oxide, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571: insulator, 571a: insulator, 571b: insulator, 574: insulator, 576: insulator, 580: insulator, 581: insulator, 582: insulator, 586: insulator, 590: automobile, 591: camera, 592: imaging direction, 593: bus, 594: host controller, 595: portable electronic device, 596: printed wiring board, 597: speaker, 598: camera, 599: microphone, 600: capacitor, 610: conductor, 612: conductor, 620: conductor, 630: insulator, 640: insulator, 650: insulator, 660: conductor, 1100: portable game machine, 1101: housing, 1102: housing, 1103: housing, 1104: display portion, 1105: connection portion, 1107: operation key, 1108: housing, 1109: housing, 1120: electronic device, 1121: housing, 1122: cap, 1123: USB connector, 1124: board, 1125: memory chip, 1126: controller chip, 1130: robot, 2101: sensor, 2106: sensor, 2110: control circuit, 3000: system, 3001: electronic device, 3002: server, 3003: Internet connection, 3004: rack, 3005: board

The invention claimed is:

1. A semiconductor device comprising:
a first transistor;
a second transistor; and
a capacitor,
wherein the first transistor comprises a first gate and a first back gate,
wherein the second transistor comprises a second gate and a second back gate,
wherein a gate insulating layer for the first back gate has ferroelectricity,
wherein the first transistor is configured to retain a first potential corresponding to first data supplied to the second back gate through the first transistor when the first transistor is in an off state,
wherein the capacitor is configured to change the first potential retained in the second back gate to a second potential in accordance with a potential change caused by supply of second data to a first electrode of the capacitor,
wherein the second transistor is configured to make an output current corresponding to a potential of the second back gate flow between a source and a drain of the second transistor,
wherein the output current is a current flowing when the second transistor operates in a subthreshold region, and
wherein a constant potential is supplied to the second gate.

2. A semiconductor device comprising:
a first transistor;
a second transistor; and
a capacitor,
wherein the first transistor comprises a first gate and a first back gate,
wherein the second transistor comprises a second gate and a second back gate,
wherein a gate insulating layer for the first back gate has ferroelectricity,
wherein a first electrode of the capacitor is electrically connected to one of the second gate and the second back gate,
wherein a constant potential is supplied to a second electrode of the capacitor,
wherein the first transistor is configured to retain a first potential corresponding to first data supplied to the one of the second gate and the second back gate through the first transistor when the first transistor is in an off state,
wherein the second transistor is configured to make an output current corresponding to a potential of the one of the second gate and the second back gate flow between a source and a drain of the second transistor, and
wherein the output current is a current flowing when the second transistor operates in a subthreshold region.

3. The semiconductor device according to claim 1, wherein the gate insulating layer for the first back gate comprises an oxide comprising at least one of hafnium and zirconium.

4. The semiconductor device according to claim 1, further comprising a circuit,
wherein the circuit is electrically connected to the first gate, and
wherein the circuit is configured to generate a signal controlling on and off of the first transistor.

5. The semiconductor device according to claim 2, wherein the gate insulating layer for the first back gate comprises an oxide comprising at least one of hafnium and zirconium.

6. A semiconductor device comprising:
a first transistor;
a second transistor;
a third transistor;
a fourth transistor;
a first capacitor;
a second capacitor; and
a ferroelectric capacitor,
wherein the first to third transistors each comprise a gate and a back gate,
wherein one of a source and a drain of the first transistor is electrically connected to one of a source and a drain of the second transistor and a first electrode of the first capacitor, wherein the other of the source and the drain of the first transistor is electrically connected to the back gate of the second transistor and a second electrode of the first capacitor, wherein the back gate of the first transistor is electrically connected to one of a source and a drain of the third transistor, the back gate of the third transistor, and one of a source and a drain of the fourth transistor, wherein the gate of the third transistor is electrically connected to a first electrode of the ferroelectric capacitor, and wherein the other of the source and the drain of the fourth transistor is electrically connected to a second electrode of the ferroelectric capacitor and a first electrode of the second capacitor.

7. The semiconductor device according to claim 6, wherein a constant potential is supplied to the gate of the second transistor.

8. A semiconductor device comprising:
a first transistor;
a second transistor;
a third transistor;
a fourth transistor;
a first capacitor;
a second capacitor; and
a ferroelectric capacitor, wherein the first to third transistors each comprise a gate and a back gate, wherein one of a source and a drain of the first transistor is electrically connected to one of a source and a drain of the second transistor, wherein the other of the source and the drain of the first transistor is electrically connected to a first electrode of the first capacitor and one of the gate and the back gate of the second transistor, wherein the back gate of the first transistor is electrically connected to one of a source and a drain of the third transistor, the back gate of the third transistor, and one of a source and a drain of the fourth transistor, wherein the gate of the third transistor is electrically connected to a first electrode of the ferroelectric capacitor, and wherein the other of the source and the drain of the fourth transistor is electrically connected to a second electrode of the ferroelectric capacitor and a first electrode of the second capacitor.

9. The semiconductor device according to claim 6, wherein the ferroelectric capacitor comprises a dielectric layer, and wherein the dielectric layer comprises an oxide comprising at least one of hafnium and zirconium.

10. The semiconductor device according to claim 8, wherein a constant potential is supplied to a second electrode of the first capacitor.

11. The semiconductor device according to claim 6, further comprising a circuit, wherein the circuit is electrically connected to the gate of the first transistor, and wherein the circuit is configured to generate a signal controlling on and off of the first transistor.

12. The semiconductor device according to claim 8, wherein the ferroelectric capacitor comprises a dielectric layer, and wherein the dielectric layer comprises an oxide comprising at least one of hafnium and zirconium.

13. The semiconductor device according to claim 1, wherein the first transistor comprises a semiconductor layer comprising a metal oxide in a channel formation region.

14. The semiconductor device according to claim 13, wherein the metal oxide comprises In, Ga, and Zn.

15. The semiconductor device according to claim 1, wherein the second transistor comprises a semiconductor layer comprising silicon in a channel formation region.

16. An electronic device comprising the semiconductor device according to claim 1 and a housing, wherein the semiconductor device is configured to perform arithmetic operation of a neural network.

17. The semiconductor device according to claim 2, wherein the first transistor comprises a semiconductor layer comprising a metal oxide in a channel formation region.

18. The semiconductor device according to claim 17, wherein the metal oxide comprises In, Ga, and Zn.

19. The semiconductor device according to claim 6, wherein the first transistor comprises a semiconductor layer comprising a metal oxide in a channel formation region.

20. The semiconductor device according to claim 19, wherein the metal oxide comprises In, Ga, and Zn.

21. The semiconductor device according to claim 8, wherein the first transistor comprises a semiconductor layer comprising a metal oxide in a channel formation region.

22. The semiconductor device according to claim 21, wherein the metal oxide comprises In, Ga, and Zn.

* * * * *